(12) United States Patent
Kim et al.

(10) Patent No.: US 12,302,506 B2
(45) Date of Patent: May 13, 2025

(54) LENS DRIVING DEVICE, CAMERA DEVICE, AND OPTICAL APPARATUS INCLUDING SAME

(71) Applicant: LG INNOTEK CO., LTD., Seoul (KR)

(72) Inventors: Do Yun Kim, Seoul (KR); Seong Min Lee, Seoul (KR); Eun Mi Kim, Seoul (KR); Sang Ok Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/412,020

(22) Filed: Jan. 12, 2024

(65) Prior Publication Data

US 2024/0155775 A1 May 9, 2024

Related U.S. Application Data

(63) Continuation of application No. 17/058,185, filed as application No. PCT/KR2019/006450 on May 29, 2019, now Pat. No. 11,903,142.

(30) Foreign Application Priority Data

| May 29, 2018 | (KR) | 10-2018-0060900 |
| Jul. 24, 2018 | (KR) | 10-2018-0085824 |

(51) Int. Cl.
*H05K 3/32* (2006.01)
*G02B 7/02* (2021.01)
(Continued)

(52) U.S. Cl.
CPC ............... *H05K 3/321* (2013.01); *G02B 7/02* (2013.01); *G03B 17/12* (2013.01); *H04N 23/54* (2023.01); *H04N 23/60* (2023.01); *H05K 1/11* (2013.01)

(58) Field of Classification Search
CPC .......... H05K 3/321; H05K 1/11; H05K 1/117; H05K 1/184; H05K 2201/09063;
(Continued)

(56) References Cited

U.S. PATENT DOCUMENTS 7,456,901 B2    11/2008   Jeong et al.
9,360,653 B2 *   6/2016   Lee ........................ G03B 30/00
(Continued)

FOREIGN PATENT DOCUMENTS

JP    2001-245186 A    9/2001
JP    2013-24938 A     2/2013
(Continued)

*Primary Examiner* — Bao Q Truong
(74) *Attorney, Agent, or Firm* — Birch, Stewart, Kolasch & Birch, LLP

(57) ABSTRACT

A lend moving apparatus includes a circuit board including a mounting groove, an image sensor arranged within the mounting groove of the circuit board, and a first epoxy arranged within the mounting groove. The mounting groove includes a first side surface and a second side surface that face each other, and a third side surface and a fourth side surface that face each other. The circuit board includes at least one application groove provided on the first side surface and/or the second side surface of the mounting groove. The at least one application groove includes an opening opened toward the upper surface of the circuit board. At least a portion of the first epoxy is arranged in the at least one application groove.

20 Claims, 27 Drawing Sheets

(51) Int. Cl.
*G03B 17/12* (2021.01)
*H04N 23/54* (2023.01)
*H04N 23/60* (2023.01)
*H05K 1/11* (2006.01)

(58) Field of Classification Search
CPC ......... H05K 2201/10121; H04N 23/54; H04N 23/60; H04N 23/57; G02B 7/02; G03B 17/12; G03B 30/00; G03B 2205/0069
See application file for complete search history.

(56) References Cited

U.S. PATENT DOCUMENTS

| | | | |
|---|---|---|---|
| 9,933,628 B2* | 4/2018 | Ariji | ............ G02B 7/023 |
| 2005/0116142 A1 | 6/2005 | Mok et al. | |
| 2005/0270403 A1 | 12/2005 | Adachi et al. | |
| 2006/0181633 A1 | 8/2006 | Seo | |
| 2008/0297645 A1 | 12/2008 | Lo et al. | |
| 2009/0033789 A1 | 2/2009 | Lin | |
| 2009/0128681 A1 | 5/2009 | Kim | |
| 2010/0157143 A1 | 6/2010 | Kim et al. | |
| 2012/0314307 A1* | 12/2012 | Ikushima | ............ G02B 7/08 |
| | | | 359/814 |
| 2013/0016427 A1* | 1/2013 | Sugawara | ............ G03B 3/10 |
| | | | 359/557 |
| 2014/0177056 A1 | 6/2014 | Hayashi et al. | |
| 2014/0327965 A1 | 11/2014 | Chen et al. | |
| 2015/0323758 A1 | 11/2015 | Lee et al. | |
| 2017/0294469 A1 | 10/2017 | Lee et al. | |

FOREIGN PATENT DOCUMENTS

| | | |
|---|---|---|
| JP | 2013-120248 A | 6/2013 |
| KR | 10-2005-0053201 A | 6/2005 |
| KR | 10-0950918 B1 | 4/2010 |
| KR | 10-2011-0006437 A | 1/2011 |
| KR | 10-2012-0065656 A | 6/2012 |
| KR | 10-2012-0065765 A | 6/2012 |
| KR | 10-2012-0115757 A | 10/2012 |
| KR | 10-1449006 B1 | 10/2014 |
| KR | 10-2016-0057722 A | 5/2016 |
| KR | 10-2017-0116461 A | 10/2017 |
| KR | 10-2018-0010472 A | 1/2018 |

\* cited by examiner

LENS DRIVING DEVICE, CAMERA DEVICE, AND OPTICAL APPARATUS INCLUDING SAME

CROSS REFERENCE TO RELATED APPLICATIONS

This application is a Continuation of U.S. application Ser. No. 17/058,185, filed on Nov. 24, 2020, which is the National Phase of PCT International Application No. PCT/KR2019/006450, filed on May 29, 2019, which claims priority under 35 U.S.C. 119(a) to Patent Application Nos. 10-2018-0060900, filed in the Republic of Korea on May 29, 2018, and 10-2018-0085824, filed in the Republic of Korea on Jul. 24, 2018, all of which are hereby expressly incorporated by reference into the present application.

TECHNICAL FIELD

Embodiments relate to a lens moving apparatus, a camera device and an optical device including the same.

BACKGROUND ART

Technology of a voice coil motor (VCM), which is used in existing general camera modules, is difficult to apply to a miniature low-power camera module, and studies related thereto have been actively conducted.

In the case of a camera module configured to be mounted in a small electronic product, such as a smart phone, the camera module may frequently receive shocks during use, and may undergo fine shaking due to, for example, the shaking of a user's hand. In consideration thereof, technology enabling a device for preventing handshake to be additionally installed to a camera module has been developed.

DISCLOSURE

Technical Problem

Embodiments provide a camera device and an optical device including the same, which are capable of preventing introduction of foreign substances, ensuring reliability in wire bonding and making it easy to apply an agent for preventing the introduction of foreign substances.

Furthermore, the embodiments provide a lens moving apparatus and a camera module and an optical device each including the same, which are capable of suppressing generation of contaminants and improving solderability between a coil board and a circuit board.

Technical Solution

A lens moving apparatus according to an embodiment includes a circuit board having therein a seating recess, an image sensor disposed in the seating recess in the circuit board, and first epoxy disposed in the seating recess, wherein the seating recess has first and second lateral surfaces, which face each other, and third and fourth lateral surfaces, which face each other, wherein the circuit board has at least one application groove formed in at least one of the first and second lateral surfaces of the seating recess, wherein the at least one application groove has an opening, which is formed in an upper surface of the circuit board, and wherein at least a portion of the first epoxy is disposed in the at least one application groove.

Another portion of the first epoxy may be disposed between the first to fourth lateral surfaces of the seating recess and a lateral surface of the image sensor disposed in the seating recess.

The camera device may further include a lens moving apparatus for moving a lens.

The camera device may further include second epoxy for attaching a lower surface of the image sensor to a bottom surface of the seating recess. The first epoxy and the second epoxy may be made of the same material.

The circuit board may include a first terminal disposed in an area thereof abutting on the third lateral surface of the seating recess, the image sensor may include a first terminal provided in an area of an upper surface of the image sensor, which abuts on a lateral surface thereof that faces the third lateral surface of the seating recess, and the circuit board may further include a first wire connecting the first terminal of the circuit board to the first terminal of the image sensor.

The at least one application groove may have a diameter that is greater than a distance between the lateral surface of the seating recess and a lateral surface of the image sensor.

The at least one application groove may not overlap the first wire in an optical-axis direction.

A bottom surface of the at least one application groove may have a height difference from a bottom surface of the seating recess in an optical-axis direction, and the bottom surface of the at least one application groove may be positioned higher than the bottom surface of the seating recess.

The first epoxy may be thermohardening resin, naturally hardening resin or UV hardening resin.

Each of the first and second lateral surfaces of the seating recess may be longer than each of the third and fourth lateral surfaces of the seating recess.

An upper surface of the first epoxy may be positioned at the same level as or a level lower than an upper surface of the image sensor disposed in the seating recess.

A camera device according to another embodiment includes a circuit board having therein a seating recess having first and second lateral surfaces, which face each other, and third and fourth lateral surfaces, which face each other, a reinforcing member disposed under the circuit board, an image sensor disposed on the reinforcing member and in the seating groove, and first epoxy disposed in the seating recess, wherein the circuit board further has at least one application groove formed in at least one of the first and second lateral surfaces of the seating recess, and at least a portion of the first epoxy is disposed in the at least one application groove.

The first epoxy may be disposed on a lateral surface of the at least one application groove, the first to fourth lateral surfaces of the seating recess and a first area of the reinforcing member, wherein the first area of the reinforcing member is an area of an upper surface of the reinforcing member between a lateral surface of the image sensor and the first to fourth lateral surfaces of the circuit board.

Advantageous Effects

Embodiments are able to prevent the introduction of foreign substances, ensure reliability in wire bonding and make it easy to apply an agent for preventing the introduction of foreign substances.

Furthermore, embodiments are able to suppress generation of contaminants and improve solderability between a coil board and a circuit board.

BEST MODE

Figure 1:
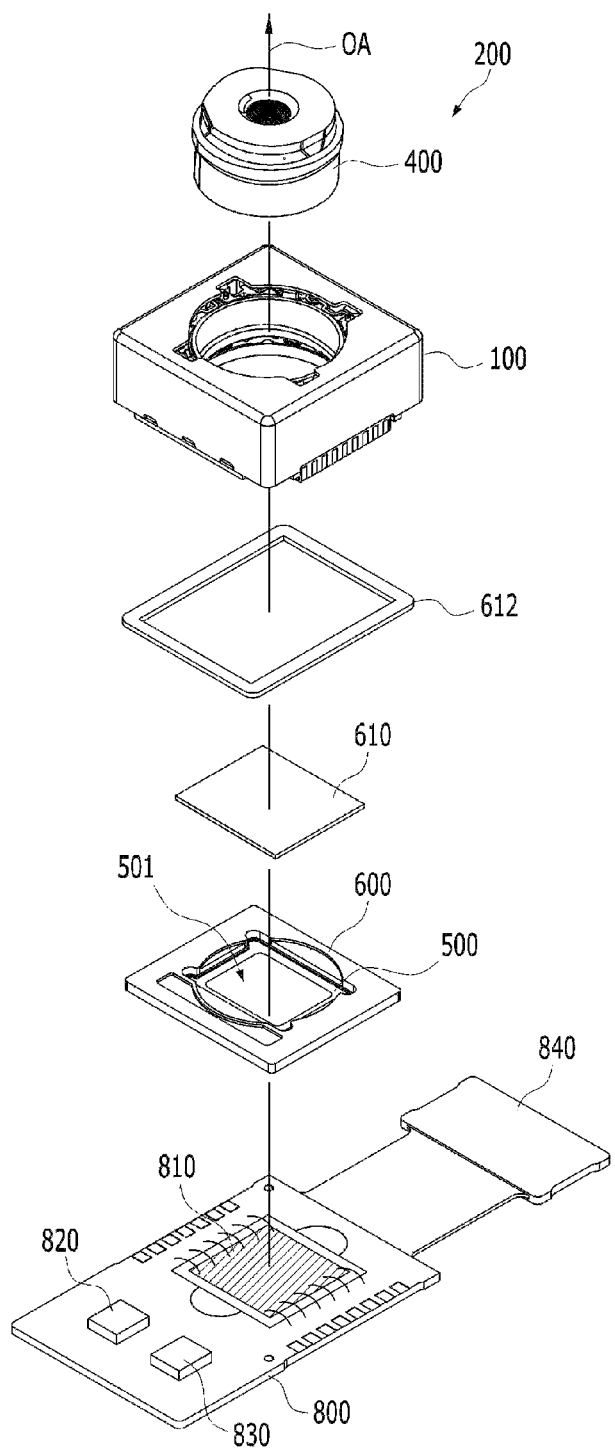
FIG. 1 is an exploded perspective view of a camera device according to an embodiment.

Hereinafter, embodiments of the present invention capable of concretely achieving the above objects will be described with reference to the accompanying drawings.

In the following description of the embodiments, it will be understood that, when an element is referred to as being formed "on" or "under" another element, it can be directly "on" or "under" the other element, or can be indirectly disposed, with one or more intervening elements therebetween. In addition, it will also be understood that "on" or "under" the element may mean an upward direction or a downward direction based on the element.

In addition, relative terms such as, for example, "first", "second", "on/upper/above" and "beneath/lower/below", used in the following description may be used to distinguish any one substance or element from another substance or element without requiring or containing any physical or logical relationship or sequence between these substances or elements. The same reference numeral designates the same element throughout all the drawings.

Unless otherwise defined, the terms "comprise," "include" or "have" used in the above description are used to designate the presence of features, steps or combinations thereof described in the specification, and should be understood so as not to exclude the presence or possibility of additional inclusion of one or more different features, steps or combinations thereof. Furthermore, the term "correspond" or the like may include at least one of the meanings of "face" or "overlap".

Hereinafter, a camera module according to an embodiment and an optical device including the camera module will be described with reference to the accompanying drawings. For convenience of description, although the camera module according to the embodiment is described using a quadrilateral coordinate system (x, y, z), the lens moving apparatus may be described using some other coordinate system, and the embodiments are not limited thereto. In the respective drawings, the X-axis and the Y-axis mean directions perpendicular to an optical OA axis, i.e. the Z-axis, and the optical axis (Z-axis) direction or a direction parallel to the optical axis OA may be referred to as a "first direction", the X-axis direction may be referred to as a "second direction", and the Y-axis direction may be referred to as a "third direction". In the following description, the term "terminal" may be interchangeably used with "pad", "electrode" or "conductive layer".

A "handshake correction function", which is applied to a subminiature camera module of a mobile device such as, for example, a smart phone or a tablet PC, may be a function of moving a lens in a direction perpendicular to an optical-axis direction or tilting the lens with respect to the optical axis so as to cancel vibration (or motion) caused by shaking of the user's hand.

Furthermore, the term "auto-focusing function" may refer to a function of moving a lens in an optical-axis direction according to a distance to an object and thus automatically focusing on the object so as to obtain a clear image in an image sensor.

A lens moving apparatus may include a VCM (Voice Coil Motor), a lens moving motor or an actuator, and may be interchangeably used with a VCM, a lens moving motor or an actuator. The lens moving apparatus according to the embodiment may be embodied or used in various fields, such as, for example, those of a camera module or an optical device.

For example, the lens moving apparatus 100 according to the embodiment may be included in an optical instrument, which is designed to form an image of an object in a space using reflection, refraction, absorption, interference, diffraction or the like, which is the characteristic of light, to extend eyesight, to record an image obtained through a lens or to reproduce the image, to perform optical measurement, or to propagate or transmit an image. For example, the optical instrument according to the embodiment may include a smart phone and a portable terminal equipped with a camera.

FIG. 1 is an exploded perspective view of a camera device 200 according to an embodiment.

Referring to FIG. 1, the camera device 200 may include a lens or a lens barrel 400, a lens moving apparatus 100, a filter 610, a holder 600, a circuit board 800, an image sensor 810 and a foreign-substance-blocking member 310. Here, the term "camera device" may be interchangeably used with "camera module", "imaging unit" or "photographing unit", and the term "holder" may be interchangeably used with "sensor base". The term "foreign-substance-blocking member" may be interchangeably used with "epoxy" or "adhesive member".

The camera device 200 may further include a blocking member 1500 disposed on the filter 610.

Furthermore, the camera device 200 may further include an adhesive member 612.

In addition, the camera device 200 may further include a motion sensor 820, a controller 830 and a connector 840.

The lens or the lens barrel 400 may be mounted in the bobbin 110 of the lens moving apparatus 100 and may be moved in the optical-axis direction.

The holder 600 may be disposed under the base 210 of the lens moving apparatus 100.

For example, the holder 600 may be disposed under the lens or the lens barrel 400.

The filter 610 may be mounted on the holder 600. The holder 600 may be depressed from the upper surface thereof, and may include a seating portion 500 in which the filter 610 is seated. The filter 610 may be disposed in the seating portion 500.

Although the seating portion 500 may be embodied as a recess, cavity or hole, which is depressed from the upper surface thereof, the disclosure is not limited thereto. In another embodiment, the seating portion 500 may be embodied as a projecting portion, which projects from the upper surface of the holder 600.

The adhesive member 612 may couple or attach the base 210 of the lens moving apparatus 100 to the holder 600. For example, the adhesive member 512 may be disposed between the lower surface of the base 210 and the upper surface of the holder 600 so as to attach the two surfaces to each other.

The adhesive member 612 may serve to prevent foreign substances from entering the lens moving apparatus 100 as well as to perform attachment as described above. For example, the adhesive member 612 may be epoxy, thermo-hardening adhesive, UV hardening adhesive, or the like.

The seating portion in the holder 600 may include an inner surface and a bottom surface.

The filter 610 may be disposed on the bottom surface of the seating portion 500.

The holder 600 may have a bore 501, which is formed in a region on which the filter 610 is mounted or disposed so as to allow the light that passes through the filter 610 to be incident on the image sensor 810.

For example, the bore 501 may be formed through the holder 600 in the optical-axis direction, and may be alternatively referred to as a through hole. For example, the bore 600 may be formed through the center of the holder 600 and may be disposed so as to correspond to or face the image sensor 810.

For example, the bore 501 may be provided in the bottom surface of the seating portion 500, and may have an area smaller than that of the filter 610.

For example, the filter 610 may be disposed on the bottom surface of the seating portion 500 in the holder 600. The filter 610 may serve to prevent light in a specific frequency band, among the light passing through the lens barrel 400, from entering the image sensor 810. In another embodiment, the filter 610 may be disposed in a seating recess formed in the lower surface of the base 210.

Although the filter 610 may be, for example, an infrared-blocking filter, the disclosure is not limited thereto. In another embodiment, the filter 610 may be an infrared-transmitting filter.

For example, the filter 610 may be disposed so as to be parallel to the x-y plane perpendicular to the optical axis OA.

The filter 610 may be attached to the bottom surface of the seating portion in the holder 600 by means of an adhesive member (not shown) such as UV epoxy.

The circuit board 800 may be disposed under the holder 600, and the image sensor 810 may be mounted or disposed on the circuit board 800. The image sensor 810 may be a region on which an image included in the light passing through the filter 610 is formed.

The circuit board 800 may include various circuits, elements, controllers and the like in order to convert the image formed on the image sensor 810 into an electrical signal and transmit the electrical signal to an external device.

The circuit board 800 may have a circuit pattern formed thereon, which is conductively connected to the image sensor 810 and to various elements.

The holder 600 may be disposed on the circuit board 800 and may accommodate the filter 610 therein. The holder 600 may support the lens moving apparatus 100 positioned thereabove. The holder 600 may be alternatively referred to as a sensor base.

The lower surface of the base 210 of the lens moving apparatus 100 may be disposed on the upper surface of the holder 600. For example, the lower surface of the base 210 of the lens moving apparatus 100 may be in contact with the upper surface of the holder 600 and may be supported by the upper surface of the holder 600.

The holder 600 may have the seating portion 500, which is depressed from the upper surface of the holder 600, and the seating portion 500 may have the inner surface and the bottom surface. At least some of the inner surface of the seating portion 500 may face the lateral surface of the filter 610.

The holder 600 may be alternatively referred to as a first holder, and the circuit board 800 may be alternatively referred to as a second holder.

The image sensor 810 may receive an image included in light, which enters the image sensor 810 through the lens moving apparatus 100, and may convert the received image into an electrical signal.

For example, the image sensor 810 may have an imaging area for detecting the light passing through the lens or the lens barrel 400. Here, the imaging area 811 may be alternatively referred to as an effective area, a light-receiving area or an active area.

The filter 610 and the image sensor 810 may be spaced apart from each other so as to face each other in the direction of the optical-axis OA or in the first direction.

The filter 610 may be disposed or seated on the bottom surface of the seating portion 500. For example, the lower surface of the filter 610 may be in contact with the bottom surface of the seating portion 500.

The blocking member 1500 may be disposed on the upper surface of the filter 610. The blocking member 1500 may be alternatively referred to as a masking portion.

The blocking member 1500 may have a bore, for example, a through hole, which is formed at a location corresponding to the image sensor 810 in the optical-axis direction.

For example, the blocking member 1500 may be disposed on the peripheral area of the upper surface of the filter 610, and may serve to prevent at least part of the light, which enters the peripheral area of the filter 610 through the lens or the lens barrel 400, from passing through the filter 610. For example, the blocking member 1500 may be coupled or attached to the upper surface of the filter 610.

For example, the filter 610 may be configured to have a quadrilateral shape when viewed in the optical-axis direction, and the blocking member 1500 may be formed along the peripheral sides of the upper surface of the filter 610 so as to define a symmetrical shape with respect to the filter 610. Here, the blocking member 1500 may have a constant width at the peripheral sides of the upper surface of the filter 1610.

For example, the blocking member 1500 may have a quadrilateral shape, and may have a quadrilateral bore, without being limited thereto.

The blocking member 1500 may be made of an opaque material.

The blocking member 1500 may be made of an opaque adhesive material, which is applied to the filter 610, or may be embodied as a film sheet, which is attached to the filter 610.

The filter 610 and the image sensor 810 may be disposed so as to face each other in the optical-axis direction, and at least a portion of the blocking member 1500 may overlap terminals 41a and 41b and/or wires 51a and 51b disposed on the circuit board 800. The blocking member 1500 may not overlap the imaging area 811 of the image sensor 810 in the optical-axis direction.

The blocking member 1500, which is disposed on the peripheral area of the upper surface of the filter 610, may serve to prevent an undesired portion of the incident light 1010, which is incident on the image sensor 810 through the lens or the lens barrel 1400, from entering the image sensor 810.

The wires 51a and 51b and the terminals 41a and 41b of the circuit board 800 may be made of a conductive material, for example gold, silver, copper, copper alloy, or the like. The conductive material may have a property of reflecting light.

Specifically, the light that has passed through the filter 610 may be reflected by the terminals 41a and 41b of the circuit board 800 and the wires 51a and 51b, and the reflected light may cause momentary blazing, that is, a flare phenomenon. The flare phenomenon may distort an image formed on the image sensor 810 or deteriorate the quality of the image.

Since the blocking member 1500 is disposed such that at least a portion thereof overlaps the terminals 41a and 41b and/or the wires 51a and 51b in the optical-axis direction, it is possible to block part of the light that has passed through the lens or the lens barrel 400 and is then directed toward the terminals 41a and 41b of the circuit board 800 and/or the wires 51a and 51b, thereby preventing the image formed on the image sensor 810 from being distorted or deteriorated in image quality.

The motion sensor 820 may be mounted or disposed on the circuit board 800, and may be conductively connected to the controller 830 via a circuit pattern provided on the circuit board 800.

The motion sensor 820 may output angular velocity information about motion of the camera device 200. The motion sensor 820 may be embodied as a biaxial or triaxial gyro sensor or an angular velocity sensor.

The controller 830 may be mounted or disposed on the circuit board 800.

The circuit board 800 may be conductively connected to the lens moving apparatus 100. For example, the circuit board 800 may be conductively connected to the circuit board 250 of the lens moving apparatus 100.

For example, a drive signal may be supplied to each of a first coil 120 and a second coil 230 of the lens moving apparatus 100, and may be supplied to an AF position sensor (or an OIS position sensor). The output of the AF position sensor (or OIS position sensor) may be transmitted to the circuit board 800.

The connector 840 may be conductively connected to the circuit board 800 and may include a port, which is to be conductively connected to an external device.

The camera device 200 may be one of an AF (autofocus) camera module and an OIS (optical image stabilizer) camera module. The AF camera module serves to fulfil only an autofocusing function, and the OIS camera module serves to fulfil both an autofocusing function and an OIS function.

For example, the lens moving apparatus 100 may be an AF lens moving device or an OIS lens moving device. Here, the meanings of AF and OIS may be the same as those that were described in the AF camera module and the OIS camera module.

Figure 2:
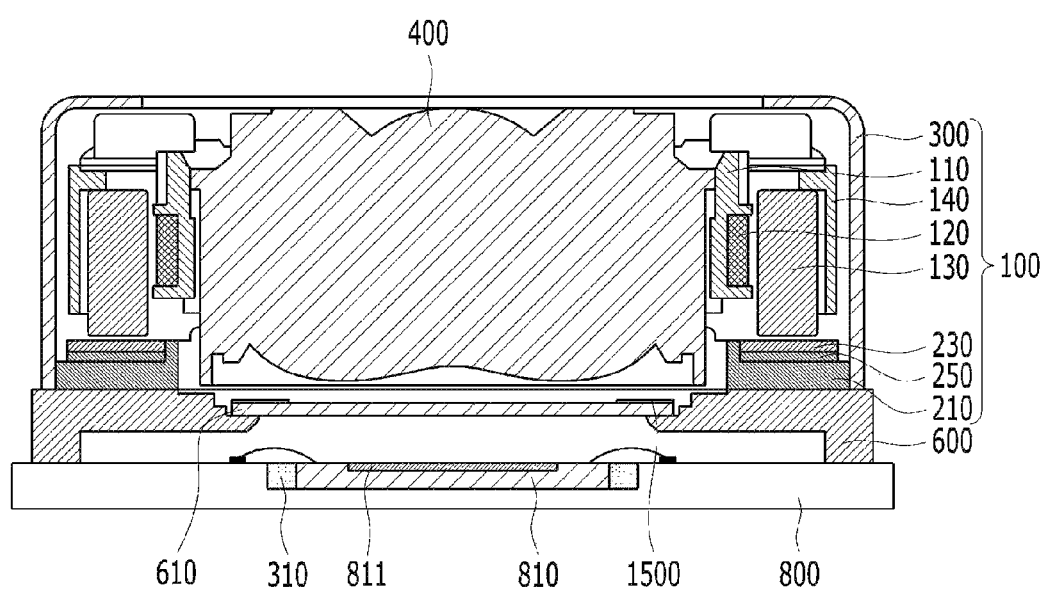
FIG. 2 is a cross-sectional view of an embodiment of the camera device shown in FIG. 1.

FIG. 2 is a cross-sectional view of an embodiment of the camera device 200 shown in FIG. 1. In FIG. 2, the reference numerals the same as those in FIG. 1 indicate the same elements.

Referring to FIG. 2, the lens moving apparatus 100 of the camera device 200 may be an OIS lens moving device.

The lens moving apparatus 100 may include a housing 140, a bobbin 110, which is disposed in the housing 140 and in which the lens or the lens barrel 400 is mounted, a first coil 120 disposed at the bobbin 110, a magnet 130 disposed at the housing 140 so as to face the first coil 120, at least one upper elastic member (not shown) coupled both to the upper portion of the bobbin 110 and to the upper portion of the housing 140, at least one lower elastic member (not shown) coupled both to the lower portion or the bobbin 110 and to the lower portion of the housing 140, a second coil 230 disposed under the bobbin 110 (and/or the housing 140), a circuit board 250 disposed under the second coil 230, and a base 210 disposed under the circuit board 250.

The lens moving apparatus 100 may further include a cover member 300, which is coupled to the base 210 of the lens moving apparatus 100 and which provides in conjunction with the base 210, a space for accommodating the components of the lens moving apparatus 100.

The lens moving apparatus 100 may further include a support member for conductively connecting the upper elastic member to the circuit board 250 and for supporting the housing 140 with respect to the base 210. Each of the first coil 120 and the second coil 230 may be conductively connected to the circuit board 250, and may receive a drive signal (driving current) from the circuit board 250.

For example, the upper elastic member may include a plurality of upper elastic units (for example, upper springs), and the support member may include support members connected to the upper elastic units. The first coil 120 may be conductively connected to the circuit board 250 via the upper elastic units and the support member. The circuit board 250 may include a plurality of terminals, and some of the plurality of terminals may be conductively connected to the first coil 120 and/or the second coil 230.

The bobbin 110 and the lens or the lens barrel 400 coupled to the bobbin 110 may be moved in the optical-axis direction using the electromagnetic force resulting from the interaction between the first coil 120 and the magnet 130. As a result, the displacement of the bobbin 110 in the optical-axis direction is controlled, thereby realizing AF operation.

Furthermore, the housing 140 may be moved in a direction perpendicular to the optical axis using the electromagnetic force resulting from the interaction between the second coil 230 and the magnet 130, thereby realizing handshake correction or OIS operation.

For AF feedback operation, the lens moving apparatus 100 of the camera device 200 may further include a sensing magnet (not shown) disposed at the bobbin 110 and an AF position sensor, for example, a hall sensor (not shown) disposed at the housing 140. In addition, the lens moving apparatus 100 may further include the circuit board (not shown), which is disposed at the housing and/or the base and on which the AF position sensor is disposed or mounted. In another embodiment, the AF position sensor may be disposed at the bobbin, and the sensing magnet may be disposed at the housing. Furthermore, the lens moving apparatus 100 may further include a balancing magnet disposed at the bobbin 110 so as to correspond to the sensing magnet.

The AF position sensor may output an output signal corresponding to the result of detection of a magnetic field of the sensing magnet according to movement of the bobbin 110. The AF position sensor may be conductively connected to the circuit board 250 via the upper elastic member (or the lower elastic member) and/or the support member. The circuit board 250 may provide a drive signal to the AF position sensor, and the output of the AF position sensor may be transmitted to the circuit board 250.

In another embodiment, the lens moving apparatus 100 may be an AF lens moving device. The AF lens moving device may include a housing, a bobbin disposed in the housing, a coil disposed at the bobbin, a magnet disposed at the housing, at least one elastic member coupled both to the bobbin and to the housing, and a base disposed under the bobbin (and/or the housing). The elastic member may include, for example, the above-described upper and lower elastic members.

The coil may be provided with a drive signal (for example, driving current), and the bobbin may be moved in the optical-axis direction using the electromagnetic force resulting from the interaction between the coil and the magnet. In another embodiment, the coil may be disposed at the housing, and the magnet may be disposed at the bobbin.

For AF feedback operation, the AF lens moving device may further include a sensing magnet disposed at the bobbin, an AF position sensor (for example, a hall sensor) disposed at the housing, and a circuit board, at which the AF position sensor is disposed and which is disposed or mounted on the housing and/or the base. In another embodiment, the AF position sensor may be disposed at the bobbin, and the sensing magnet may be disposed at the housing.

The circuit board may be conductively connected to the coil and the AF position sensor. A drive signal may be provided to the coil and the AF position sensor via the circuit board, and the output of the AF position sensor may be transmitted to the circuit board.

Figure 3:
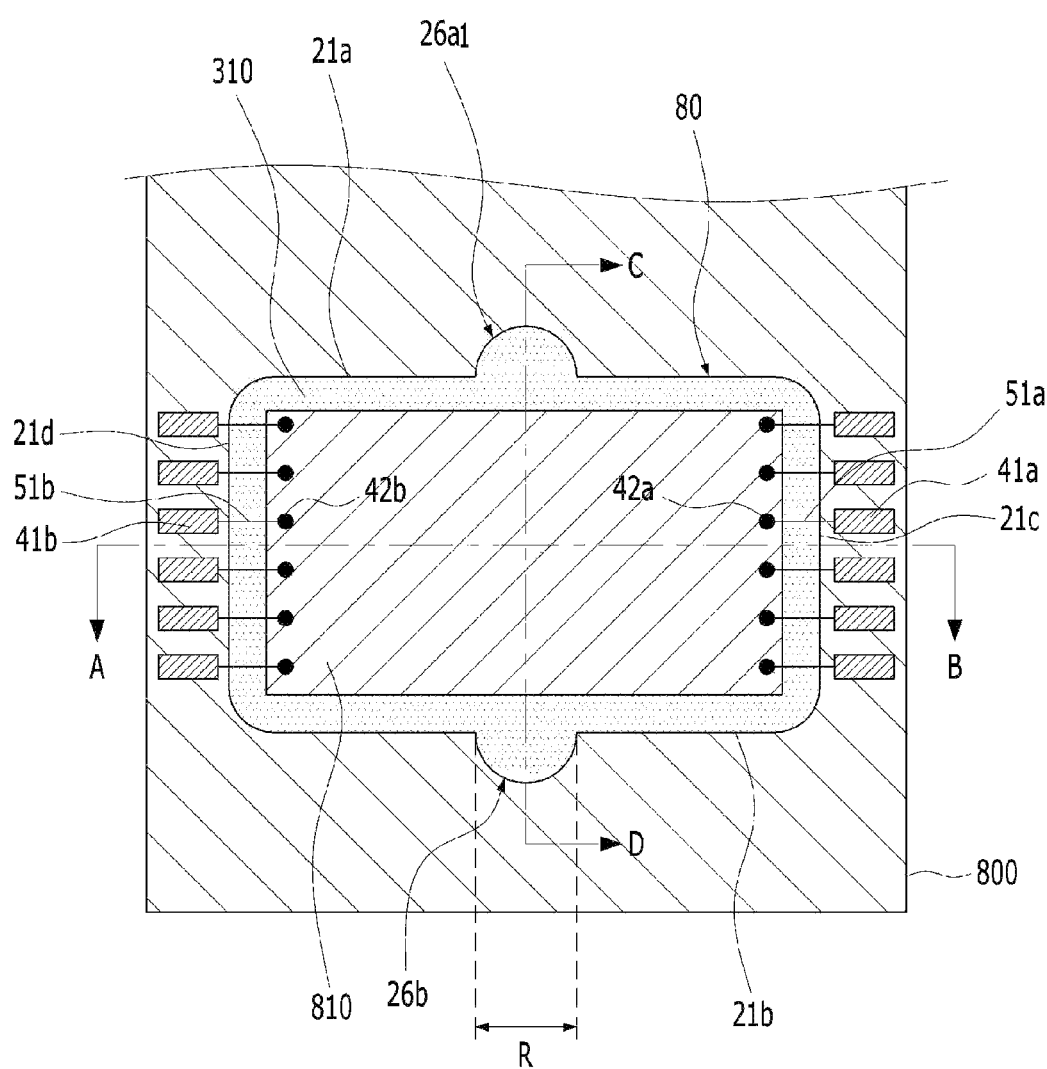
FIG. 3 is a plan view showing a circuit board and an image sensor.
Figure 4A:
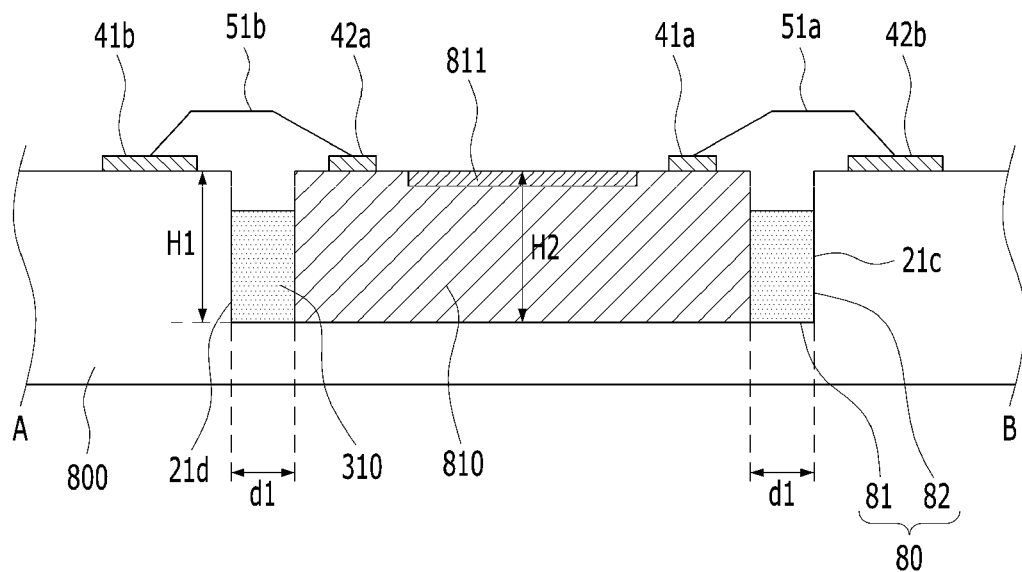
FIG. 4A is a cross-sectional view taken along line A-B in FIG. 3.
Figure 4B:
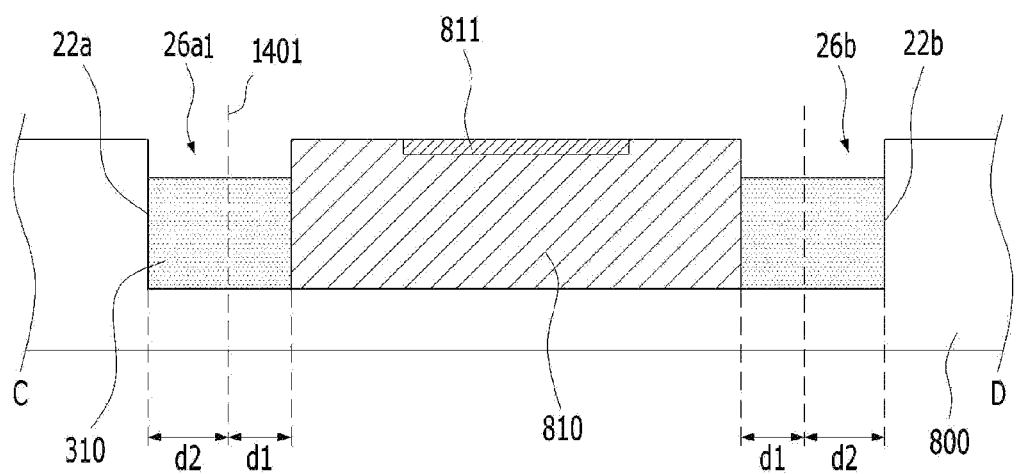
FIG. 4B is a cross-sectional view taken along line C-D in FIG. 3.

FIG. 3 is a plan view showing the circuit board 800 and the image sensor 810. FIG. 4A is a cross-sectional view taken along line A-B in FIG. 3. FIG. 4B is a cross-sectional view taken along line C-D in FIG. 3.

Referring to FIGS. 3, 4A and 4B, the circuit board 800 may have a seating recess 80, in which the image sensor 810 is disposed or received, and one or more application grooves 26a1 and 26b for application or injection of a foreign-substance-blocking member.

Here, the seating recess 800 may be alternatively referred to as a groove, a cavity or a first groove, and each of the application grooves 26a1 and 26b may be alternatively referred to as an injection groove, a second groove or a cavity.

The seating recess 80 in the circuit board 800 may have a bottom surface 81 and a lateral surface 82.

The seating recess 80 in the circuit board 800 may have various shape, such as a polygonal shape, a circular shape, an elliptical shape or the like, and may have a size (for example, a surface area) larger than the size (for example, the surface area) of the image sensor 810. For example, the surface area of the bottom surface 81 of the seating recess 80 may be larger than the surface area of the lower surface of the image sensor 810.

The depth H1 of the seating recess 80 in the circuit board 800 may be equal to the height H2 of the upper surface of the image sensor 810, without being limited thereto. Here, the height H2 of the image sensor 810 may be the distance between the bottom surface 81 of the seating recess 80 and the upper surface of the image sensor 810.

For example, although the height of the upper surface of the circuit board 800 may be equal to the height of the upper surface of the image sensor disposed in the seating recess 80, the disclosure is not limited thereto.

In another embodiment, the depth H1 of the seating recess 80 in the circuit board 800 may be greater than the height H2 of the upper surface of the image sensor 810 (H1>H2). For example, the height of the upper surface of the circuit board 800 may be greater than the height of the upper surface of the image sensor 810 disposed in the seating recess 80.

In a further embodiment, the depth H1 of the seating recess 80 in the circuit board 800 may be less than the height H2 of the upper surface of the image sensor 810 (H1<H2). For example, the height of the upper surface of the circuit board 800 may be less than the height of the upper surface of the image sensor 810 disposed in the seating recess 80.

The lateral surface of the image sensor 810 may be spaced apart from the lateral surface 82 of the seating recess 80 in the circuit board 800. For example, the distance d1 between the lateral surface of the image sensor 810 and the lateral surface 82 of the seating recess 80 in the circuit board 800 may be 0.1 mm-0.5 mm. For example, the distance d1 may be 0.1 mm-0.3 mm.

If the distance d1 is less than 0.1 mm, a process margin is insufficient to dispose the image sensor 810 in the seating recess 80 in the circuit board 800, and the image sensor 810 or the circuit board 800 may be damaged due to a collision between the image sensor 810 and the circuit board 800 caused by external impact.

If the distance d1 is greater than 0.5 mm, the distance between the terminals 41*a* and 41*b* of the circuit board 800 and the terminals 42*a* and 42*b* of the image sensor 810 increases, thereby making it difficult to perform wire bonding and decreasing the reliability of wire bonding.

Referring to FIG. 3, the lateral surface 82 of the seating recess 80 in the circuit board 800 may have a first lateral surface 21*a* and a second lateral surface 21*b*, which face each other, and a third lateral surface 21*c* and a fourth lateral surface 21*d*, which face each other. For example, the third lateral surface 21*c* may connect the first end of the first lateral surface 21*a* and the first end of the second lateral surface 21*b* to each other, and the fourth lateral surface 21*d* may connect the second end of the first lateral surface 21*a* and the second end of the second lateral surface 21*b* to each other.

The application grooves 26*a*1 and 26*b* in the circuit board 800 may be provided in at least one of the first lateral surface 21*a* and the second lateral surface 21*b* of the seating recess 80.

The application grooves 26*a*1 and 26*b* may be depressed into the first lateral surface 21*a* (or the second lateral surface 21*b*) of the seating recess 80 in a horizontal direction and may have openings formed in the upper surface of the circuit board 800. The application grooves 26*a*1 and 26*b* may serve as introduction inlets through which the foreign-substance-blocking member 310 is injected or applied.

For example, the horizontal direction may be a direction toward the first lateral surface 21*a* (or the second lateral surface 21*b*) of the seating recess 80 from the first lateral surface of the image sensor 810. The first lateral surface of the image sensor 810 may be the lateral surface that faces the first lateral surface 21*a* (or the second lateral surface 21*b*) of the seating recess 80.

For example, the corner at which two adjacent lateral surfaces of the seating recess 80 meet each other may have a curved shape or a round shape, without being limited thereto. In another embodiment, the corner at which two adjacent lateral surfaces of the seating recess 80 meet each other may have an angled shape. For example, two adjacent lateral surfaces of the seating recess 80 may be perpendicular to each other.

Each of the first lateral surface 21*a* and the second lateral surface 21*b* of the seating recess 80 may have a length greater than that of each of the third lateral surface 21*c* and the fourth lateral surface 21*d* of the seating recess 80. For example, each of the third lateral surface 21*c* and the fourth lateral surface 21*d* of the seating recess 80 may be a shorter lateral surface, and each of the first lateral surface 21*a* and the second lateral surface 21*b* may be a longer lateral surface, which is longer than the shorter lateral surface. In another embodiment, each of the first lateral surface 21*a* and the second lateral surface 21*b* of the seating recess 80 may be a shorter lateral surface, and each of the third lateral surface and the fourth lateral surface may be a longer lateral surface, which is longer than the shorter lateral surface.

For example, since the application grooves 26*a*1 and 26*b* are provided in the first lateral surface 21*a* and the second lateral surface 21*b* of the seating recess 80, which are the longer lateral surfaces, it is possible to ensure sufficient space to inject the foreign-substance-blocking member and to uniformly diffuse the foreign-substance-blocking member into the seating recess 80.

For example, the circuit board 800 may have the first application groove 26*a*1, formed in the first lateral surface 21*a* of the seating recess 80, and the second application groove 26*b*, formed in the second lateral surface 21*b* of the seating recess 80.

For example, the first application groove 26*a*1 and the second application groove 26*b* may face or overlap each other in a horizontal direction, without being limited thereto. In another embodiment, the first application groove 26*a*1 and the second application groove 26*b* may not face or overlap each other in a horizontal direction.

For example, the first application groove 26*a*1 may be formed in the center or the central location of the first lateral surface 21*a* of the seating recess 80. For example, the center of the first application groove 26*a*1 may be aligned with the center or the central location of the first lateral surface 21*a*.

Furthermore, the second application groove 26*b* may be formed in the center or the central location of the second lateral surface of the seating recess 80. For example, the center of the second application groove 26*b* may be aligned with the center or the central location of the second lateral surface 21*b*. Here, the center of each of the application grooves 26*a*1 and 26*b* may be the central point between two ends of each of the lateral surfaces 21*a* and 21*b*.

The reason for this is to allow the foreign-substance-blocking member, which is injected through the first application groove 26*a*1, to be uniformly moved into the space between the lateral surface of the image sensor 810 disposed in the seating recess 800 and the lateral surface 82 of the seating recess 80 along the first lateral surface 21*a*.

In FIG. 3, although one application groove is formed in one of the lateral surfaces (for example, 21*a* or 21*b*) of the seating recess 80, the disclosure is not limited thereto. Two or more application grooves, which are spaced apart from each other, may be formed in one of the lateral surfaces (for example, 21*a* or 21*b*) of the seating recess 80.

Although the inner surface of each of the application grooves 26*a*1 and 26*b* may be curved, the disclosure is not limited thereto. In another embodiment, the inner surface of the application groove may include at least one flat surface and/or at least one curved surface.

For example, although the bottom surfaces of the application grooves 26*a*1 and 26*b* may be flush with the bottom surface of the seating recess 80, the disclosure is not limited thereto.

The maximum distance d2 between an imaginary straight line 1401 between the two ends of each of the application grooves 26*a*1 and 26*b* and the inner surface of each of the inner surfaces 22*a* and 22*b* of the application groove 26*a*1 may be 0.1 mm-2.5 mm. For example, the distance d2 may be 0.25 mm-1 mm.

For example, the distance d2 may be half the diameter R of each of the application grooves 26*a*1 and 26*b*, without being limited thereto.

Figure 4C:
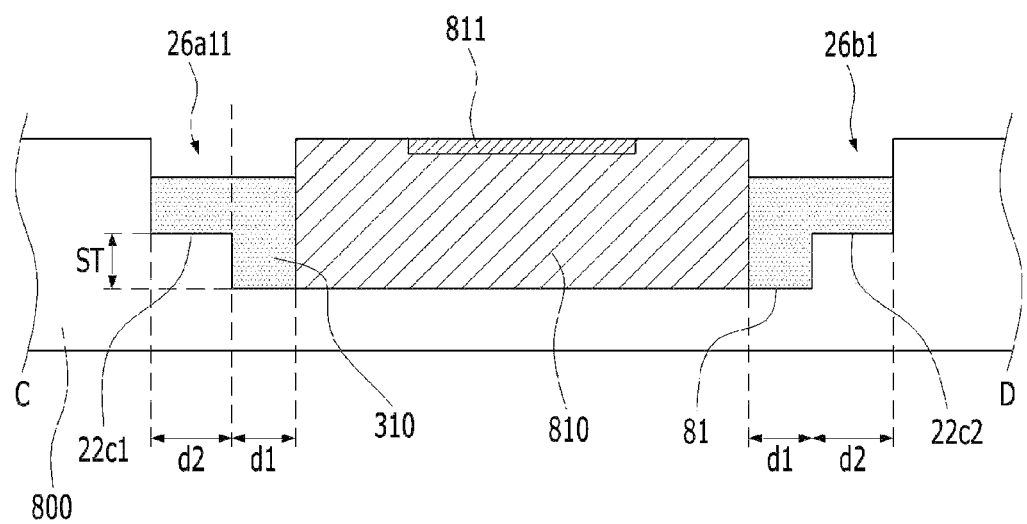
FIG. 4C is a view illustrating application grooves according to another embodiment.

FIG. 4C illustrates application grooves 26*a*11 and 26*b*1 according to another embodiment. FIG. 4C is a cross-sectional view taken along line C-D in FIG. 4B.

Reference numerals that are the same as those in FIG. 4B indicate the same elements, and description of the same elements will be given briefly or omitted.

Referring to FIG. 4C, each of the bottom surface 22c1 of the first application groove 26a11 and the bottom surface 22c2 of the second application groove 26b1 may have a height difference ST in the optical-axis direction or in a direction toward the upper surface from the lower surface of the circuit board 800.

For example, each of the bottom surface 22c1 of the first application groove 26a11 and the bottom surface 22c2 of the second application groove 26b1 may be positioned higher than the bottom surface 81 of the seating recess 80. Furthermore, each of the bottom surface 22cl of the first application groove 26a11 and the bottom surface 22c2 of the second application groove 26b1 may be positioned lower than the upper surface of the image sensor 810.

In FIG. 3, although each of the first and second application grooves 26a1 and 26b may have a semicircular shape when viewed from above, the disclosure is not limited thereto. In another embodiment, each of the first and second application grooves may have a semi-elliptical shape or a polygonal shape (for example, a triangular shape, a quadrilateral shape, or the like) when viewed from above.

The diameter R of each of the first and second application grooves 26a1 and 26b may be 0.2 mm-5 mm. For example, the diameter R may be 0.5 mm-2 mm.

If the diameter R is less than 0.2 mm, the diameter of each of the application grooves 26a1 and 26b is less than that of an injection port (for example, an injection needle) of an injection device for injection of the foreign-substance-blocking member 310, thereby making it difficult to inject the foreign-substance-blocking member or causing overflow of the foreign-substance-blocking member.

If the diameter R is greater than 5 mm, because a large amount of foreign-substance-blocking member must be injected into the application grooves in order to introduce the foreign-substance-blocking member into the seating recess 80, consumption of the foreign-substance-blocking member may increase, and the foreign-substance-blocking member that is injected into the application grooves may not be easily moved into the seating recess.

For example, the diameter R of each of the application grooves 26a1 and 26b may be greater than the distance d1 between the lateral surface 82 of the seating recess 80 and the lateral surface of the image sensor 810 disposed in the seating recess 80.

The ratio (d1:R) of the distance d1 between the lateral surface of the image sensor 810 and the lateral surface 82 of the seating recess 80 to the diameter R of each of the first and second application grooves 26a1 and 26b may be 1:1.7-1:20. For example, the ratio (d1:R) may be 1:2-1:10. If the ratio (R/d1) is less than 1.7, the foreign-substance-blocking member is not easily injected, or the foreign-substance-blocking member may overflows. If the ratio (R/d1) is greater than 20, consumption of the foreign-substance-blocking member may be needlessly high, and the foreign-substance-blocking member that is injected into the application grooves may not easily move into the seating recess.

The foreign-substance-blocking member 310 may be disposed in the application grooves 26a1 and 26b and in the space between the lateral surface of the image sensor 810 and the lateral surface 82 of the seating recess 80 in the circuit board 800.

For example, the foreign-substance-blocking member 310 may be disposed on the lateral surfaces and the bottom surfaces of the application grooves 26a1 and 26b. For example, the foreign-substance-blocking member 310 may be disposed on the lateral surface of the seating recess 80 and on a first area of the bottom surface 81 of the seating recess 80. Here, the first area of the bottom surface 81 of the seating recess 80 may be the area between the lateral surface of the image sensor 810 and the lateral surface 82 of the seating recess 80.

Here, the foreign-substance-blocking member 310 may be interchangeably used with a foreign-substance-blocking member, an adhesive member, a protective member, an insulative member (or a coating agent), a resin body, or epoxy.

For example, the foreign-substance-blocking member 310 may be made of resin or plastic.

For example, the foreign-substance-blocking member 310 may be made of thermohardening resin, naturally hardening resin or UV hardening resin.

For example, the foreign-substance-blocking member 310 may include thermohardening epoxy, UV hardening epoxy or a mixture of thermohardening epoxy and UV hardening epoxy. Furthermore, the foreign-substance-blocking member 310 may be epoxy including titanium (Ti).

For example, the foreign-substance-blocking member 310 may include a first epoxy disposed in the seating recess 80, and at least a portion of the first epoxy of the foreign-substance-blocking member 310 may be disposed in at least one of the application grooves 26al and 26b. Another portion of the first epoxy of the foreign-substance-blocking member 310 may be disposed between the first to fourth lateral surfaces of the seating recess 80 and the lateral surface of the image sensor 810 disposed in the seating recess 80.

Furthermore, the foreign-substance-blocking member 310 may further include a second epoxy, which is disposed between the bottom surface 81 of the seating recess 800 and the lower surface of the image sensor 810 so as to attach the bottom surface 81 of the seating recess 800 and the lower surface of the image sensor 810 to each other. For example, the first epoxy and the second epoxy may be made of the same epoxy material.

The upper surface of the foreign-substance-blocking member 310, which is disposed in the application grooves 26a1 and 26b and in the seating recess 80, may be positioned lower than the upper surface of the image sensor 810. The reason for this is to prevent the foreign-substance-blocking member 310 from overflowing onto the upper surface of the image sensor 810 and thus contaminating the terminals 42a and 42b of the image sensor 810.

The upper surface of the foreign-substance-blocking member 310, which is disposed in the application grooves 26a1 and 26b and the seating recess 80, may be positioned lower than the upper surface of the circuit board 800. The reason for this is to prevent the foreign-substance-blocking member 310 from overflowing onto the upper surface of the circuit board 800 and thus contaminating the terminals 41a and 41b of the circuit board 800.

In another embodiment, the upper surface of the foreign-substance-blocking member 310, which is disposed in the application grooves 26a1 and 26b and in the seating recess 80, may be flush with the upper surface of the image sensor 810 and/or the upper surface of the circuit board 800.

In a further embodiment, the upper surface of the foreign-substance-blocking member 310 disposed in the application grooves 26a1 and 26b may be positioned higher than the upper surface of the image sensor 810 and/or the upper surface of the circuit board 800. The reason for this is because there is no concern of the terminals 41a, 41b, 42a and 42b being contaminated even when the foreign-substance-blocking member 310 overflows onto the upper surface of the circuit board 800 around the application grooves 26a1 and 26b because the application grooves 26a1 and 26b are positioned so as to be spaced apart from the terminals 42a and 42b of the image sensor 810 and the terminals 41a and 41b of the circuit board 800.

The camera device 200 may further include the wires 51a and 51b, which conductively connect the terminals 41a and 41b provided at the circuit board 800 to the terminals 42a and 42b provided at the image sensor 810.

The circuit board 800 may include at least one first terminal 41a, which is disposed in an area adjacent to the third lateral surface 21c of the seating recess 80.

For example, the at least one first terminal 41a may include a plurality of first terminals, and the plurality of first terminals 41a may be arranged so as to be spaced apart from each other in a direction toward the second lateral surface 21b from the first lateral surface 21a of the seating recess 80.

Furthermore, the circuit board 800 may include at least one second terminal 41a, which is disposed in another area adjacent to the fourth lateral surface 21d of the seating recess 80.

For example, the at least one second terminal 41b may include a plurality of second terminals, and the plurality of second terminals 41b may be arranged so as to be spaced apart from each other in a direction toward the second lateral surface 21b from the first lateral surface 21a of the seating recess 80.

For example, the first terminal 41a and the second terminal 41b of the circuit board 800 may be disposed so as to face each other in a direction toward the fourth lateral surface 21d from the third lateral surface 21c of the seating recess 80, without being limited thereto.

The image sensor 810 may include the first and second terminals 42a and 42b, which are conductively connected to the first and second terminals 41a and 41b of the circuit board 800.

The first terminal 42a of the image sensor 810 may be disposed in a first area on the upper surface of the image sensor 810 adjacent to the lateral surface of the image sensor 810 that faces the third lateral surface of the seating recess 80.

For example, the first terminal 42a of the image sensor 810 may include a plurality of first terminals, and the plurality of first terminals 42a of the image sensor 810 may be arranged so as to be spaced apart from each other in a direction toward the second lateral surface 21b from the first lateral surface 21a of the seating recess 80 in the circuit board 800.

The second terminal 42b of the image sensor 810 may be disposed in a second area on the upper surface of the image sensor 810 adjacent to the lateral surface of the image sensor 810 that faces the fourth lateral surface of the seating recess 80.

For example, the second terminal 42b of the image sensor 810 may include a plurality of second terminals, and the plurality of second terminals 42b of the image sensor 810 may be arranged so as to be spaced apart from each other in a direction toward the second lateral surface 21b from the first lateral surface 21a of the seating recess 80 in the circuit board 800.

The first wire 51a may connect the first terminal 41a of the circuit board 800 to the first terminal 42a of the image sensor 810 via solder or a conductive member.

The second wire 51b may connect the second terminal 41b of the circuit board 800 to the second terminal 42b of the image sensor 810 via solder or a conductive member.

The first and second wires 51a and 51b may overlap the third lateral surface 21c and the fourth lateral surface 21d of the seating recess 80 but may not overlap the first and second application grooves 21a and 21b in the optical-axis direction.

The circuit board 800 having the application grooves 26a1 and 26b and the seating recess 80 is prepared. For example, the application grooves 26a1 and 26b may be formed through a cutting process using a cutter.

An operation of mounting the image sensor 810 to the circuit board 800 to an operation of forming the foreign-substance-blocking member 310 may be performed as follows.

The image sensor 810 is mounted on the circuit board 800.

Subsequently, wire bonding is performed between the terminals 41a and 41b of the circuit board 800 and the terminals 42a and 42b of the image sensor 810.

Subsequently, a material for formation of the foreign-substance-blocking member is injected or applied into the application grooves 26a1 and 26b. By applying epoxy having good fluidity, foreign substances present in the space between the image sensor 810 and the lateral surface 82 of the seating recess 80 are fixed, and introduction of new foreign substances into the space between the image sensor 810 and the lateral surface 82 of the seating recess 80 is prevented, thereby preventing deterioration in reliability of the image sensor 810 due to foreign substances.

Subsequently, the injected or applied foreign-substance-blocking member material is cured so as to form the foreign-substance-blocking member, and then a packaging process is performed.

A gap of 0.1 mm-0.3 mm is present between the lateral surface of the seating recess in the circuit board and the lateral surface of the image sensor disposed in the seating recess. Hence, when foreign substances enter the space between the lateral surface of the seating recess in the circuit board and the lateral surface of the image sensor disposed in the seating recess, it is difficult to remove the foreign substances due to the wire that conductively connects the circuit board to the image sensor. Furthermore, the foreign substances may escape from the space and may thus cause a malfunction after the packaging process.

When epoxy is merely applied into the space in order to prevent such malfunction due to foreign substances, it is difficult to apply the epoxy because the gap between the lateral surface of the seating recess in the circuit board and the lateral surface of the image sensor disposed in the seating recess is narrow. Meanwhile, when the width of the gap between the lateral surface of the seating recess and the lateral surface of the image sensor is increased in order to facilitate application of epoxy, the length of the wire may be increased, thereby deteriorating the reliability of wire bonding.

Since the embodiment is additionally provided with the application grooves 26a1 and 26b for application of a foreign-substance-blocking member (made of, for example, epoxy) to the lateral surface 82 of the seating recess 80, it is possible to facilitate application of the foreign-substance-blocking member into the space between the lateral surface 82 of the seating recess 80 and the lateral surface of the image sensor 810, and it is possible to perform the operation of applying the foreign-substance-blocking member after the operation of performing the wire bonding between the circuit board 800 and the image sensor 810.

Furthermore, since the embodiment does not need to increase the distance between the lateral surface 82 of the seating recess 80 and the lateral surface of the image sensor 810, there is no need to increase the length of the wire due to the increase in the distance, thereby preventing deterioration in reliability of wire bonding.

In addition, since the embodiment is able to apply the foreign-substance-blocking member after the operation of performing wire bonding between the circuit board 800 and the image sensor 810, there is no considerable influence on reliability in wire bonding even when the terminals 41a and 41b of the circuit board 800 and the terminals 42a and 52b of the image sensor 810 are contaminated by the foreign-substance-blocking member.

Figure 5A:
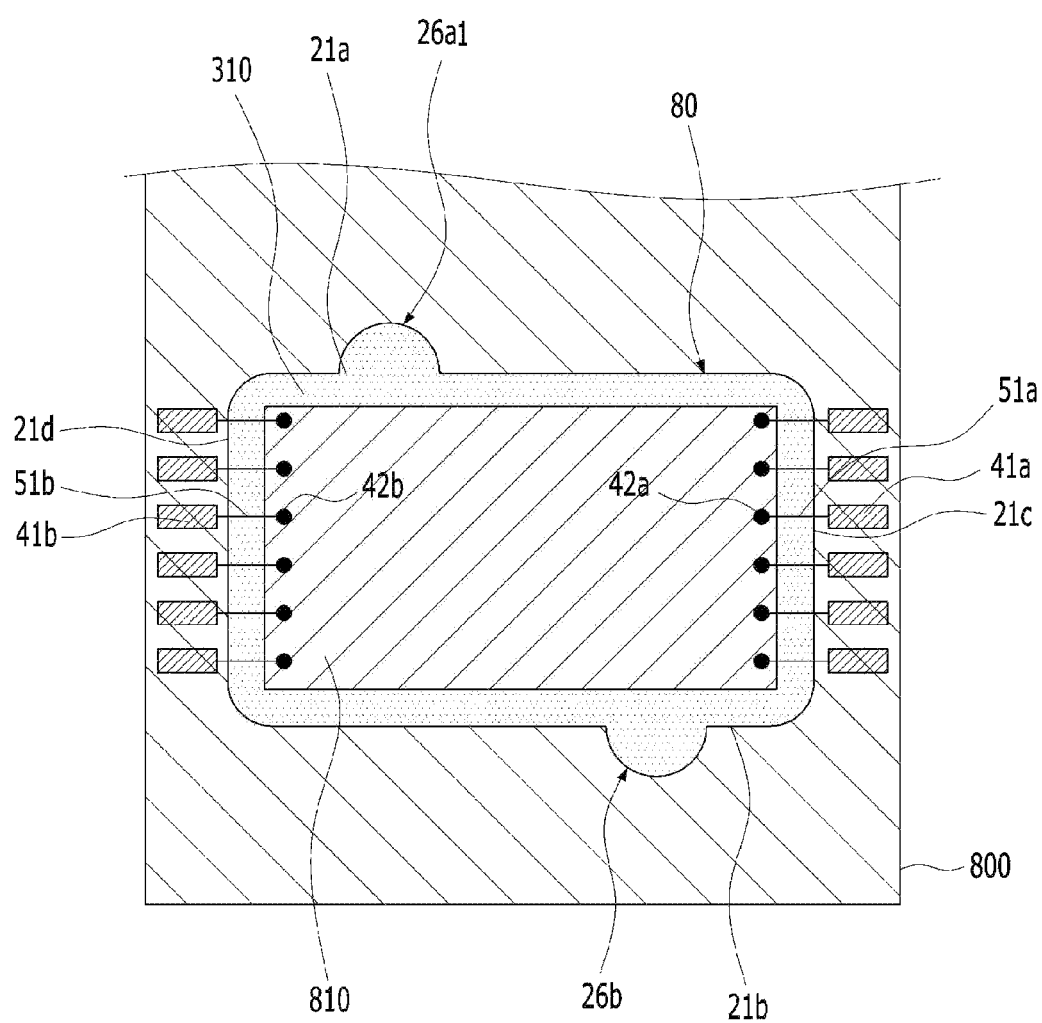
FIG. 5A is a view illustrating a modification of the application grooves shown in FIG. 3.

FIG. 5A illustrates a modification of the application grooves shown in FIG. 3.

Referring to FIG. 5A, the first application groove 26a1 and the second application groove 26b may not face each other in a direction toward the second lateral surface from the first lateral surface of the seating recess 80.

For example, the first application groove 26a1 may be positioned between the center of the first lateral surface 21a of the seating recess 80 and the first corner, at which the first lateral surface 21a and the fourth lateral surface 21c meet each other.

For example, the second application groove 21b may be positioned between the center of the second lateral surface 21b of the seating recess 80 and the second corner, at which the second lateral surface 21b and the third lateral surface 21d meet each other. The first corner and the second corner of the seating recess 80 may face each other.

For example, the first and second application grooves 26a1 and 26b may be positioned opposite each other with respect to the central line, which is connected both to the center of the first lateral surface 21a and to the center of the second lateral surface 21b.

Figure 5B:
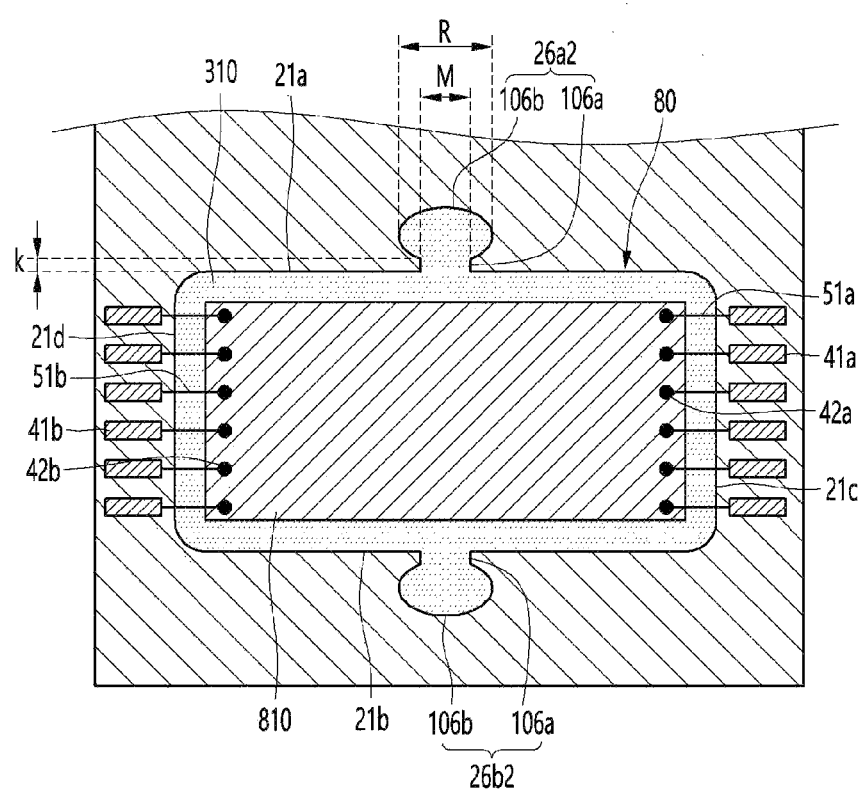
FIG. 5B is a plan view of an image sensor disposed in a circuit board according to another embodiment.

FIG. 5B is a plan view of the image sensor 810 disposed in a circuit board 800a according to another embodiment.

Referring to FIG. 5B, the circuit board 800a according to another embodiment may have the seating recess 80 and application grooves 26a2 and 26b2.

The application grooves 26a2 and 26b2 shown in FIG. 5B may be formed in the first and second lateral surfaces 21a and 21b of the seating recess 80 in the circuit board 800a.

The first application groove 26a2 (or the second application groove 26b2) may include a first portion 106a abutting on the first lateral surface 21a (or the second lateral surface 21b) and a second portion 105b connected to the first portion 106a.

The second portion 106b, in which the foreign-substance-blocking member 310 is injected or applied, may be spaced apart from the first lateral surface 21a (or the second lateral surface 21b) of the seating groove 80.

The distance K between the first lateral surface 21a (or the second lateral surface 21b) of the first application groove 26a2 (or the second application groove 26b2) may be smaller than the distance between the lateral surface 82 of the seating recess 80 and the lateral surface of the image sensor 810, without being limited thereto.

The first portion 106a may have a linear shape, and the second portion 106b may have a circular shape, an elliptical shape, a semicircular shape, or a polygonal shape, without being limited thereto.

The diameter (M or the horizontal length) of the first portion 106a may be less than the diameter R of the second portion 106b. Although the diameter R of the second portion 106b may be equal to the diameter of each of the above-described application grooves 26a1 and 26b, the disclosure is not limited thereto.

Since the diameter R of the second portion 106b is greater than the diameter M of the first portion 106a, the embodiment is able to suppress overflow of the foreign-substance-blocking member 310 onto the upper surface of the circuit board 800a during injection of the foreign-substance-blocking member 310.

Furthermore, since the second portion 106b, into which the foreign-substance-blocking member 310 is injected, is spaced apart from the lateral surface 82 of the seating recess 80, the foreign-substance-blocking member 310 injected in the second portion 106b may slowly flow into the space between the lateral surface 82 of the seating recess 80 and the lateral surface of the image sensor 810 through the first portion 106a, thereby preventing the foreign-substance-blocking member 310 from overflowing onto the upper surface of the image sensor 810 or from adhering to the wires 51a and 51b.

The application grooves 26a2 and 26b shown in FIG. 5B are different from the application grooves 26a1 and 26b shown in FIG. 3 only in shape. Accordingly, the description of the disposition, the height difference, the size, and the like of the application grooves 26a1 and 26b shown in FIGS. 3, 4A, 4B and 4C may be identically or similarly applied to the application grooves 26a2 and 26b2 shown in FIG. 5B.

Figure 6:
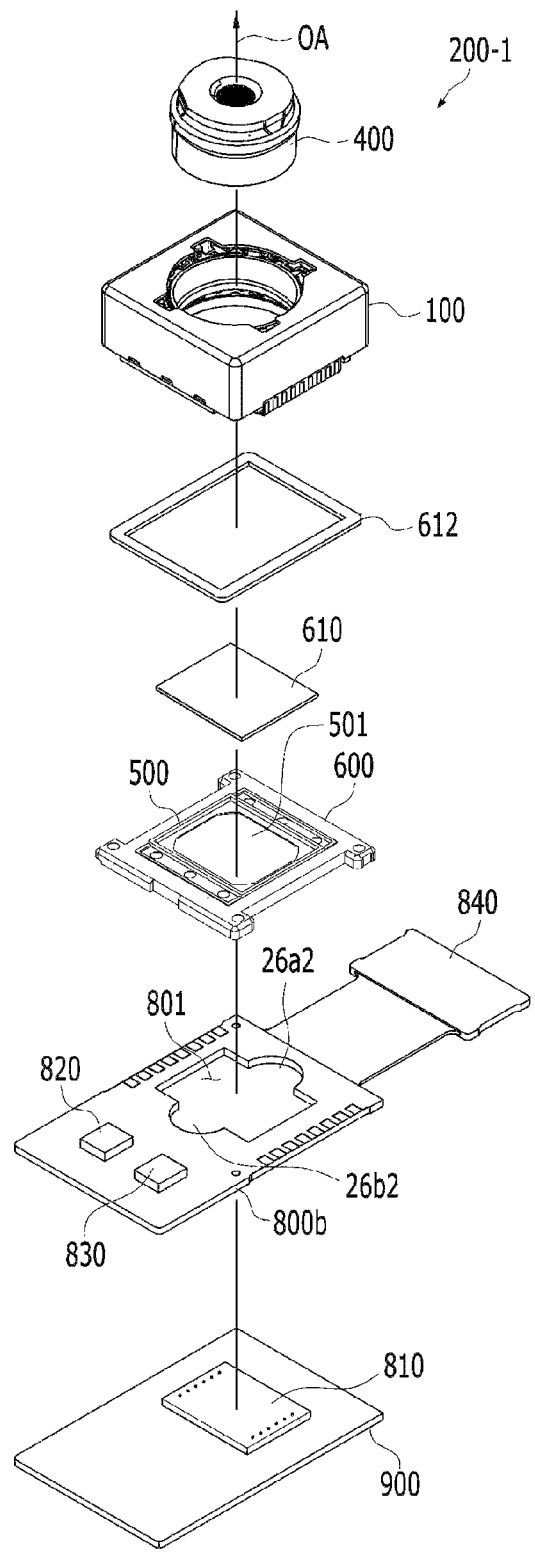
FIG. 6 is a perspective view of a camera device according to another embodiment.
Figure 7:
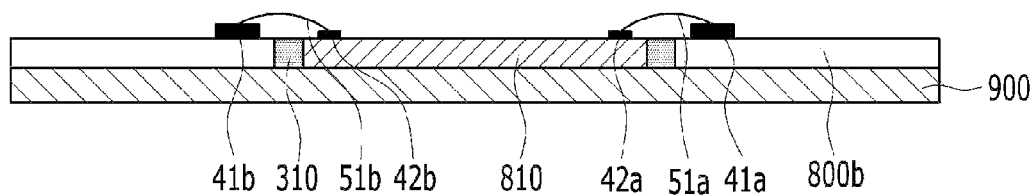
FIG. 7 is a cross-sectional view showing the circuit board, the image sensor, the foreign-substance-blocking member and the reinforcing member shown in FIG. 6.

FIG. 6 is a perspective view of a camera device 200-1 according to another embodiment. FIG. 7 is a cross-sectional view showing the circuit board 800b, the image sensor 810, the foreign-substance-blocking member 310 and the reinforcing member 900 shown in FIG. 6.

Referring to FIGS. 6 and 7, the camera device 200-1 may include the lens or the lens barrel 400, the lens moving apparatus 100, the filter 610, the holder 600, the circuit board 800b, the image sensor 810, the foreign-substance-blocking member 310 and the reinforcing member 900. Although wires for conductively connecting the image sensor 810 to the circuit board 800b are omitted in FIG. 6, the description of the above-described wires 51a and 51b may be applied to the embodiment shown in FIG. 6.

The circuit board 800 shown in FIG. 1 has the seating recess 80 for seating the image sensor 810 therein, whereas the circuit board 800b shown in FIG. 6 has a bore 801, in which the image sensor 810 is disposed, and the image sensor 810 is disposed on the reinforcing member 900.

The circuit board 800b may have the bore 801 corresponding to the bore 501 in the holder 600.

The bore 801 in the circuit board 800 may be a through hole, which is formed through the circuit board 800b in the optical-axis direction. The shape of the bore 801 in the circuit board 800 may be identical to the shape of the seating recess shown in FIG. 1 when viewed from above.

For example, the bore 801 in the circuit board 800b may have a structure that is identical to a structure in which the bottom surface 81 is omitted from the seating recess 80 shown in FIG. 1, or in which a bore is formed in the bottom surface 81 shown in FIG. 1. Accordingly, the description of the seating recess 80 shown in FIG. 1 may also be applied, except for the bottom surface 81 shown in FIG. 1.

The circuit board 800b may have one or more application grooves 26a2 and 26b2 formed in the lateral surface of the bore 801 for application or injection of the foreign-substance-blocking member 310.

The one or more application grooves 26a2 and 26b2 may be depressed from the first lateral surface 21a (or the second lateral surface 21b) of the bore 801 in a horizontal direction.

The difference between the application grooves 26a and 26b shown in FIG. 1 and the application grooves 26a2 and 26b2 shown in FIG. 6 is that the application grooves 26a2 and 26b2 shown in FIG. 6 are through holes, which are formed through the upper and lower surfaces of the circuit board 800b.

The description of the lateral surfaces 21a to 21d of the seating recess 80 may be applied to the lateral surface of the bore 801. One or more application grooves 26a2 and 26b2 may be formed in at least one of the first lateral surface 21a and the second lateral surface 21b of the bore 801 in the circuit board 800b.

For example, the bore 801 in the circuit board 800b may be alternatively referred to as a seating hole, and the application grooves 26a2 and 26b2 may be alternatively referred to as application holes.

Hereinafter, the bore 801 will be referred to as a seating hole, and the application grooves 26a2 and 26b2 will be referred to as application holes.

The description of the application grooves 26a2 and 26b2 shown in FIGS. 1 to 4C may be applied to the application holes 26a2 and 26b2 shown in FIG. 6. For example, the description regarding the shape, the size and the like of the application grooves 26a 26b may be applied to the application holes 26a2 and 26b2.

The foreign-substance-blocking member 310 may be disposed in the space between the lateral surface of the image sensor 810 and the seating hole 801 in the circuit board 800b.

For example, the foreign-substance-blocking member 310 may be disposed on the lateral surfaces of the application holes 26a2 and 26b2, the lateral surface of the seating hole 801 (for example, the first to fourth lateral surfaces), and the first area of the reinforcing member 900.

Here, the description of the first to fourth lateral surfaces 21a to 21d of the seating recess 80 may be applied to the lateral surfaces (for example, the first to fourth lateral surfaces) of the seating hole 801.

For example, the first area of the reinforcing member 900 may be the area on the upper surface of the reinforcing member 900 that is positioned between the lateral surface of the image sensor 810 and the lateral surface (for example, the first to fourth lateral surfaces) of the seating hole 801 in the circuit board 800b. For example, the first area of the reinforcing member 900 may be the area on the upper surface of the reinforcing member 900 that is exposed through the application grooves 26a2 and 26b2 and the seating hole 801.

The image sensor 810 may be disposed in the seating hole 810 in the circuit board 800b. Furthermore, the image sensor 810 may be disposed on the reinforcing member 900.

The reinforcing member 800 may be disposed under the circuit board 800b.

The upper surface of the reinforcing member 900 may include an area (hereinafter, referred to as a mounting area) that corresponds to the bore 801 in the circuit board 800b and on which the image sensor 810 is mounted.

An adhesive member (for example, epoxy) may be disposed between the lower surface of the circuit board 800b and the upper surface of the reinforcing member 900, and the circuit board 800b may be attached or secured to the reinforcing member 900 by means of the adhesive member.

An adhesive member (for example, epoxy) may be disposed between the lower surface of the image sensor 810 and the upper surface (for example, the mounting area) of the reinforcing member 900, and the image sensor 810 may be attached or secured to the reinforcing member 900 by means of the adhesive member. Although the adhesive member may be made of, for example, epoxy, thermohardening adhesive, UV hardening adhesive, adhesive film or the like, the disclosure is not limited thereto.

For example, the foreign-substance-blocking member 310 may include first epoxy disposed in the seating hole 801, and at least a portion of the first epoxy may be disposed in the application holes 26a2 and 26b2.

The image sensor 810 disposed on the upper surface of the reinforcing member 800 may be conductively connected to the circuit board 800b via the wires 51a and 51b.

The reinforcing member 800, which is a plate-shaped member having a predetermined thickness and hardness, is capable of stably supporting the image sensor 810 and of suppressing breakage of the image sensor due to external impact or contact.

Furthermore, the reinforcing member 800 is capable of improving a radiation effect of dissipating the heat generated by the image sensor 810 outwards.

For example, the reinforcing member 900 may be made of a metal material having high heat conductivity, such as stainless steel or aluminum, without being limited thereto. In another embodiment, the reinforcing member 900 may be made of glass epoxy, plastic, synthetic resin or the like.

The reinforcing member 900 may be conductively connected to the ground terminal of the circuit board 800b so as to serve as a ground for ensuring ESD (Electrostatic Discharge Protection) for the camera device.

Figure 8:
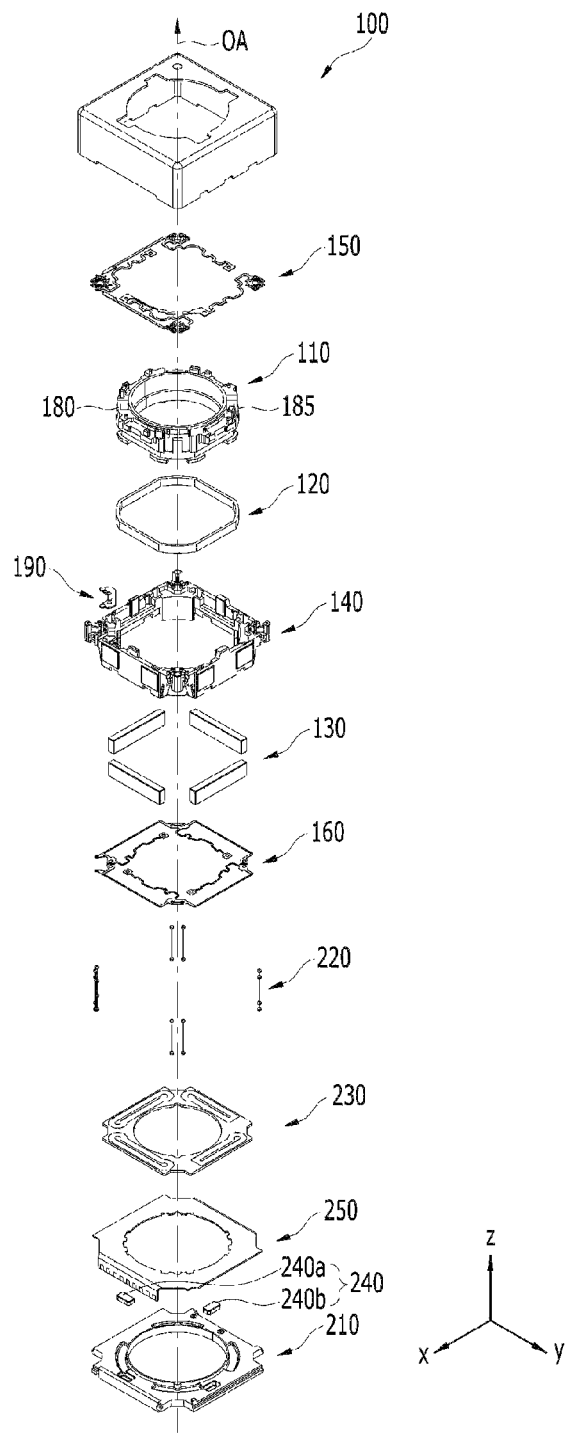
FIG. 8 is an exploded perspective view of an embodiment of the lens moving apparatus.
Figure 9:
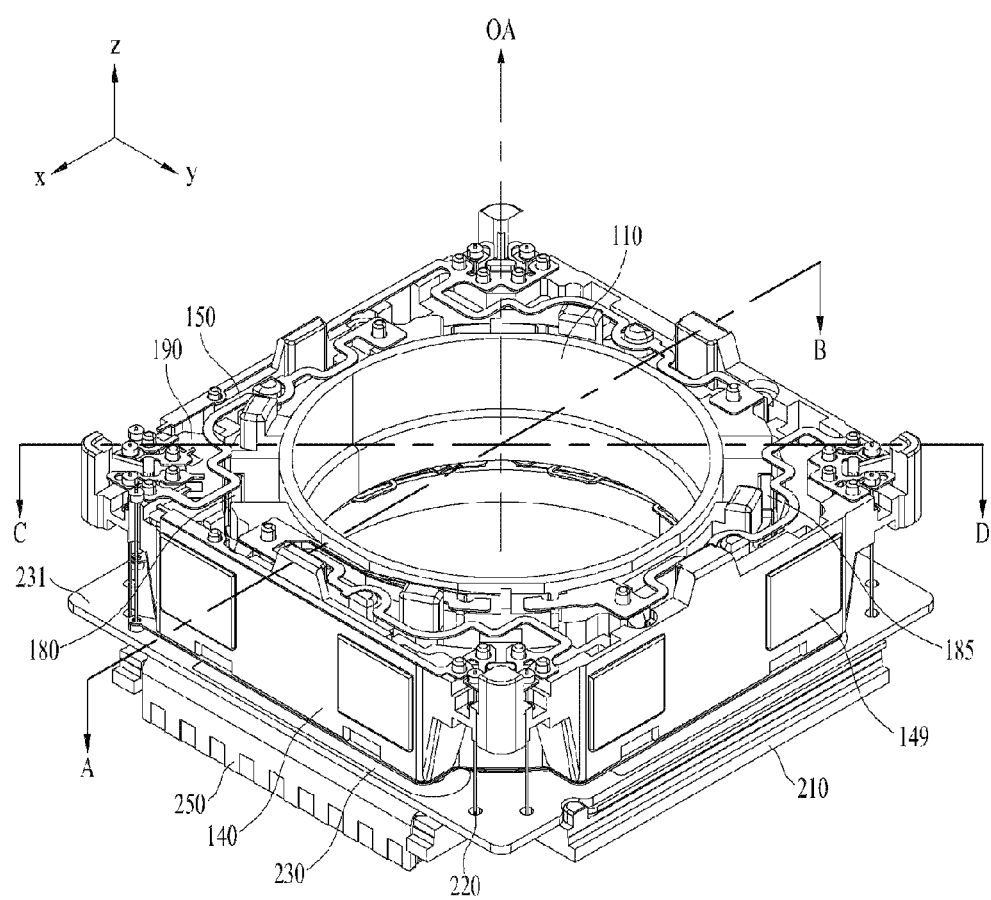
FIG. 9 is an assembled perspective view of the lens moving apparatus from which the cover member shown in FIG. 8 is removed.

FIG. 8 is an exploded perspective view of an embodiment of the lens moving apparatus 100. FIG. 9 is an assembled perspective view of the lens moving apparatus 100 from which the cover member 300 shown in FIG. 8 is removed. For example, the lens moving apparatus 100 shown in FIG. 8 may be an embodiment of the lens moving apparatus shown in FIG. 2.

Referring to FIGS. 8 and 9, the lens moving apparatus 100 may include a bobbin 110, a first coil 120, a first magnet 130, a housing 140, an upper elastic member 150, a lower elastic member 160 and a second coil 230.

The lens moving apparatus 100 may further include a first position sensor 170 and a second magnet 180 for AF feedback operation.

In addition, the lens moving apparatus 100 may further include second position sensors 240 (240a and 240b) for OIS (Optical Image Stabilizer) feedback operation.

Furthermore, the lens moving apparatus 100 may further include at least one of a third magnet 185, a circuit board 190, a support member 220, a circuit board 250, a base 210 and a cover member 300.

Hereinafter, the term "coil" may be interchangeably used with "coil unit", and the term "elastic member" may be interchangeably used with "elastic unit" or "spring".

First, the bobbin 110 will be described.

The bobbin 110 may be disposed in the housing 140 and may be moved in the direction of the optical axis OA or in the first direction (for example, in the z-axis direction) by the electromagnetic interaction between the first coil 120 and the first magnet 130.

Figure 10:
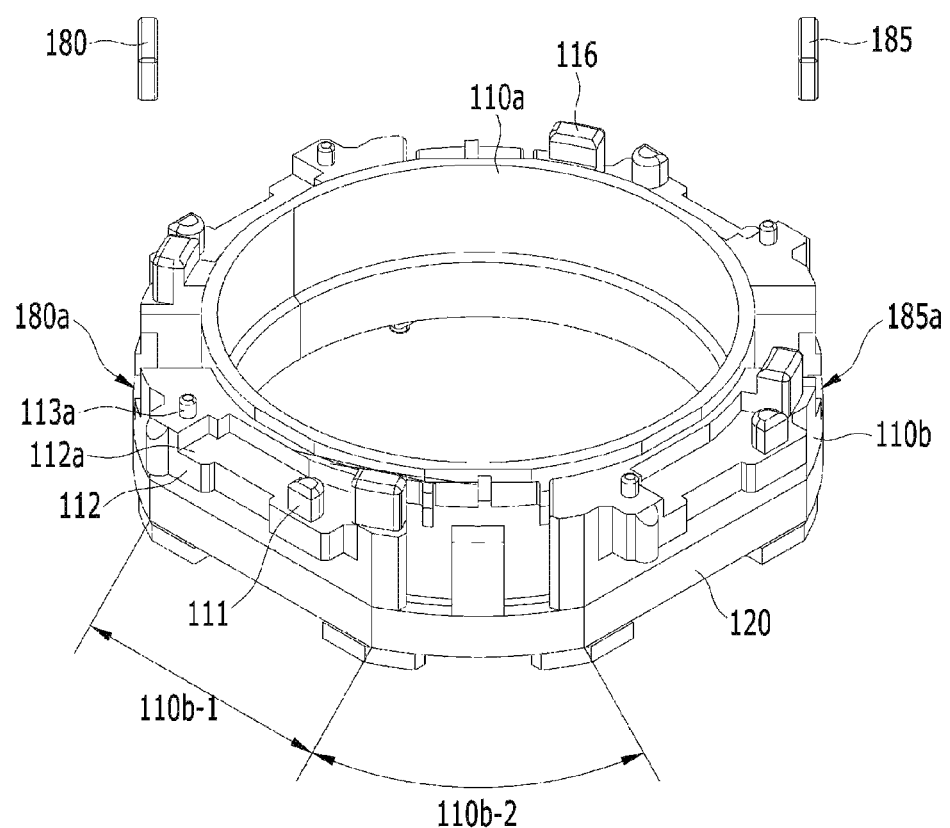
FIG. 10 is a perspective view illustrating the bobbin, the first coil, the second magnet and the third magnet shown in FIG. 8.

FIG. 10 is a perspective view illustrating the bobbin 110, the first coil 120, the second magnet 180, and the third magnet 185 shown in FIG. 8.

Referring to FIG. 10, the bobbin 110 may have a bore or a cavity in which the lens or the lens barrel is mounted. For example, the bore in the bobbin 110 may be a through hole, which is formed through the bobbin 110 in the optical-axis direction. Although the bore in the bobbin 110 may have a circular shape, an elliptical shape or a polygonal shape, the disclosure is not limited thereto.

The lens may be directly mounted in the bore in the bobbin 110, without being limited thereto. In another embodiment, the lens barrel to which at least one lens is mounted or coupled may be coupled or mounted in the bore in the bobbin 110. The lens or the lens barrel may be coupled to the inner circumferential surface 110a of the bobbin 110 in various ways.

The bobbin 110 may include first side portions 110b-1, which are spaced apart from each other, and second side portions 110b-2, which are spaced apart from each other. Each of the second side portions 110-2 may connect two adjacent first side portions to each other. For example, the length of each of the first side portions 110b-1 of the bobbin 110 in a horizontal direction or in a transverse direction may be different from the length of each of the second side portions 110b-2 in a horizontal direction or in a transverse direction, without being limited thereto.

Furthermore, the bobbin 110 may be provided on the outer surface thereof with a projection 112, which projects in the second direction and/or in the third direction. The projection 112 of the bobbin 110 may serve to prevent the bobbin 110 from directly colliding with the housing 140 even when the bobbin 110 is moved beyond a prescribed range due to an external impact or the like during movement of the bobbin 110 in the optical-axis direction for autofocusing. Furthermore, the projection 112 of the bobbin 110 may serve as a stopper in conjunction with a groove portion 146 in the housing 140.

The bobbin 110 may be provided in the upper surface thereof with a first escape groove 112a for avoiding interference with a first frame connector 153 of the upper elastic member 150. For example, the first escape groove 112a may be formed in the first side portion 110b-1 of the bobbin 110, without being limited thereto.

The bobbin 110 may be provided on the upper surface thereof with a guide portion 111 for guiding the mounting position of the upper elastic member 150. For example, the guide portion 111 of the bobbin 110 may project from the upper surface of the bobbin 110 in the first direction (for example, in the z-axis direction) so as to guide the path along which the frame connector 153 of the upper elastic member 150 is moved, as illustrated in FIG. 10. For example, the guide portion 111 may be disposed in the escape groove 112a.

The bobbin 110 may include a first coupler 113a or an upper support protrusion, which is coupled and secured to the upper elastic member 150. Although the first coupler 113a of the bobbin 110 may have a protrusion shape, the disclosure is not limited thereto. In another embodiment, the first coupler 113a may be a groove or a flat surface.

The bobbin 110 may include a second coupler (not shown), which is coupled and secured and secured to the lower elastic member 160. Although the second coupler may have a protrusion shape, the disclosure is not limited thereto. In another embodiment, the second coupler of the bobbin 110 may be a groove or a flat surface.

The bobbin 110 may include a stopper 116, which projects from the upper surface thereof upwards.

The stopper 116 of the bobbin 110 may serve to prevent the upper surface of the bobbin 110 from directly colliding with the inner side of the upper plate of the cover member 300 even when the bobbin 110 is moved beyond a prescribed range due to an external impact or the like during movement of the bobbin 110 in the first direction for autofocusing.

The bobbin 110 may be provided in the outer surface thereof with a coil-seating groove, in which the first coil 120 is seated, fitted or disposed. The coil-seating groove may have a groove structure depressed from the outer surface 110b of the first and second side portions 110b-1 and 110b-2, and may have a shape that coincides with the shape of the first coil 120, for example a closed curve shape (for example, a ring shape).

The bobbin 110 may have a second magnet-seating groove 180a formed in the outer surface 110b, in which the second magnet 180 is seated, fitted, secured or disposed.

The second magnet-seating groove 180a in the bobbin 110 may be depressed from the outer surface 110b of the bobbin 110, and may have an opening, which is formed in the upper surface of the bobbin 110, without being limited thereto.

The second magnet-seating groove 180a in the bobbin 110 may be positioned above the coil-seating groove, in which the first coil 120 is disposed, and may be spaced apart from the coil-seating groove, without being limited thereto.

Furthermore, the bobbin 110 may have a third magnet-seating groove 185a formed in the upper surface thereof, in which the third magnet 185 is seated, fitted, secured, or disposed.

The third magnet-seating groove 185a may be depressed from the outer surface 110b of the bobbin 110, and may have an opening that is formed in the upper surface of the bobbin 110, without being limited thereto.

The third magnet-seating groove 185a in the bobbin 110 may be positioned above the coil-seating groove, in which the first coil 120 is disposed, and may be spaced apart from the coil-seating groove, without being limited thereto.

The second magnet-seating groove 180a may be formed in one of the second side portions 110b-2 of the bobbin 110, and the third magnet-seating groove 185a may be formed in another of the second side portions 110b-2 of the bobbin 110.

The third magnet-seating groove 185a may be positioned so as to face the second magnet-seating groove 180a. For example, the second and third magnet-seating grooves 180a and 185a may be formed in two second side portions of the bobbin 110 that face each other.

Since the second magnet 180 and the third magnet 185 are disposed or arranged at the bobbin in a balanced state with respect to the first position sensor 170, weight equilibrium between the second magnet 180 and the third magnet 185 may be established, and the influence of the magnetic force of the first magnet 130 and the second magnet 180 on the first coil 120 may cancel each other, thereby improving the accuracy of an AF (Autofocusing) operation.

Next, the first coil 120 will be described.

The first coil 120 may be disposed on the outer surface 110b of the bobbin 110.

Although the first coil 120 may be disposed under the second and third magnets 180 and 185, the disclosure is not limited thereto. For example, although the first coil 120 may be disposed under the projection 112 of the bobbin 110, the disclosure is not limited thereto.

For example, although the first coil 120 may not overlap the second and third magnets 180 and 185 in the second or third direction, the disclosure is not limited thereto.

For example, the first coil 130 may be disposed in the coil-seating groove, the second magnet 180 may be fitted or disposed in the second magnet-seating groove 180a, and the third magnet 185 may be fitted or disposed in the third magnet-seating groove 185a.

Although each of the second magnet 180 and the third magnet 185, which are disposed at the bobbin 110, may be spaced apart from the first coil 120, the disclosure is not limited thereto. In another embodiment, each of the second magnet 180 and the third magnet 185, which are disposed at the bobbin 110, may be in contact with the first coil 120, or may overlap the first coil 120 in the second or third direction.

The first coil 120 may have a closed curve shape, for example a ring shape, which surrounds the outer surface 110b of the bobbin 110 in a direction of rotation about the optical axis OA.

Although the first coil 120 may be directly wound around the outer surface 110b of the bobbin 110, the disclosure is not limited thereto. In another embodiment, the first coil 120 may be embodied as a coil ring, which is wound around the bobbin 110, or may be embodied as a coil block having an angled ring shape.

Power or a drive signal may be provided to the first coil 120. The power or the drive signal, which is provided to the first coil 120, may be a DC signal, an AC signal or a combined DC and AC signal, and may be a voltage-type signal or a current-type signal.

When power or a drive signal (for example, drive current) is supplied to the first coil 120, an electromagnetic force may be created by the electromagnetic interaction between the first coil 120 and the first magnet 130, and thus the bobbin 110 may be moved in the direction of the optical axis OA by the created electromagnetic force.

At the initial position of the AF operation unit, the first coil 120 may be disposed so as to correspond to or overlap the first magnet 130 disposed at the housing 140 in a direction parallel to a line which is perpendicular to the optical axis OA and extends through the optical axis.

For example, the AF operation unit may include the bobbin 110 and the components (for example, the first coil 120, the second magnet 180 and the third magnet 185) coupled to the bobbin 110.

The initial position of the AF operation unit may be the initial position of the AF operation unit in the state in which power is not applied to the first coil 1120, or may be the position of the AF operation unit when the upper and lower elastic members 150 and 160 are elastically deformed only by the weight of the AF operation unit.

Furthermore, the initial position of the bobbin 110 may be the position of the AF operation unit when gravity is applied toward the base 210 from the bobbin 110 or toward the bobbin 110 from the base 210.

Next, the second magnet 180 and the third magnet 185 will be described.

The second magnet 180 may be referred to as a sensing magnet because the second magnet 180 provides a magnetic field, which is detected by the first position sensor 170, and the third magnet 185 may be referred to as a balancing magnet, which cancels out the influence from a magnetic field of the sensing magnet 180 and establishes weight equilibrium with respect to the sensing magnet 180.

The second magnet 180 may be disposed in the second magnet-seating groove 180a in the bobbin 110, and a portion of one of the surfaces of the second magnet 180 that faces the first position sensor 170 may be exposed through the second magnet-seating groove 180a.

For example, each of the second and third magnets 180 and 185 disposed at the bobbin 110 may be configured such that the boundary plane between the N pole and the S pole is parallel to a direction perpendicular to the optical axis OA. For example, each of the surfaces of the second and third magnets 180 and 185 that face the first position sensor 170 may be divided into the N pole and the S pole, without being limited thereto.

In another embodiment, for example, each of the second and third magnets 180 and 185 disposed at the bobbin 110 may be configured such that the boundary plane between the N pole and the S pole is parallel to the optical axis OA.

Although each of the second and third magnets 180 and 185 may be a monopolar magnetized magnet including a single N pole and a single S pole, the disclosure is not limited thereto.

In another embodiment, each of the second and third magnets 180 and 185 may be a bipolar magnetized magnet including two N poles and two S poles, or may be a tetrapolar magnetized magnet.

The second magnet 180 may be moved together with the bobbin 110 in the optical-axis direction, and the first position sensor 170 may detect the intensity of a magnetic field or the magnetic force of the second magnet 180, which is moved in the optical-axis direction and may output an output signal (for example, an output voltage) corresponding to the result of the detection.

For example, the intensity of the magnetic field detected by the first position sensor 170 may vary according to displacement of the bobbin 110 in the optical-axis direction, and the first position sensor 170 may output an output signal proportional to the intensity of the magnetic field detected by the first position sensor 170. The controllers 830 and 780 of the camera module or an optical device, which will be described later, may detect the displacement of the bobbin 110 in the optical-axis direction using the output signal from the first position sensor 170, and may control the drive signal provided to the first coil 120 based on the detected displacement of the bobbin 110, thereby performing an AF feedback operation.

The third magnet 185 may be disposed at the second side portion that is positioned opposite the second side portion of the bobbin 110 at which the second magnet 180 is disposed, so as to face the second magnet 180. By virtue of the orientation of the second and third magnets 180 and 185, the magnetic field of the third magnet 185 may counteract the magnetic field of the second magnet 180, which has an influence on the interaction between the first magnet 130 and the first coil 120 and may thus reduce or eliminate the influence of the magnetic field of the second magnet 180 on an AF operation, thereby making it possible for the embodiment to improve the accuracy of the AF operation.

Next, the housing 140 will be described.

The housing 140 may accommodate the bobbin 110 therein and may support the first magnet 130 and the circuit board 190 at which the first position sensor 170 is disposed.

Figure 11:
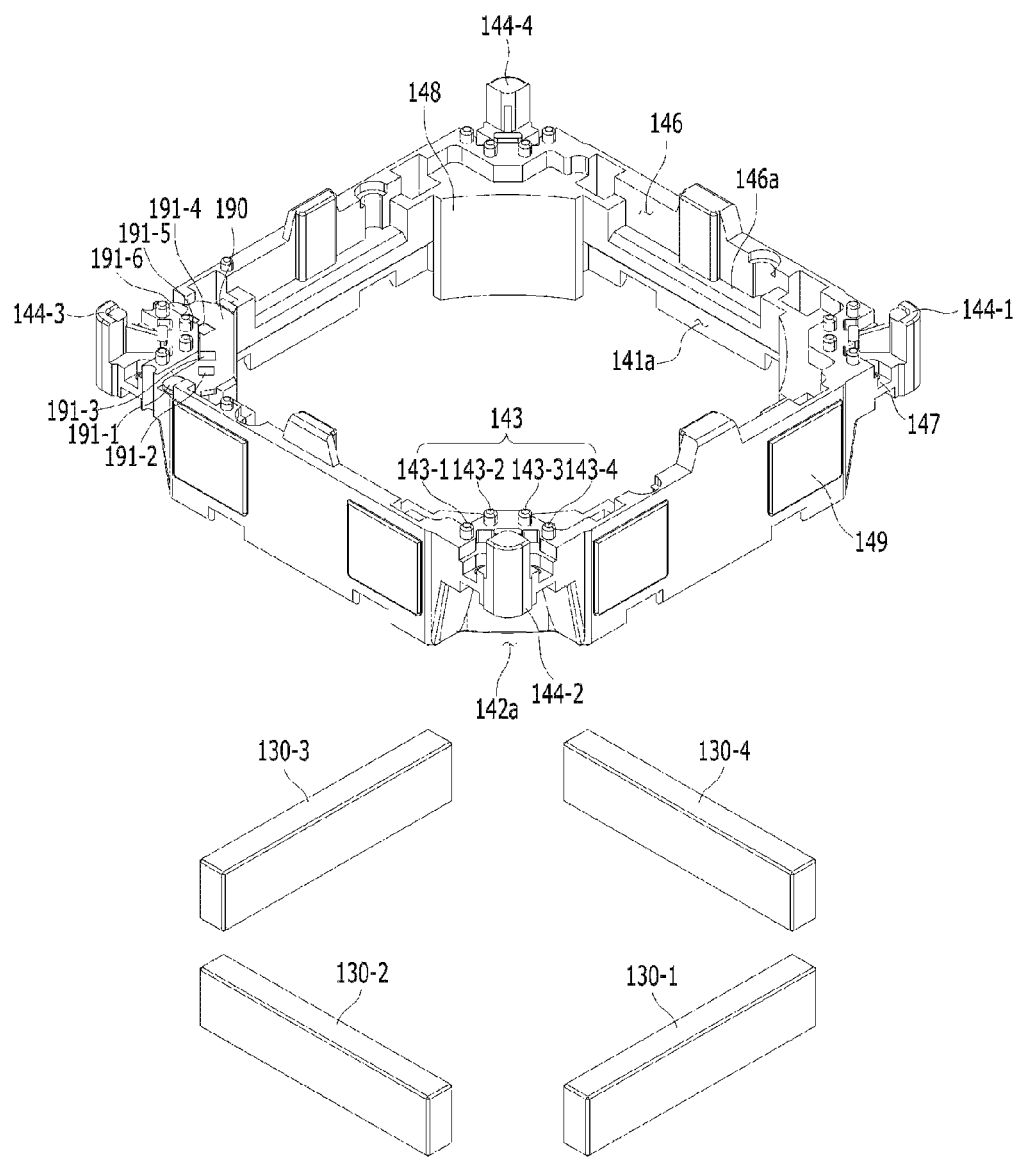
FIG. 11 is a perspective view illustrating the housing and the first magnet shown in FIG. 8.
Figure 12:
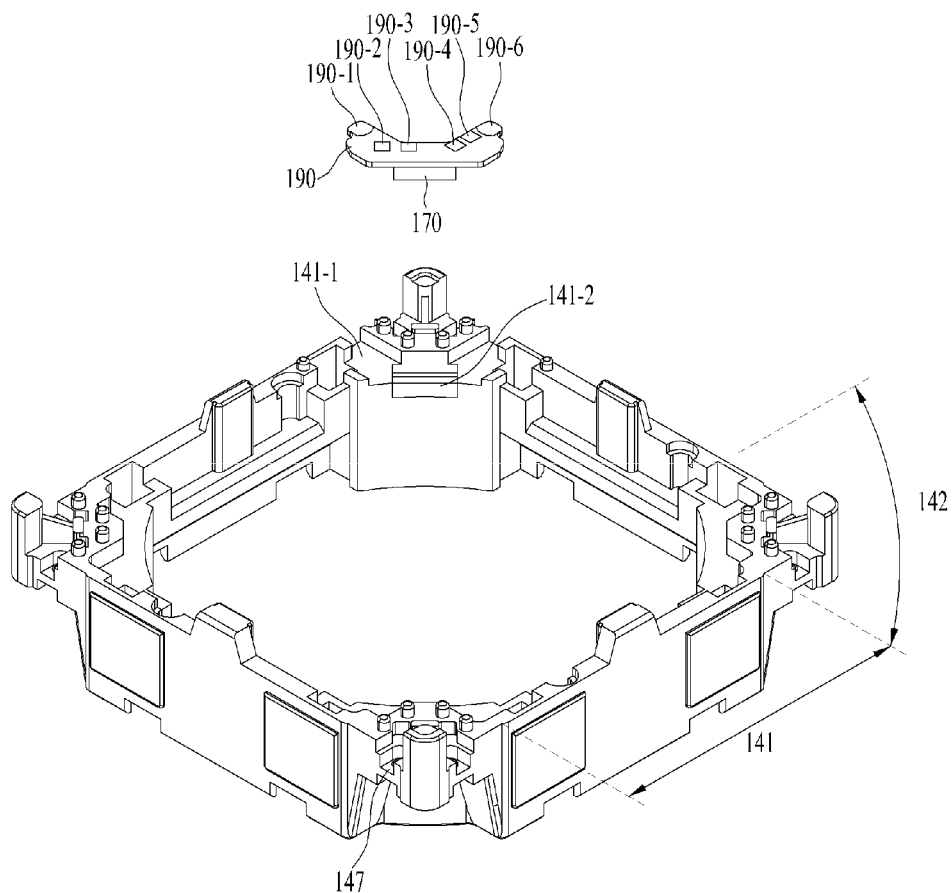
FIG. 12 is an exploded perspective view illustrating the housing, the first position sensor and the circuit board shown in FIG. 8.

FIG. 11 is a perspective view illustrating the housing 140 and the first magnet 130 shown in FIG. 8. FIG. 12 is an exploded perspective view illustrating the housing 140, the first position sensor 170, and the circuit board 190 shown in FIG. 8.

Referring to FIGS. 11 and 12, the housing 140 may have a hollow column shape overall. For example, the housing 140 may have a polygonal (for example, quadrilateral or octagonal) or circular bore or cavity. The bore in the housing 140 may be a through hole, which is formed through the housing 140 in the optical-axis direction.

The housing 140 may include a plurality of side portions 141 and 142. For example, the housing 140 may include first side portions 141, which are spaced apart from each other, and second side portions 142, which are spaced apart from each other.

Each of the first side portions 141 of the housing 140 may be disposed or positioned between two adjacent second side portions 142 so as to connect the two adjacent second side portions to each other, and may have a flat surface having a predetermined depth.

For example, the first side portions 141 of the housing 140 may be simply referred to as side portions, and the second side portions 142 of the housing 140 may be positioned at the corners of the housing 140 and may thus be alternatively referred to as corners or corner portions.

For example, the number of first side portions 141 of the housing 140 is four, and the number of second side portions 142 is four, without being limited thereto.

Although the horizontal length of each of the first side portions 141 of the housing 140 may be greater than the horizontal length of each of the second side portions 142, the disclosure is not limited thereto.

Each of the first side portions of the housing 140 may be disposed parallel to a corresponding one of the side plates of the cover member 300.

For example, the first side portions 141 of the housing 140 may correspond to the first side portions 110b-1 of the bobbin 110, and the second side portions 142 of the housing 140 may correspond to or face the second side portions 110b-2 of the bobbin 110.

The first magnet 130 may be disposed or mounted on the first side portions 141 of the housing 140. Each of the second side portions 142 of the housing 140 may be disposed between two adjacent first side portions 141 so as to connect the two adjacent first side portions to each other.

The housing 140 may have a seating groove 146, which is formed at a location corresponding to the projection 112 of the bobbin 110.

For example, when the initial position of the bobbin 110 is set to the state in which the lower surface of the projection 111 of the bobbin 110 is in contact with the bottom surface 146a of the seating groove 146 in the housing 140, the autofocusing function may be controlled in a single direction (for example, in the positive z-axis direction from the initial position).

Alternatively, when the initial position is set to the state in which the lower surface of the projection 111 of the bobbin is spaced apart from the bottom surface 146a of the seating groove 146 in the housing 140 by a predetermined distance, the autofocusing function may be controlled in both directions (for example, in the positive z-axis direction and in the negative z-axis direction from the initial position).

The housing 140 may include a first-magnet-seating portion 141a for receiving the first magnet 130, a seating groove 141-1 for receiving the circuit board 190 and a first-position-sensor-seating groove 141-2 for receiving the first position sensor 170.

The first-magnet-seating portion 141a may be formed in the inner and lower end of at least one of the first side portions 141 of the housing 140. For example, the first-magnet-seating portion 141a may be formed in the inner and lower end of each of the four first side portions 141, and each of the first magnets 130-1 to 130-4 may be fitted or secured into a corresponding one of the first-magnet-seating portions.

The first-magnet-seating portion 141a in the housing 140 may be configured to have a recess having a size corresponding to the size of the first magnet 130. The bottom surface of the first-magnet-seating portion 141a of the housing 140 that faces the second coil 230 may have an opening formed therein, and the bottom surface of the first magnet 130 secured to the first-magnet-seating portion 141a may face the second coil 230 in the optical-axis direction.

The seating groove 141-1 may be formed in the upper portion or end of one of the second side portions 142 of the housing 140. For easy mounting of the circuit board 190, the seating groove 141-1 may have a groove structure, which is open at the upper portion thereof and has a lateral surface and a bottom, and may have an opening formed in the inner surface of the housing 140. The bottom of the seating groove 141-1 may have a shape that corresponds to or coincides with the shape of the circuit board 190.

The first-position-sensor-seating groove 141-2 may be formed in the bottom of the seating groove 141-1 and may have a structure that is depressed from the bottom of the seating groove 141-1, without being limited thereto.

For easy mounting of the first position sensor 170, the first-sensor-seating groove 141-2 may have a groove shape, which is open at the upper portion thereof and has a side surface and a bottom, and may have an opening formed in the inner surface of the second side portion 142 of the housing 140. The first-position-sensor-seating groove 141-2 may have a shape that corresponds to or coincides with the shape of the first position sensor 170.

Each of the first magnet 130 and the circuit board 190 may be secured to a corresponding one of the first-magnet-seating portion 141a and the seating groove 141-1 via an adhesive member, for example, epoxy or double-sided adhesive tape. The first position sensor 170 may be secured to the first-position-sensor-seating portion 141-2 via an adhesive member.

Each of the first side portions of the housing 140 may be disposed parallel to a corresponding one of the side plates of the cover member 300. The surface area of each of the first side portions 141 of the housing 140 may be larger than the surface area of each of the second side portions 142.

Each of the second side portions 142 of the housing 140 may have a through hole 147, which defines a path through which the support member 220 extends. For example, the housing 140 may have through holes 147 formed through the upper portions of the second side portions 142.

In another embodiment, each of the through holes formed in the second side portions may have a structure depressed from the outer surface of the second side portion 142 of the housing 140, and at least a portion of the through hole may be open at the outer surface of the second side portion 142.

The number of through holes 147 in the housing 140 may be the same as the number of support members. First ends of the support members 220 may extend through the through holes 147, and may be connected or bonded to the upper elastic member 150.

In order to prevent the housing 140 from directly colliding with the inner surface of the upper end of the cover member 300 shown in FIG. 8, the housing 140 may be provided on the upper end thereof with stoppers 144-1 to 144-4.

For example, the second side portions 142 of the housing 140 may be respectively provided on the upper surfaces thereof with the stoppers 144-1 to 144-4.

The housing 140 may include at least one upper support protrusion 143, which is coupled to the outer frame 152 of the upper elastic member 150.

The upper support protrusion 143 of the housing 140 may be formed on the upper surface of at least one of the first side portions 141 and the second side portions 142 of the housing 140. For example, although the upper support protrusion 143 of the housing 140 may be provided on the upper surface of the second side portion of the housing 140, the disclosure is not limited thereto.

The housing 140 may be provided on the lower surface thereof with a lower support protrusion (not shown), which is coupled and secured to the outer frame 162 of the lower elastic member 160.

In order to provide a space that not only defines a path through which the support member 220 extends but also receives gel-type silicone capable of serving as a damper, the housing 140 may have recesses 142a formed in the lower portion or the end of the second side portions 142.

In order to diminish vibration of the support member 220, at least one of the through hole 147 and the recess 142a in the housing 140 may be filled with a damping member, for example silicone.

The housing 140 may include at least one stopper 149 projecting from the outer surface of the first side portion 141. The at least one stopper 149 may prevent the housing 140 from colliding with the side plate of the cover member 300 when the housing 140 is moved in the second direction and/or in the third direction.

In order to prevent the lower surface of the housing 140 from colliding with the base 210 and/or the circuit board 250, the housing 140 may further include a stopper projecting from the lower surface thereof.

At the initial position of the AF operation unit, the first magnets 130-1 to 130-4 may be disposed at the housing 140 so as to partially overlap the first coil 120 in a direction parallel to a straight line, which is perpendicular to the optical axis OA and extends through the optical axis.

For example, each of the first magnets 130-1 to 130-4 may be fitted or disposed in the seating portion 141a in a corresponding one of the first side portions 141 of the housing 140.

In another embodiment, the first magnets 130-1 to 130-4 may be disposed on the outer surfaces of the first side portions 141 of the housing 140 or on the inner or outer surfaces of the second side portions 142 of the housing 140.

Although each of the first magnets 130-1 to 130-4 may have a quadrilateral parallelepiped shape corresponding to the side portion 141 of the housing 140, the disclosure is not limited thereto. In another embodiment, one surface of the first magnet that faces a corresponding surface of the first coil 120 may have a curvature corresponding to or coinciding with the curvature of the corresponding surface of the first coil 120.

Each of the first magnets 130 may be composed of a single body and may be configured such that the surface thereof that faces the first coil becomes the S pole and the opposite surface becomes the N pole. However, the disclosure is not limited thereto, and the first magnet 130 may be configured such that the surface thereof that faces the first coil 120 becomes the N pole and the opposite surface becomes the S pole.

The first magnets 130-1 to 130-4 may be disposed and mounted on the first side portions of the housing 140 such that two or more of the first magnets face each other.

For example, two pairs of first magnets 130-1 to 130-4 may be disposed at the first side portions 141 of the housing 140 such that the first magnets in each pair face each other. Here, each of the first magnets 130-1 to 130-4 may have an approximately quadrilateral shape or may have a triangular shape or a diamond shape in plan view.

In another embodiment, only one pair of first magnets may be disposed at two first side portions of the housing 140 that face each other.

Figure 14:
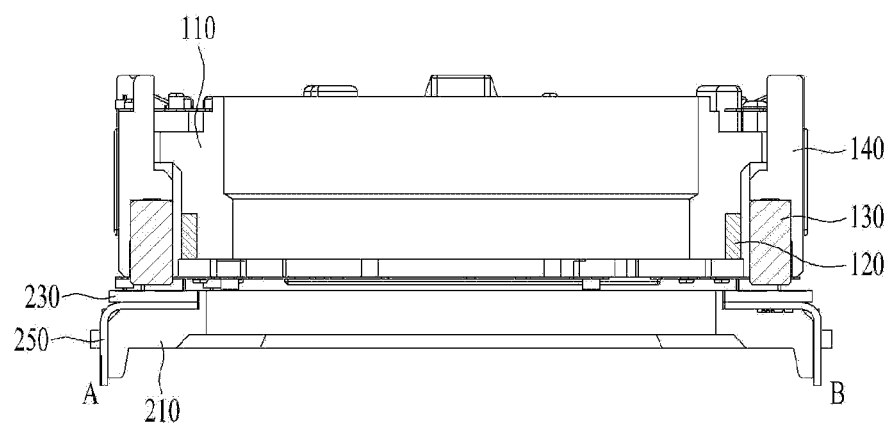
FIG. 14 is a cross-sectional view of the lens moving apparatus taken along line A-B in FIG. 9.
Figure 15:
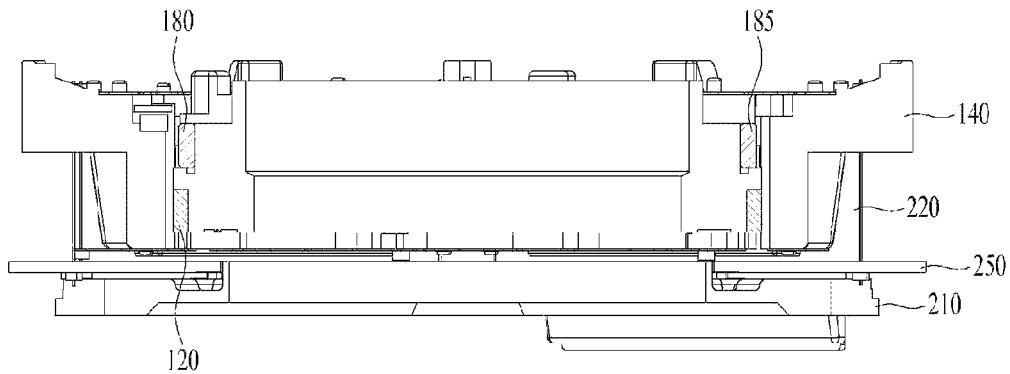
FIG. 15 is a cross-sectional view of the lens moving apparatus taken along line C-D in FIG. 9.

FIG. 14 is a cross-sectional view of the lens moving apparatus 100 taken along line A-B in FIG. 9. FIG. 15 is a cross-sectional view of the lens moving apparatus 100 taken along line C-D in FIG. 9.

Referring to FIGS. 14 and 15, each of the second and third magnets 180 and 185 may not overlap the first coil 120 in a direction parallel to a line that is perpendicular to the optical axis OA and extends through the optical axis, without being limited thereto.

At the initial position of the AF operation unit, the second magnet 180 may overlap or be aligned with the third magnet 185 in a direction parallel to a line that is perpendicular to the optical axis OA and extends through the optical axis.

At the initial position of the AF operation unit, the first position sensor 170 may overlap each of the second and third magnets 180 and 185 in a direction parallel to a line that is perpendicular to the optical axis OA and extends through the optical axis, without being limited thereto. In another embodiment, the first position sensor 170 may not overlap at least one of the second and third magnets 180 and 185 in a direction parallel to a line that is perpendicular to the optical axis OA and extends through the optical axis.

Next, the first position sensor 170 and the circuit board 190 will be described.

Figure 13A:
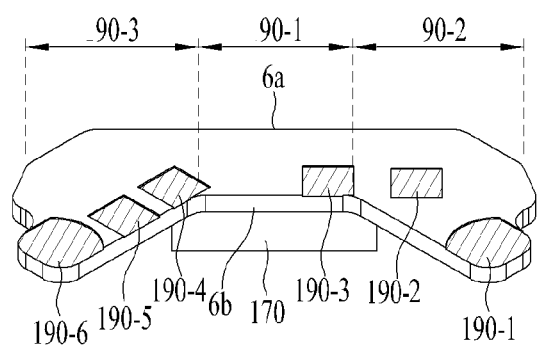
FIG. 13A is an enlarged view illustrating the circuit board and the first position sensor shown in FIG. 12.
Figure 13B:
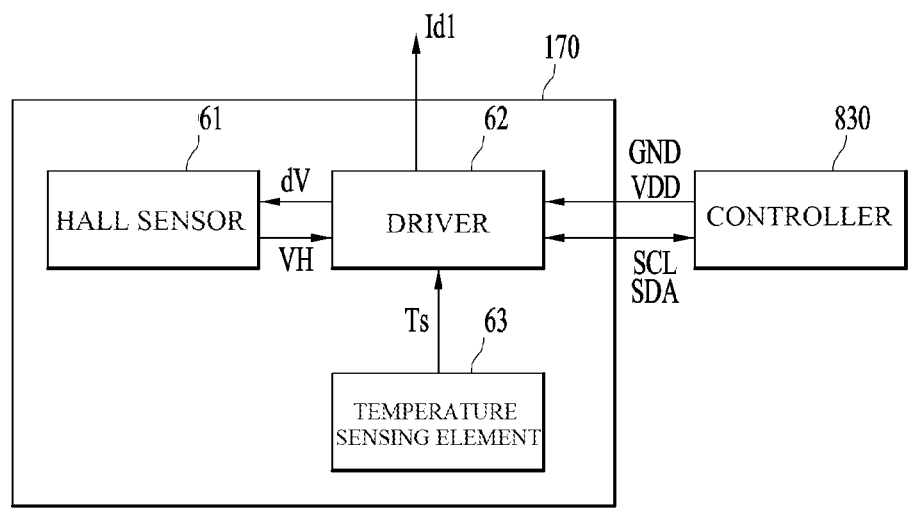
FIG. 13B is a block diagram of the first position sensor shown in FIG. 13A.

FIG. 13A is an enlarged view illustrating the circuit board 190 and the first position sensor 170 shown in FIG. 12. FIG. 13B is a block diagram of the first position sensor 170 shown in FIG. 13A.

Referring to FIGS. 13A and 13B, the circuit board 190 may be disposed at one of the side portions of the housing 140. For example, the circuit board 190 may be disposed at one of the second side portions 142 of the housing 140.

The first position sensor 170 may be disposed or mounted on the circuit board 190 disposed at the housing 140, and may be secured to the housing 140. For example, the circuit board 190 may be disposed in the seating groove 14a in the housing 140. For example, the first position sensor 170 may be moved together with the housing 140 during a handshake correction operation.

The first position sensor 170 may detect the intensity of the magnetic field of the second magnet 180 mounted on the bobbin 110 while the bobbin 110 is moved, and may output an output signal corresponding to the result of the detection.

In the embodiment shown in FIG. 8, although the first position sensor 170 may detect the intensity of the magnetic field of the second magnet 180 and may thus detect the displacement of the bobbin 110, the disclosure is not limited thereto. In another embodiment, the second and third magnets may be omitted, and the first position sensor 170 may output an output signal corresponding to the result of the detection of the intensity of the magnetic field of the first magnet, and may detect or control the displacement of the bobbin 110 using the output signal.

Although the first position sensor 170 may be disposed at the lower surface of the circuit board 190, the disclosure is not limited thereto. In another embodiment, the first position sensor 170 may be disposed at any of various positions.

Here, the lower surface of the circuit board 190 may be the surface of the circuit board 190 that faces the upper surface of the housing 140 or comes into contact with the seating groove 141-1 in the housing 140.

Referring to FIG. 13B, the first position sensor 170 may include a hall sensor 61 and a driver 62.

For example, the hall sensor 61 may be made of a silicon-based material. The output VH of the hall sensor 61 may increase as the ambient temperature increases.

In another embodiment, the hall sensor 61 may be made of GsAs, and the output VH of the hall sensor 61 may have a gradient of –0.06%/° C. according to an ambient temperature.

The first position sensor 170 may further include a temperature-sensing element 63 capable of detecting an ambient temperature. The temperature-sensing element 63 may output a temperature-sensing signal Ts according to the ambient temperature detected in the vicinity of the first position sensor 170 to the driver 62.

For example, the hall sensor 61 of the first position sensor 190 may generate the output VH according to the detected intensity of the magnetic force of the second magnet 180. For example, the level of the output of the first position sensor 190 may be proportional to the intensity of the magnetic force of the second magnet 180.

The driver 62 may output a drive signal dV for driving the hall sensor 61 and a drive signal Id1 for driving the first coil 120.

For example, the driver 62 may receive a clock signal SCL, a data signal SDA, and power signals VDD and GND via data communication using a protocol such as I2C communication.

The driver 62 may create the drive signal dV for driving the hall sensor 61 and the drive signal Id1 for driving the first coil 120 using the clock signal SCL and the power signals VDD and GND.

Here, the first power signal GND may be a ground voltage or 0V, and the second power signal VDD may be a predetermined voltage for driving the driver 62, and may be DC voltage and/or AC voltage, without being limited thereto.

The driver 62 may receive the output VH from the hall sensor 61, and may send the clock signal SCL and the data signal SDA, pertaining to the output VH of the hall sensor 61 via data communication using a protocol such as I2C communication, to the controllers 830 and 780.

Furthermore, the driver 62 may receive the temperature-sensing signal Ts detected by the temperature-sensing element 63, and may send the temperature-sensing signal Ts to the controller 830 via data communication using a protocol such as I2C communication.

The controller 830 may perform temperature compensation for the output VH from the hall sensor 61 based on variation in the ambient temperature detected by the temperature-sensing element 63 of the first position sensor 170.

For example, when the drive signal dV or a bias signal of the hall sensor 61 is 1 mA, the output VH of the hall sensor 61 of the first position sensor 170 may range from −20 mV to +20 mV.

In the case of temperature compensation for the output VH of the hall sensor 61, having a negative gradient with respect to variation in ambient temperature, the output VH of the hall sensor 61 of the first position sensor 170 may range from 0 mV to +30 mV.

When the output of the hall sensor 61 of the first position sensor 170 is plotted on an x-y coordinate system, the reason why the output range of the hall sensor 61 of the first position sensor 170 is represented in the first quadrant (for example, 0 mV to +30 mV) is as follows.

Because the output of the hall sensor 61 in the first quadrant of the x-y coordinate system and the output of the hall sensor 61 in the third quadrant of the x-y coordinate system move in opposite directions depending on variation in ambient temperature, the accuracy and reliability of the hall sensor may be decreased when both the first and third quadrant are used as an AF operation control zone. Accordingly, in order to accurately compensate for variation in ambient temperature, a specific range in the first quadrant may be considered to be the output range of the hall sensor 61 of the first position sensor 170.

The first position sensor 170 may include four terminals for sending and receiving the clock signal SCL, the data signal SDA and the power signals VDD and GND and two terminals for providing a drive signal to the first coil 120.

For example, the first position sensor 170 may include the first to third terminals for the clock signal SCL and the two power signals VDD and GND, the fourth terminal for the data SDA, and the fifth and sixth terminals for providing drive signals to the first coil 120.

Each of the first to sixth terminals of the first position sensor 170 may be conductively connected to a corresponding one of the terminals or pads 190-1 to 190-6 of the circuit board 190.

The circuit board 190 may include the first to sixth terminals, provided on the upper surface thereof, and a circuit pattern or wiring (not shown).

Referring to FIG. 13A, the circuit board 190 may include a body portion 90-1, a first bent portion 90-2 which is bent at one end of the body portion 90-1, and a second bent portion 90-3 which is bent at the other end of the body portion 90-1.

For example, the first and second bent portions 90-2 and 90-3 may be bent in the same direction with respect to the body portion 90-1.

For example, the circuit board 190 disposed at the housing 140 may include a first lateral surface 6a which faces the optical axis OA and a second lateral surface 6b positioned opposite the first lateral surface 6a. The first lateral surface 6a of the circuit board 190 may have a flat shape, and the second lateral surface 6b of the circuit board 190 may have a bent shape.

In FIG. 13A, although the circuit board 190 is bent at two ends thereof so as to allow easy bonding to the upper elastic member, the disclosure is not limited thereto. In another embodiment, the circuit board 190 may not have the bent shape, and may have a linear shape.

Although the first to sixth terminals 190-1 to 190-6 may be disposed on the upper surface of the circuit board 190 in the state in which the terminals are spaced apart from each other so as to allow easy conductive connection to the upper elastic member 150, the disclosure is not limited thereto.

The circuit pattern or wiring (not shown) of the circuit board 190 may conductively connect the first to sixth terminals 190-1 to 190-6 to the first to sixth terminals of the first position sensor 170, and may be provided on at least one of the upper and lower surfaces of the circuit board 190.

For example, the circuit board 190 may be a printed circuit board or a flexible PCB (FPCB).

In another embodiment, the first position sensor 170 may be disposed on the upper surface of the circuit board 190, and the terminals 190-1 to 190-6 may be provided on the lower surface of the circuit board 190.

The first to sixth terminals 190-1 to 190-6 of the circuit board 190 may be conductively connected to the terminals of the circuit board 250 via the upper elastic member 150 and the support member 220, and the first position sensor 170 may thus be conductively connected to the circuit board 250.

In another embodiment, the first position sensor 170 may be embodied as only a single position-detecting sensor, such as a hall sensor.

Next, the upper elastic member 150, the lower elastic member 160 and the support member 220 will be described.

Figure 16A:
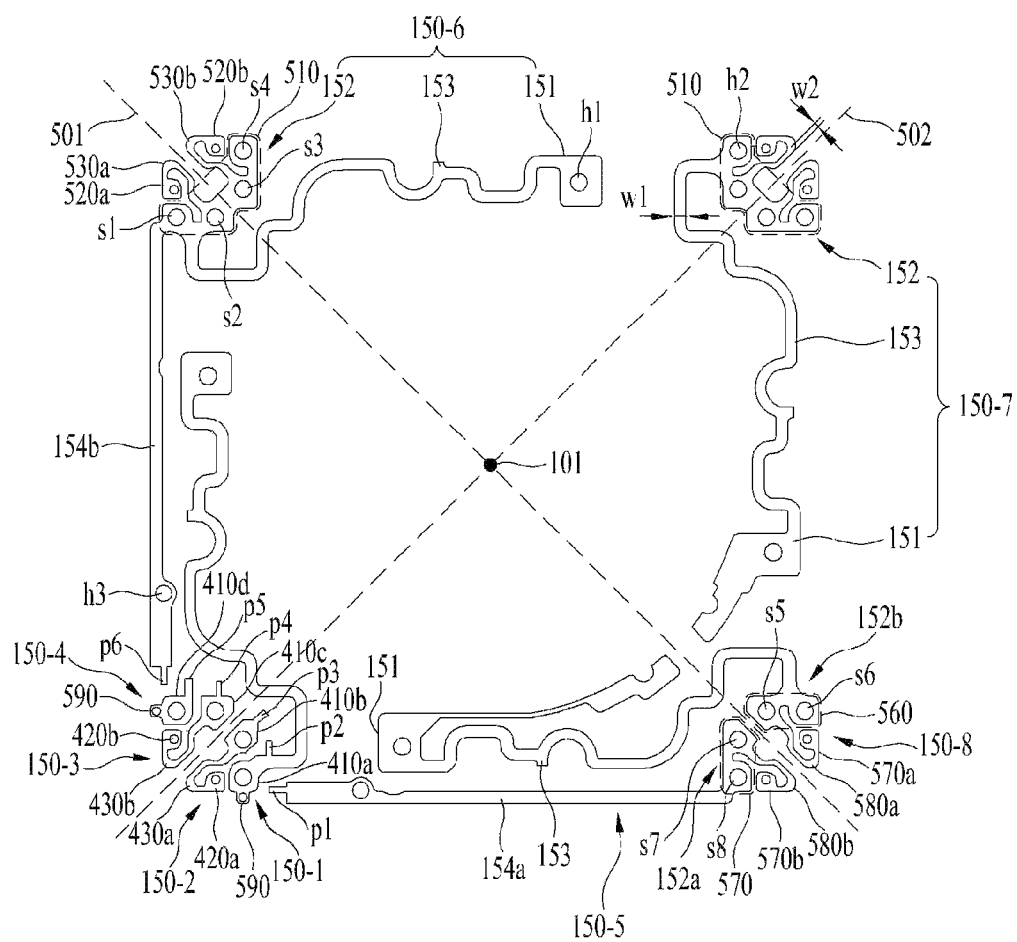
FIG. 16A is a plan view of the upper elastic member shown in FIG. 1.
Figure 16B:
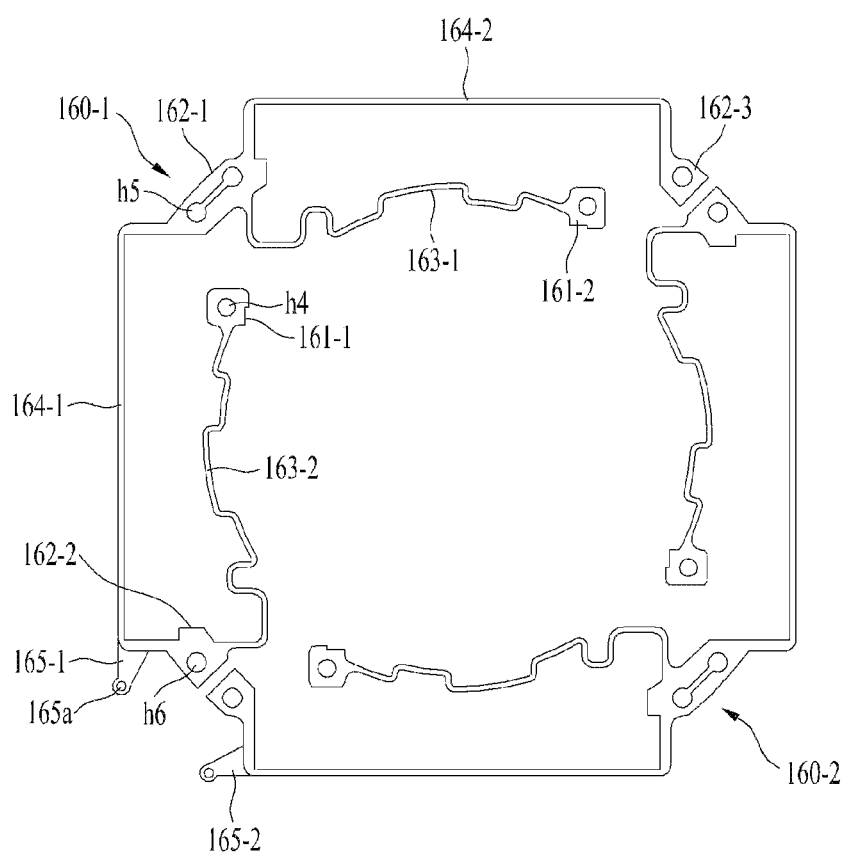
FIG. 16B is a plan view of the lower elastic member shown in FIG. 8.
Figure 17:
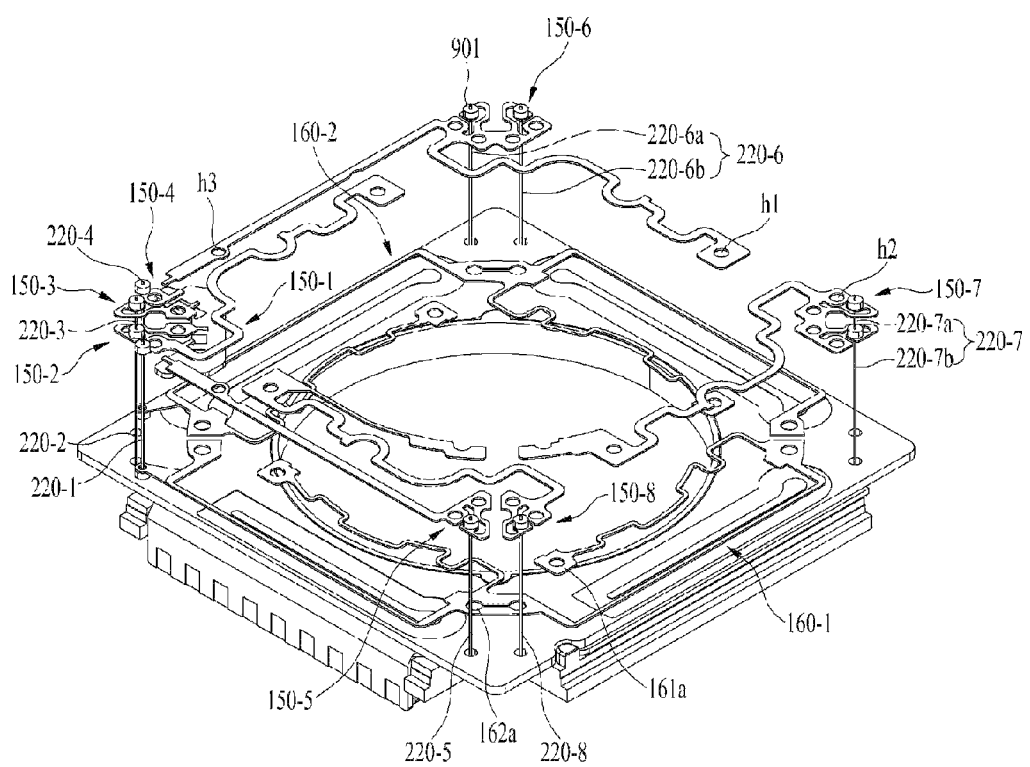
FIG. 17 is an assembled perspective view illustrating the upper elastic member, the lower elastic member, the base, the support member, the second coil and the circuit board shown in FIG. 8.
Figure 18:
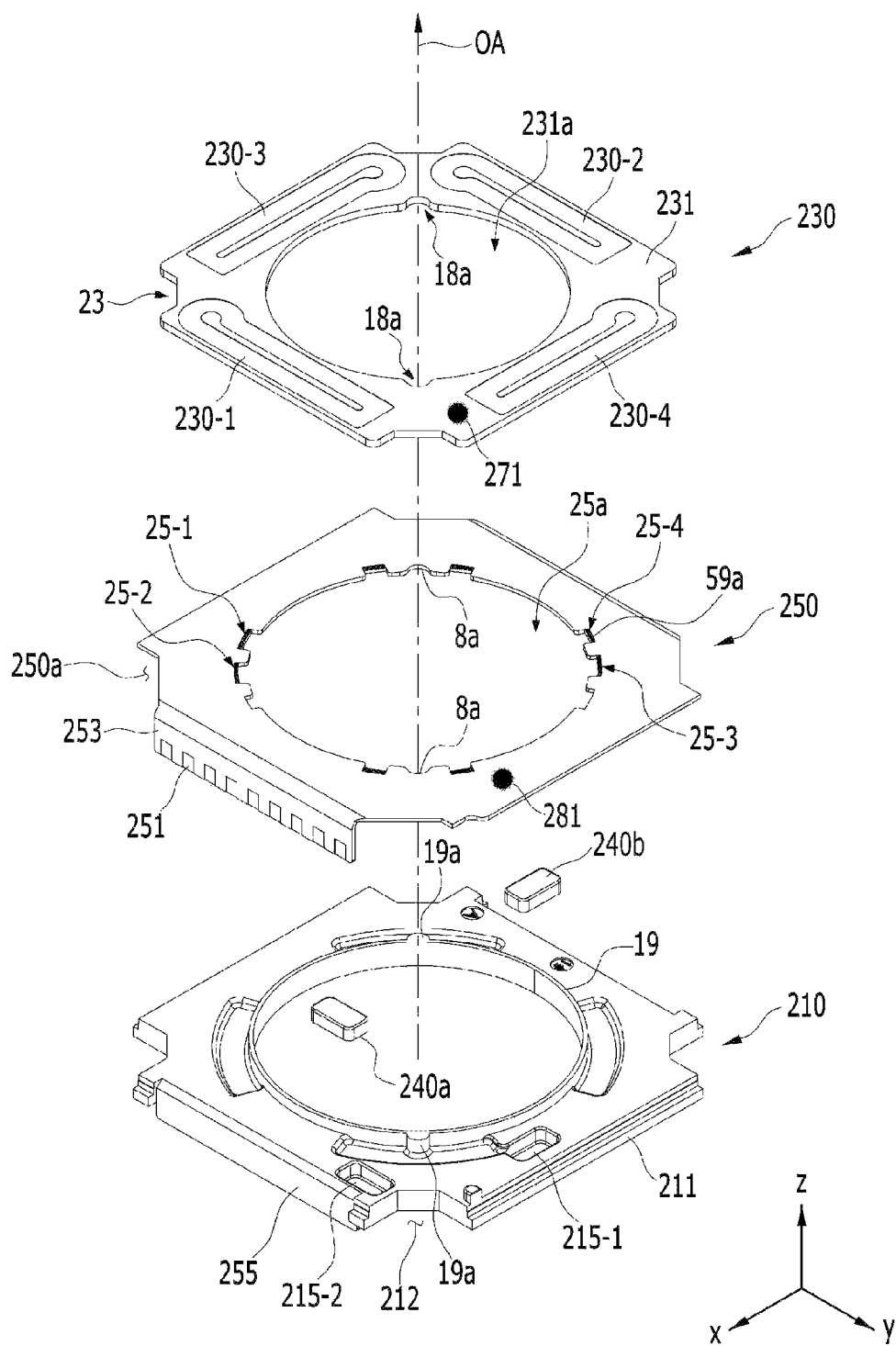
FIG. 18 is an exploded perspective view illustrating the second coil, the circuit board, the base and the second position sensor shown in FIG. 8.

FIG. 16A is a plan view of the upper elastic member 150 shown in FIG. 1. FIG. 16B is a plan view of the lower elastic member 160 shown in FIG. 8. FIG. 17 is an assembled perspective view illustrating the upper elastic member 150, the lower elastic member 160, the base 210, the support member 220, the second coil 230, and the circuit board 250 shown in FIG. 8. FIG. 18 is an exploded perspective view illustrating the second coil 230, the circuit board 250, the base 210, and the second position sensor 240 shown in FIG. 8.

Referring to FIGS. 16A to 18, the upper elastic member 150 and the lower elastic member 160 may elastically support the bobbin 110 with respect to the housing 140.

The upper elastic member 150 may be coupled to the upper portion, the upper end or the upper surface of the bobbin 110, and the lower elastic member 160 may be coupled to the lower portion, the lower end or the lower surface of the bobbin 110.

For example, the upper elastic member 150 may be coupled both to the upper portion, the upper end or the upper surface of the bobbin 110 and to the upper portion, the upper end or the upper surface of the housing 140, and the lower elastic member 160 may be coupled both to the lower portion, the lower end or the lower surface of the bobbin 110 and to the lower portion, the lower end or the lower surface of the housing 140.

The support member 220 may support the housing 140 so as to allow the housing 140 to be moved in a direction perpendicular to the optical axis, and may conductively connect at least one of the upper and lower elastic members 150 and 160 to the circuit board 250.

Referring to FIG. 16A, the upper elastic member 150 may include a plurality of upper elastic units 150-1 to 150-8, which are conductively isolated from each other. Although FIG. 16A illustrates eight upper elastic units, which are conductively isolated from each other, the disclosure is not limited thereto.

The upper elastic member 150 may include first to sixth upper elastic units 150-1 to 150-6, which are directly bonded to the first to sixth terminals 190-1 to 190-6 of the circuit board 190 and are conductively connected thereto.

Furthermore, the upper elastic member 150 may further include seventh and eighth upper elastic units 150-7 and 150-8, which are not conductively connected to the first to sixth terminals 190-1 to 190-6 of the circuit board 190.

A plurality of upper elastic units may be disposed at the first corner portion of the housing 140, at which the circuit board 190 is disposed, and at least one upper elastic unit may be disposed at each of the remaining second to fourth corner portions, other than the first corner portion.

For example, four upper elastic units 150-1 to 150-4 may be disposed at the first corner portion of the housing 140, two upper elastic units 150-5 and 150-8 may be disposed at the second corner portion of the housing 140, one upper spring 150-6 may be disposed at the third corner portion of the housing 140, and one upper spring may be disposed at the fourth corner portion of the housing 140. The reason for this is to allow the upper elastic units 150-1 to 150-6 to be easily bonded to the six terminals 190-1 to 190-6 of the circuit board 190.

The upper elastic units 150-1, 150-6, 150-7 and 150-8, which are respectively disposed at the first to fourth corner portions of the housing 140, may be coupled both to the upper portion of the housing 140 and to the upper portion of the bobbin 110.

At least one of the first to fourth upper elastic units 150-1 to 150-4 may include a first inner frame 151 coupled to the bobbin 110, a first outer frame 152 coupled to a corresponding one of the first to fourth corner portions of the housing 140, and a first frame connector 153 connecting the first inner frame to the first outer frame.

At least one of the fifth to eighth upper elastic units 150-5 to 150-8 may include a first inner frame 151 coupled to the bobbin 110, a first outer frame 152 coupled to a corresponding one of the first to fourth corner portions of the housing 140, and a first frame connector 153 connecting the first inner frame to the first outer frame.

For example, the first inner frame 151 may have a through hole h1 for coupling to the first coupler 113a of the bobbin 110, and the outer frame 152 may have a through hole h2 for coupling to the upper support protrusion 143 of the housing 140.

Referring to FIG. 16A, the first to fourth upper elastic units 150-1 to 150-4, which are disposed at the first corner portion of the housing 140, may respectively include first couplers 410a to 410d, which are coupled to the first corner portion of the housing 140.

The first couplers 410a to 410d of the first to fourth upper elastic units 150-1 to 150-4 may be respectively provided with contacts P2 to P5, each of which is in contact with or connected to a corresponding one of the first to sixth terminals 190-1 to 190-6 of the circuit board 190.

Each of the contacts P2 to P5 may extend or project from one end of a corresponding one of the first couplers 410a to 410d, and may be bonded to a corresponding one of the terminals of the circuit board 190 via solder or a conductive adhesive member.

The first outer frame of each of the first and fourth upper elastic units 150-1 and 150-4 may be provided with a third coupler 590, which is coupled to one end of a corresponding one of the first and fourth support members 220-1 and 220-4.

The second and third upper elastic units 150-2 and 150-3 may be disposed between the first and fourth upper elastic units 150-1 and 150-4.

The second and third upper elastic units 150-2 and 150-3 may respectively include second couplers 420a and 420b, coupled to the second and third support members 220-2 and 220-3, and connectors 430a and 430b, connecting the first couplers 410b and 410c to the second couplers 420a and 420b.

The first outer frames 152 of the fifth to eighth upper elastic units 150-5 to 150-8, which are respectively disposed at the second to fourth corner portions of the housing 140, may include first couplers 510, 560 and 570, which are coupled to the second to fourth corner portions of the housing 140, second couplers 520a, 520b, 570a and 570b, which are coupled to the fifth to eighth support members 220-5 to 220-8, and connectors 530a, 530b, 580a and 580b, which connect the first couplers 510, 560 and 570 to the second couplers 520a, 520b, 570a and 570b.

Using solder or a conductive adhesive member (for example, conductive epoxy) 901 (see FIG. 17), the second and third support members 220-2 and 220-3 may be conductively connected to the second couplers 420a and 420b, and the fifth to eighth support members 220-5 to 220-8 may be conductively connected to the second couplers 520a, 520b, 570a and 570b.

The first couplers 410a to 410d, 510, 560 and 570 of the first outer frames of the first to fourth upper elastic members 150-1 to 150-4 and the fifth to eighth upper elastic members 150-5 to 150-8 may include one or more coupling regions coupled to the housing 140, and each of the coupling regions may be embodied as a through hole.

Although each of the second couplers 420a, 420b, 520a, 520b, 570a and 570b and the third coupler 590 may have therein a through hole, the disclosure is not limited thereto. In another embodiment, the through hole may be replaced with any of various structures, for example, a groove, enabling coupling to the housing 140.

Each of the connectors 430a, 430b, 530a, 530b, 580a and 580b may have a shape that is bent at least once, and the width W2 each of the connectors 430a, 430b, 530a, 530b, 580*a* and 580*b* may be less than the width W1 of the first frame connector 153 of the upper elastic member 150 (W2<W1).

Because the width W2 is less than the width W1 (W2<W1), the connectors 430*a*, 430*b*, 530*a*, 530*b*, 580*a* and 580*b* may be easily moved in the optical-axis direction, thereby making it possible to distribute the stress applied to the upper elastic member 150 and the stress applied to the support member 220.

Although the width W1 of the first frame connector 153 of the upper elastic member 150 is greater than the width of each of the second frame connecters 163-1 and 163-2 of the lower elastic member 160 in this embodiment, the disclosure is not limited thereto.

For example, the first outer frames 152 of the sixth and seventh upper elastic units 150-6 and 150-7 may be symmetrical with respect to reference lines 501 and 502. Furthermore, the outer frames of the fifth and eighth upper elastic units 150-5 and 150-8 may be bilaterally symmetrical to each other with respect to the reference line 501.

The reference line 501 may be a straight line that extends through the center point 101 (see FIG. 16A) and through the vertices of the second and third corner portions of the housing 140 that face each other, and the reference line 502 may be a straight line that extends through the center point 101 (see FIG. 16A) and extends through the vertices of the first and fourth corner portions of the housing 140 that face each other. For example, the center point 101 may be the center of the bobbin 110 or the center of the housing 140, and the corners of the housing 140 may become the stoppers 144-1 to 144-4.

The fifth upper spring 150-5, which is disposed at the second corner portion, may include a first upper extension frame 154*a* which extends toward the first corner portion from one end of the first coupler 570 of the first outer frame 152*a*. For example, the first upper extension frame 154*a* may be connected at one end thereof to the first outer frame 152*a*, and may be coupled at the other end thereof to the terminal 190-1 of the circuit board 190.

Furthermore, the sixth upper spring 160-6, which is disposed at the third corner portion, may include a second upper extension frame 154*b*, which extends toward the first corner portion from one end of the first coupler 510 of the first outer frame 152. For example, the second upper extension frame 154*b* may be connected at one end thereof to the first outer frame 152, and may be coupled at the other end thereof to the terminal 190-6 of the circuit board.

The first and second upper extension frames 154*a* and 154*b* may be respectively provided with contacts P1 and P6, each of which is in contact with or connected to a corresponding one of the first to sixth pads 190-1 to 190-6 of the circuit board 190.

Each of the first and second upper extension frames 154*a* and 154*b* may have a through hole h3, which is coupled to a corresponding one of the upper support protrusions of the housing 140.

The first couplers 410*a* to 410*d*, 510, 560 and 570 may be in contact with the upper surfaces of the corner portions 142 of the housing 140, and may be supported by the corner portions 142 of the housing 140. Meanwhile, the connectors 430*a*, 430*b*, 530*a*, 530*b*, 580*a* and 580*b* may not be in contact with the upper surface of the housing 140, but may be spaced apart from the housing 140. In order to prevent oscillation due to vibration, the space between the connectors 430*a*, 430*b*, 530*a*, 530*b*, 580*a* and 580*b* and the housing 140 may be filled with a damper (not shown).

Referring to FIG. 16B, the lower elastic member 160 may include a plurality of lower elastic units 160-1 and 160-2.

For example, each of the first and second upper elastic units 160-1 and 160-2 may include second inner frames 161-1 and 161-2, which are coupled or secured to the lower portion of the bobbin 110, second outer frames 162-1 to 162-3, which are coupled or secured to the lower portion of the housing 140, second frame connectors 163-1 and 163-2 connecting the second inner frames 161-1 and 161-2 to the second outer frames 162-1 and 162-2, and connecting frames 164-1 and 164-2 connecting the second outer frames to each other.

Although the width of each of the connecting frames 164-1 and 164-2 may be less than the width of each of the first inner frames, the disclosure is not limited thereto.

In order to avoid spatial interference with the second coils 230 and the first magnets 130-1 to 130-4, the connecting frames 164-1 and 164-2 may be positioned outside the second coils 230-1 to 230-4 and the first magnets 130-1 to 130-4. Here, the outside of the second coils 230-1 to 230-4 and the first magnets 130-1 to 130-4 may be the side opposite the center of the bobbin 110 or the center of the housing 140 with respect to the second coils 230-1 to 230-4 and the first magnets 130-1 to 130-4.

For example, although the connecting frames 164-1 and 164-2 may not overlap the second coils 230-1 to 230-4 in the optical-axis direction, the disclosure is not limited thereto. In another embodiment, at least a portion of the connecting frames 164-1 and 164-2 may be aligned with or overlap the second coils 230-1 to 230-4 in the optical-axis direction.

The portion at which the connecting frame 164-1 of the first lower elastic unit 160-1 and the second outer frame 162-2 are connected to each other may be provided with a first connecting projection 165-1 to which the other end of the first support member 220-1 is bonded.

The portion at which the connecting frame of the second upper elastic unit 160-2 and the second outer frame are connected to each other may be provided with a second connecting projection 165-2, to which the other end of the fourth support member 220-4 is bonded. Each of the first and second connecting projections 165-1 and 165-2 may have a through hole 165*a* to which the other end of a corresponding one of the first and fourth support members 220-1 and 220-4 is coupled.

Each of the upper elastic units 150-1 to 150-8 and the upper elastic units 160-1 and 160-2 may be embodied as a leaf spring. However, the upper elastic unit is not limited thereto, and may be embodied as a coil spring or the like.

The outer frame (for example, 152 or 162) may be alternatively referred to as an outer portion, the inner frame (for example, 151 or 161) may be alternatively referred to as an inner portion, and the support member (for example, 220) may be alternatively referred to as a wire.

Next, the support members 220-1 to 220-8 will be described.

The support members 220-1 to 220-8 may be disposed so as to correspond to the second side portions or the corner portions 142 of the housing 140.

The support members 220 may conductively connect two (for example, 150-1 and 150-4) of the upper elastic units 150-1 to 150-8 to the first and second lower elastic units 160-1 and 160-2. Furthermore, the support members 220 may conductively connect four other ones (for example, 150-2 and 150-3) among the upper elastic units 150-1 to 150-8 to the circuit board 250.

The support members 220-1 to 220-8 may conductively connect at least one of the upper elastic units, which are positioned at at least one of the corner portions of the housing 140, to the circuit board.

One end of each of the support members 220-2, 220-3, 220-5 and 220-8 may be directly connected or bonded to the second coupler 420a, 420b, 520a, 520b, 570a and 570b of a corresponding one of the second, third and fifth to eighth upper elastic members 150-2, 150-3, 150-5 to 150-8.

The other end of each of the support members 220-2, 220-3 and 220-5 to 220-8 may be directly connected or bonded to the circuit board 250.

One end of each of the support members 220-1 and 220-4 may be directly connected or bonded to the third connector 590 of a corresponding one of the first and fourth upper elastic units 150-1 and 150-4. The other end of each of the support members 220-1 and 220-4 may be directly connected or bonded to the through hole 165a formed in a corresponding one of the first and second connecting projections 165-1 and 165-2 of the lower elastic units 160-1 and 160-2.

A single contact may be formed between each of the second couplers 420a, 420b, 520a, 520b, 570a and 570b and a corresponding one of the first couplers 410b, 410c, 510, 560 and 570 by means of a corresponding one of the connectors 430a, 430b, 530a, 530b, 580a and 580b.

For example, the support members 220-2, 220-3 and 220-5 to 220-8 may extend through the through holes 147 (see FIG. 11) formed in the corner portions of the housing 140. Meanwhile, the support members 220-1 and 220-4 may be disposed near the boundary line between the first side portions 141 and the corner portions 142 of the housing 140, and may not extend through the corner portions 142 of the housing 140.

Each of the support members 220-1 to 220-4 may conductively connect a corresponding one of the first to fourth upper elastic units 150-1 to 150-4 to the circuit board 250, independently of the others.

In order to support the housing 140 in an equilibrium state through a symmetrical orientation, each of the sixth and seventh support members 220-6 and 220-7 may include two support members 220-6a and 220-6b or 220-7a and 220-7b, which are connected or bonded to the sixth upper elastic member 150-6 or the seventh upper elastic member 150-7, and at least one of the two support members 220-6a and 220-6b or 220-7a and 220-7b may be conductively connected to the circuit board 250.

The first coil 120 may be directly connected or bonded to the second inner frames of the first and second lower elastic units 160-1 and 160-2.

Four terminals 190-1, 190-3, 190-4 and 190-6 of the circuit board 190 may be conductively connected to four corresponding ones of the terminals of the circuit board 250 via four corresponding upper elastic units 150-5, 150-2, 150-3 and 150-6 and four corresponding support members 220-5, 220-2, 220-3 and 220-6.

Meanwhile, two terminals 190-2 and 190-5 of the circuit board 190 may be conductively connected to the first coil 120 via two corresponding upper elastic units 150-1 and 150-4, two support members 220-1 and 220-4, and the first and second lower elastic units 160-1 and 160-2.

The six terminals 190-1 to 190-6 of the circuit board 190 and the first position sensor 190 may be conductively connected to each other, and four (for example, 190-1, 190-3, 190-4 and 191-6) of the six terminals 190-1 to 190-6 of the circuit board 190 may be conductively connected to the circuit board 250.

A clock signal SCL and power signals VDD and GND may be sent and received between the first position sensor 170 and the circuit board 250 via the four terminals (for example, 190-1, 190-3, 190-4 and 190-6) of the circuit board 190, the upper elastic units 150-2, 150-3, 150-5 and 150-6, which are connected to the four terminals, and the support members 220-2, 220-3, 220-5 and 220-6, which are connected to the four terminals.

Each of the support members 220 may be embodied as a member that is conductive and offers elastic support, for example, a suspension wire, a leaf spring, or a coil spring. In another embodiment, the support members 220 may be integrally formed with the upper elastic member 150.

In the embodiment shown in FIG. 17, although the second and fifth terminals 190-2 and 190-5 of the circuit board 190 are connected to the first and second lower elastic units and thus to the first coil 120 via the first and fourth support members 220-1 and 220-4, the disclosure is not limited thereto.

In another embodiment, the first coil 120 may be bonded to the first inner frames of two of the upper elastic units 150-2, 150-5 and 150-6, and the first and fourth support members 220-1 and 220-4 may be omitted.

In a further embodiment, one end of the first coil 120 may be bonded to the second inner frame of one of the first and second lower elastic units 160-1, and the other end of the first coil 120 may be bonded to the first inner frame of one of the upper elastic units 150-2, 150-5 and 150-6 and may be provided with at least one of the first and fourth support members 220-1 and 220-4.

Next, the base 210, the circuit board 250, and the second coil 230 will be described.

Referring to FIG. 18, the base 210 may have a bore corresponding to the bore in the bobbin 110 and/or the bore in the housing 140, and may have a shape corresponding to or coinciding with that of the cover member 300, for example, a square shape.

The base 210 may include a step 211, to which an adhesive is applied when the cover member 300 is secured to the base 210 via adhesion. Here, the step 211 may guide the cover member 300, which is coupled to the upper side of the base, and the side plate of the cover member 300 may be in contact with the step 211.

The lower end of the side plate of the cover member 300 may be adhesively bonded or secured to the step 211 of the base 210 using an adhesive or the like.

The regions of the base 210 that faces the terminals 251 of the circuit board 250 may be provided with a support 255. The support 255 may support a terminal member 253 of the circuit board 250 on which the terminals 251 are formed.

The base 210 may have recesses 212 in regions thereof corresponding to the corners of the cover member 300. When the corners of the cover member 300 have projections, the projections of the cover member 300 may be coupled to the recesses 212.

The upper surface of the base 210 may be provided with seating grooves 215-1 and 215-2 in which the second position sensor 240 including the OIS position sensors 240a and 240b are disposed. The lower surface of the base 210 may be provided with a seating portion (not shown) to which the filter 610 of the camera module 200 is mounted.

The upper surface of the base 210 around the bore may be provided with a projection 19 which is coupled to the bore 25a in the circuit board 250 and the bore in the circuit member 231.

The projection 19 on the base 210 may be provided on the side surface thereof with protrusions 19a which are coupled to the grooves 18a in the coil board 231 and the grooves 8a in the circuit board 250.

The second coil 230 may be disposed under the magnet 130 disposed at the housing 140, and may be disposed on the circuit board 250.

The OIS position sensors 240a and 240b may be mounted, surface-mounted or disposed on the circuit board 250, and may be disposed in the seating grooves 215-1 and 215-2 in the base 210.

The OIS position sensors 240a and 240b may detect displacement of the OIS operation unit in a direction perpendicular to the optical axis. Here, the OIS operation unit may include the AF operation unit and the components mounted on the housing 140.

For example, the OIS operation unit may include the AF operation unit and the housing 140. In some embodiments, the OIS operation unit may further include the first magnets 130-1 to 130-4. For example, the AF operation unit may include the bobbin 110 and components that are mounted on the bobbin 110 and are moved therewith. For example, the AF operation unit may include the bobbin 110, as well as the lens (not shown), the first coil 120 and the first and second magnets 180 and 185, which are mounted on the bobbin 110.

The circuit board 250 may be disposed on the upper surface of the base 210, and may have the bore 25a corresponding to the bore in the bobbin 110, the bore in the housing 140 and/or the bore in the base 210. The outer circumferential surface of the circuit board 250 may have a shape coinciding with or corresponding to the upper surface of the base 210, for example, a quadrilateral shape.

The circuit board 250 may include at least one terminal member 253, which is bent from the upper surface of the circuit board and which is provided with a plurality of terminals 251 or pins to which electrical signals are suppled from the outside. Although the circuit board 250 may include, for example, two terminal members that face each other, the disclosure is not limited thereto.

The terminal member 253 of the circuit board 250 may be provided with the terminals 251.

Drive signals may be respectively provided to the first coil 120 and the second coil 230 via the terminals 251 mounted on the terminal member 253 of the circuit board 250.

Signals SCL, SDA, VDD and GND for data communication with the first position sensor 190 may be sent and received via the plurality of terminals 251 mounted on the terminal member 253 of the circuit board 250.

Drive signals may be supplied to the OIS position sensors 240a and 240b via the plurality of terminals 251 mounted on the terminal member 253 of the circuit board 250, and the terminals 251 may receive the signals output from the OIS position sensors 240a and 240b and output the signals to the outside.

The inner circumferential surface of the circuit board 250, which is formed by the bore 25a, may be provided with grooves 8a, which are coupled to the protrusions 19a of the base 210.

The drive signal, which is provided to the first coil 120 and/or the second coil 230, may be a DC and/or AC signal and may be of a current type or a voltage type.

In the embodiment, although the circuit board 250 may be an FPCB, the disclosure is not limited thereto, and the terminals of the circuit board 250 may be directly formed on the surface of the base 210 through surface electrode technology.

In order to avoid spatial interference with the support members 220-1 to 220-8, the circuit board 250 may have escape groove 250a formed in the corners or vertices thereof.

In another embodiment, in place of the escape grooves 250a, the corners or vertices of the circuit board 250 may be provided with holes through which the support members 220-1 to 220-8 extend.

For example, although the support members 220-1 to 220-8 may be conductively connected to the lower surface of the circuit board 250 or the circuit pattern formed on the lower surface via solder or the like, the disclosure is not limited thereto.

In another embodiment, the circuit board 250 may not have the escape grooves or holes formed therein, and the support members may be conductively connected to a circuit pattern or pads formed on the upper surface of the circuit board 250 via solder or the like.

In a further embodiment, the support members may be conductively connected to the coil board 231, and the coil board 231 may conductively connect the support members to the circuit board 250.

The second coil 230 may be disposed under the bobbin 110 and/or the housing 140.

For example, the second coil 230 may be disposed on the upper surface of the circuit board 250 so as to face or overlap the first magnets 130-1 to 130-4 disposed at the housing 140.

Figure 19:
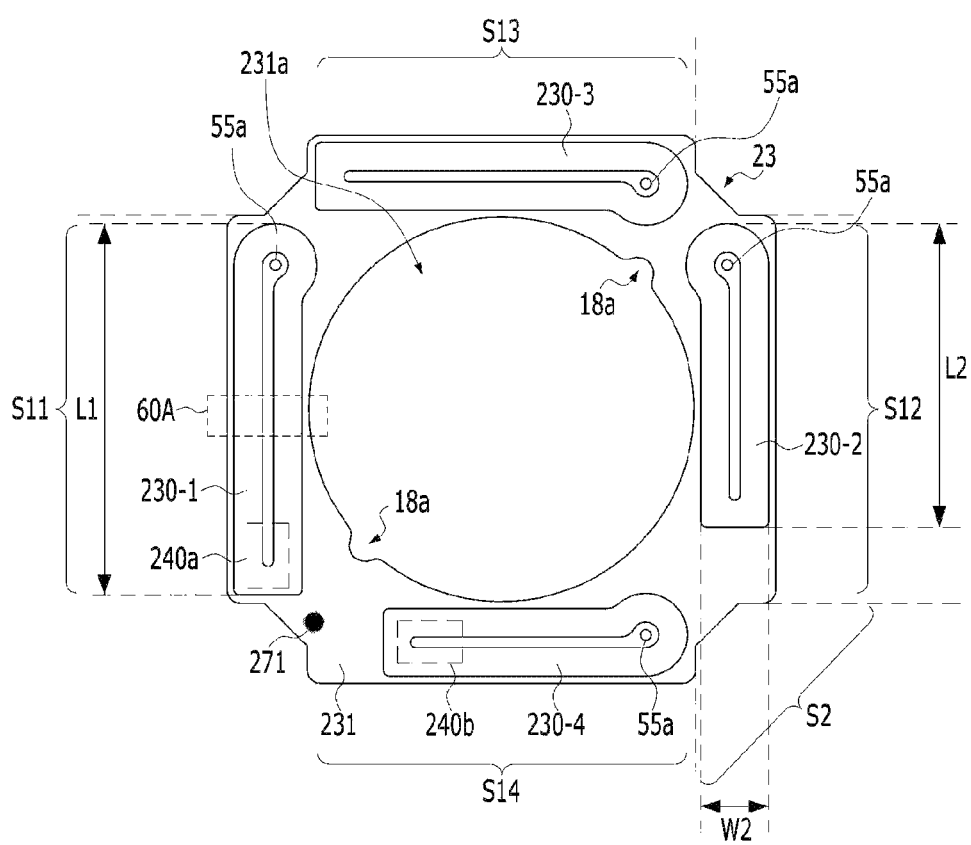
FIG. 19 is a plan view of the second coil shown in FIG. 18.
Figure 20:
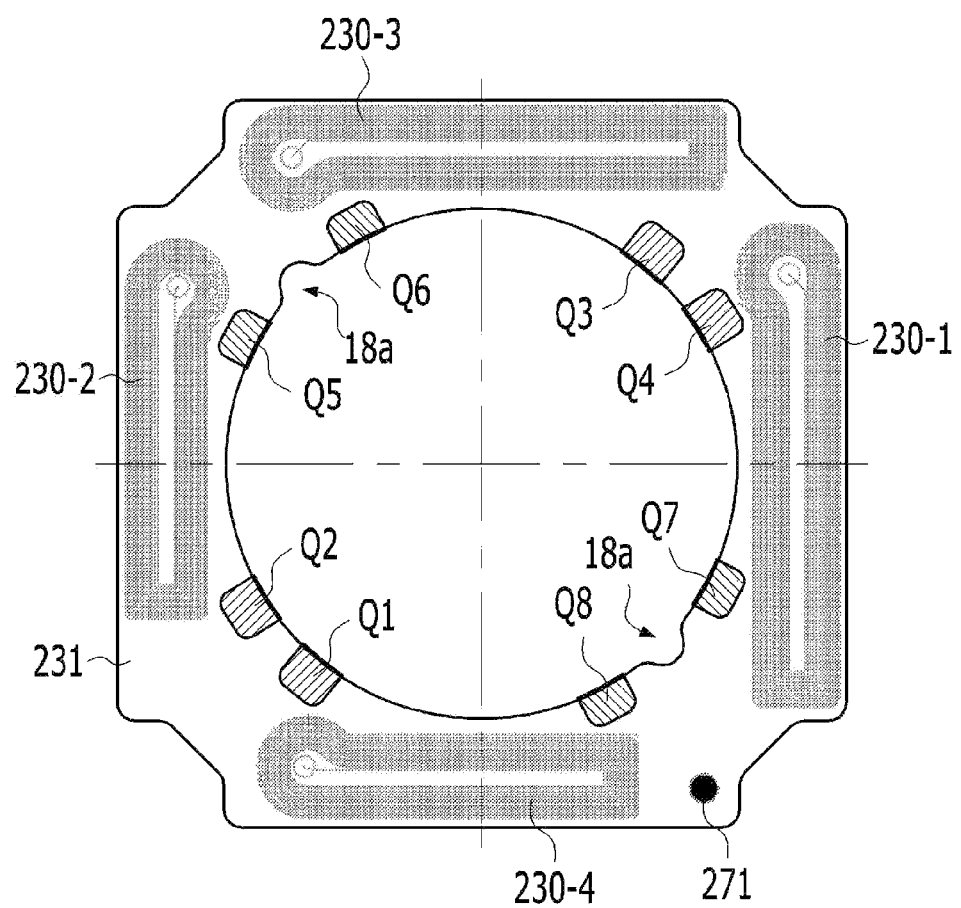
FIG. 20 is a bottom view of the second coil shown in FIG. 19.
Figure 21:
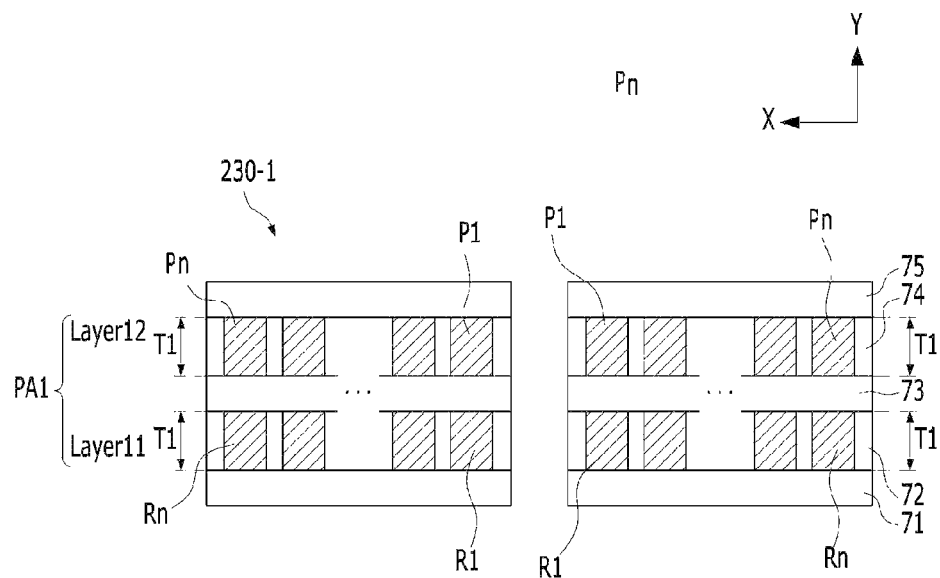
FIG. 21 is a cross-sectional view of the dotted portion in FIG. 19.

FIG. 19 is a plan view of the second coil 230 shown in FIG. 18. FIG. 20 is a bottom view of the second coil 230 shown in FIG. 19. FIG. 21 is a cross-sectional view of the dotted portion in FIG. 19.

Referring to FIGS. 19 to 21, the second coil 230 may include the coil board 231 and coil units 230-1 to 230-4, which are provided at the coil board 231 and correspond to the first magnets 130-1 to 130-4. The coil board 231 may be alternatively referred to as a circuit member or a board.

The coil board 231 may have a polygonal shape (for example, a quadrilateral shape).

For example, the coil board 231 may include four sides S11 to S14 and four corners S2, and may have a bore (or cavity) 231a corresponding to the bore in the housing 140, the bore in the circuit board 250 and/or the bore in the base 210.

The coil board 231 shown in FIG. 19 may be a unit coil board. The process of forming the unit coil board 231 is as follows.

First, a board including a plurality of unit coil boards is prepared. Subsequently, for shaping the unit coil board, a first laser-cutting operation of cutting the board along the sides S11 to S14 of the coil board 231 shown in FIG. 19 is performed. At this time, the board may include bridges, each of which connects two adjacent corners of two adjacent unit coil boards.

Subsequently, a second laser-cutting operation of cutting the board along the corners S2 of the coil boards 231 is performed. In the second laser-cutting operation, the bridges may also be cut together with the corners, and burrs may be created at the cut regions of the bridges. The reason for this is because the laser power required for cutting portions of the coil boards 231 that include Cu (for example, coil units or dummy patterns) is different from the laser power required for cutting portions of the coil boards 231 not including Cu.

In the embodiment, burrs may be created at corners of the unit coil boards in the formation of the unit coil boards 231. However, since each of the corners of the coil board 231 is provided with the escape groove in order to avoid spatial interference with the support members, friction or the like with the cover member does not occur and foreign substances are not generated even when burrs are formed.

Because burrs are formed at the corners of the unit coil board, the roughness of the corners S2 of the coil board 231 may be higher than the roughness of the sides S11 to S14 of the coil board 231.

Meanwhile, when each of the bridges connects sides of two adjacent unit coil boards to each other, burrs such as grooves or protrusions may be locally created at the sides of the unit coil board from which the bridges are removed in the second laser-cutting operation, and foreign substances may be generated due to contact or a collision between the side plate of the cover member and the sides of the coil board 231.

Each of the corners S2 of the coil board 231 may be positioned between two adjacent sides of the coil board 231, and may connect the two adjacent sides to each other.

Each of the coil units 230-1 to 230-4 may face or overlap a corresponding one of the first magnets 130-1 to 130-4 in the optical-axis direction.

Each of the first to fourth coil units 230-1 to 230-4 may have a closed curve shape having a central hole, for example a ring shape, and the central hole may be formed in the optical-axis direction.

For example, the first coil unit 230-1 and the second coil unit 230-3 may be disposed so as to face each other in a transverse direction (for example, in the x-axis direction), and the third coil unit 230-3 and the fourth coil unit 230-4 may be disposed so as to face each other in a vertical direction (for example, in the y-axis direction).

Each of the first to fourth coil units 230-1 to 230-4 may be disposed at a corresponding one of the four sides S1 of the coil board 231.

For example, each of the first coil unit 2301 and the second coil unit 230-2 may be disposed parallel to a corresponding one of the first and second sides S11 and S12 of the coil board 231, which face each other, and each of the third coil unit 230-3 and the fourth coil unit 230-4 may be disposed parallel to a corresponding one of the third and fourth sides S13 and S14, which face each other.

In order to avoid spatial interference with the support members 220-1 to 220-8, each of the corners S2 of the coil board 231 may have an escape groove 23 formed therein, and the support members 220-1 to 220-8 may be positioned near the escape grooves 23 in the coil board 231. In another embodiment, in order to avoid spatial interference between the coil board 231 and the support members 220-1 to 220-8, the corners of the coil board 231 may be provided with through holes in place of the escape holes 23.

The inner circumferential surface of the coil board 231, which is formed by the bore 231a, may be provided with grooves 18a which are coupled to the protrusions 19a on the base 210.

Referring to FIG. 20, the coil board 231 may include at least one terminal.

For example, the coil board 231 may include terminals Q1 to Q8. In FIG. 20, although the coil board 231 includes eight terminals, the disclosure is not limited thereto.

In another embodiment, the coil board 231 may include four terminals (for example, Q1 to Q4). In this case, the first and second coil units 230-1 and 230-2 may be connected to each other, and the third and fourth coil units 230-3 and 230-4 may be connected to each other. The first and second coil units 230-1 and 230-2, which are connected to each other, may be conductively connected to two terminals (for example, Q1 and Q2), and the third and fourth coil units 230-3 and 230-4, which are connected to each other, may be conductively connected to two of the other terminals (for example, Q3 and Q4).

In a further embodiment, the coil board 231 may include six terminals (for example, Q1 to Q6). In this case, two coil units, which face each other, may be connected to each other, and may be conductively connected to two terminals (for example, Q1 and Q2). Two other coil units, which face each other, may not be connected to each other. One of the two coil units, which are not connected to each other, may be conductively connected to two other terminals (for example, Q3 and Q4), and the other one of the two coil units, which are not connected to each other, may be conductively connected to the two remaining terminals (for example, Q5 and Q6).

At least one of the terminals Q1 to Q8 of the coil board 231 may be conductively connected to the coil units 230-1 to 230-4. The terminals of the coil board 231 may be alternatively referred to as pads, conductive bodies, electrodes or bonding portions.

The terminals Q1 to Q8 of the coil board 231 may be disposed so as to abut on the inner circumferential surface or the inner surface of the coil board 231, which is formed by the bore 231a. For example, the terminals Q1 to Q8 of the coil board 231 may be arranged so as to be spaced apart from one another along the inner circumferential surface or the inner surface of the coil board 231.

For example, the lower surface of each of the terminals Q1 to Q8 of the coil board 231 may be exposed from the lower surface of the coil board 231.

The circuit board 250 may include at least one pad corresponding to at least one terminal of the coil board 231.

For example, the circuit board 250 may include pads 25-1 to 25-4, and each of the pads 25-1 to 25-4 of the circuit board 250 may be conductively connected to a corresponding one of the terminals (for example, Q1 to Q4) of the coil board 231. Although the circuit board 250 includes four pads 25-1 to 25-4 connected to the four terminals Q1 to Q4 of the coil board 231, the disclosure is not limited thereto. Depending on the conductive connection relationship of the coil units 230-1 to 230-5, the circuit board 250 may include two, three, or five or more pads for conductive connection to the coil units.

The coil board 231 may include a first marker 271, and the circuit board 250 may include a second marker 281 corresponding to the first marker 281. Although the first marker 271 may be positioned, for example, between the first coil unit 230-1 and the fourth coil unit 230-4, the disclosure is not limited thereto. The first marker 271 and the second marker 281 may be serve as markers for correctly aligning the terminals Q1 to Q4 of the coil board 231 with the pads 25-1 to 25-4 of the circuit board 250 in an operation of conductively connecting the terminals Q1 to Q4 of the coil board 231 to the pads 25-1 to 25-4 of the circuit board 250.

In another embodiment, the second coil 230 may include one coil unit for the second direction and one coil unit for the third direction, and may include four or more second coil units.

The housing 140 may be moved in the second direction and/or in the third direction, for example, in the x-axis direction and/or in the y-axis direction, by the electromagnetic force resulting from the interaction between the first magnets 130-1 to 130-4 and the second coil units 230-1 to 230-4, which are disposed so as to face each other in the optical-axis direction. For example, the controllers 830 and 780 may perform handshake correction for the lens moving apparatus 100 by controlling a drive signal provided to coil units 230-1 to 230-4.

The lens moving apparatus 100 may further include the second position sensor 240 for OIS feedback operation. The second position sensor 240 may include the first OIS position sensor 240a and the second OIS position sensor 240b.

Each of the OIS position sensors 240a and 240b may be a hall sensor, and any sensor can be used, as long as the sensor is capable of detecting the intensity of a magnetic field. For example, each of the position sensors 240a and 240b may be embodied as a driver including a hall sensor, or may be embodied as a position-detecting sensor such as a hall sensor alone.

For example, although the first OIS position sensor 240a and the second OIS position sensor 240b may be disposed or mounted on the lower surface of the circuit board 250 and the first and second OIS sensors 240a and 240b may be disposed in the seating grooves 215-1 and 215-2 in the base 210, the disclosure is not limited thereto. In another embodiment, the first and second OIS position sensors 240a and 240b may be disposed on the upper surface of the circuit board 250.

At least a portion of the first OIS position sensor 240a may overlap the first coil unit 230-1 in the optical-axis direction, and at least a portion of the second OIS position sensor 240b may overlap the fourth coil unit 230-4 in the optical-axis direction.

The first and second OIS position sensors 240a and 240b may be conductively connected to the terminals 251 of the circuit board 250. For example, drive signals may be provided to the first OIS and second position sensors 240a and 240b via the terminals 251 of the circuit board 250, and the second outputs from the first and second OIS position sensors 240a and 240b may be output via the terminals 251 of the circuit board 250.

The controller 830 of the camera module or the controller 780 of a portable terminal 200A may sense or detect displacement of the OIS operation unit using the first output of the first OIS position sensor 240a and the second output of the second OIS position sensor 240b and may perform OIS feedback control for the OIS operation unit based on the detected displacement of the OSI operation unit.

The cover member 300 may accommodate at least one of the bobbin 110, the first coil 120, the first magnet 130, the housing 140, the upper elastic member 150, the lower elastic member 160, the first position sensor 170, the second magnet 180, the third magnet 185, the circuit board 190, the support member 220, the second coil 230, the second position sensor 240, and the circuit board 250 in the space defined between the cover member 300 and the base 210.

The cover member 300 may have a box shape, which is open at the lower portion thereof and includes the upper plate and the side plate, and the lower portion of the cover member 300 may be coupled to the upper portion of the base 210. The upper plate of the cover member 300 may have a polygonal shape, for example, a quadrilateral shape or an octagonal shape.

The cover member 300 may have a bore or a cavity formed through the upper plate thereof, through which the lens (not shown) coupled to the bobbin 110 is exposed to external light. Although the cover member 300 may be made of nonmagnetic material such as stainless steel in order to prevent attraction to the first magnet 130, the disclosure is not limited thereto. In another embodiment, the cover member may be made of magnetic material.

For example, the length L1 of the first coil unit 230-1 may be different from the length L2 of the second coil unit 230-2, and the length of the third coil unit 230-3 may be different from the length of the fourth coil unit 230-4, without being limited thereto. In another embodiment, the two lengths may be equal to each other. Furthermore, for example, the length L1 of the first coil unit 230-1 and the length of the third coil unit 230-2 may be equal to each other, and the length L2 of the second coil unit 230-2 and the length of the fourth coil unit 230-4 may be equal to each other, without being limited thereto. In another embodiment, the two lengths may be different from each other.

For example, the width W1 of the first coil unit 230-1 and the width W2 of the second coil unit 230-2 may be equal to each other, and the width of the third coil unit 230-3 and the width of the fourth coil unit 230-4 may be equal to each other, without being limited thereto. In another embodiment, the two widths may be different from each other. Furthermore, for example, the width W1 of the first coil unit 230-1 and the width of the third coil unit 230-3 may be equal to each other, and the width of the second coil unit 230-2 and the width of the fourth coil unit 230-4 may be equal to each other, without being limited thereto. In another embodiment, the two widths may be different from each other.

Referring to FIGS. 19 and 21, the first coil unit 230-1 may be disposed in a first area between the first side S11 of the coil board 231 and the bore 231a in the coil board 231, and may have a first number of turns. The second coil unit 230-2 may be disposed in a second area between the second side S12 of the coil board 231 and the bore 231a in the coil board 231, and may have a second number of turns. The third coil unit 230-3 may be disposed in a third area between the third side S13 of the coil board 231 and the bore 231a in the coil board 231, and may have a third number of turns. The fourth coil unit 230-4 may be in a fourth area between the fourth side S14 of the coil board 231 and the bore 231a in the coil board 231, and may have a fourth number of turns.

Each of the first to fourth coil units 230-1 to 230-4 may include a line having a plural number of turns.

For example, each of the first to fourth coil units 230-1 to 230-4 may have a continuous spiral, elliptical, and/or track-shaped pattern.

For example, the line PA1 may be made of a conductive body. For example, the line PA1 may be made of conductive metal, for example, copper, gold, aluminum, silver or an alloy including at least one thereof.

The line PA1 of each of the first to fourth coil units 230-1 to 230-4 may be formed in a corresponding one of the first to fourth areas of the coil board 231.

Each of the first to fourth coil units 230-1 to 230-4 may include a first layer Layer11 and a second layer Layer12 disposed on the first layer Layer11.

The first layer Layer11 may have a continuous spiral, elliptical or track shape. Furthermore, the second layer Layer12 may have a continuous spiral, elliptical or track shape.

The first layer Layer11 and the second layer Layer12 may overlap each other in the optical-axis direction and may have the same line width.

Although FIG. 21 illustrates only the first layer and the second layer of the first coil unit 230-1, the description of the first layer Layer11 and the second layer Layer12 shown in FIG. 21 may also be applied to the first layers and the second layers of the second to fourth coil units 230-2 to 230-4.

Although the thickness T1 of the first layer Layer11 and the thickness T1 of the second layer Layer12 may be equal to each other, the disclosure is not limited thereto. In another embodiment, the two thicknesses may be different from each other.

The first layer Layer11 of each of the first to fourth coil units 230-1 to 230-4 may include a plurality of first lines R1 to Rn (n being a natural number greater than 1, n>1), which are arranged in a corresponding one of the first to fourth areas of the coil board 231.

Furthermore, the second layer Layer12 of each of the first to fourth coil units 230-1 to 230-4 may include a plurality of second lines P1 to Pn (n being a natural number greater than 1, n>1), which are arranged in a corresponding one of the first to fourth areas of the coil board 231. The first lines R1 to Rn or the second lines P1 to Pn may be alternatively referred to as conductive lines or coil pattern lines.

For example, although the first lines R1 to Rn and the second lines P1 to Pn may be aligned with or overlap each other in the optical-axis direction, the disclosure is not limited thereto. For example, although the number of first lines R1 to Rn and the number of second lines P1 to Pn may be the same as each other, the disclosure is not limited thereto. In another embodiment, the two numbers may be different from each other.

Each of the first to fourth coil units 230-1 to 230-4 may include a via 55a, which connects one end of one of the first lines R1 to Rn (for example, R1) to one end of one of the second lines P1 to Pn (for example, P1).

Two of the first to fourth coil units 230-1 to 230-4 may be connected to each other, and the two coil units that are connected to each other may be conductively connected to two of the pads of the coil board 231.

The two remaining ones of the first to fourth coil units 230-1 to 230-4 may be connected to each other, and the two remaining coil units, which are connected to each other, may be conductively connected to the two remaining pads of the coil board 231.

For example, one end of the first coil unit 230-1 and one end of the second coil unit 230-2 may be connected to each other, the other end of the first coil unit 230-1 may be connected to one (for example, Q1) of the pads of the coil board 231, and the other end of the second coil unit 230-3 may be connected to another one (for example, Q2) of the pads of the coil board 231.

Furthermore, one end of the third coil unit 230-3 and one end of the fourth coil unit 230-4 may be connected to each other, the other end of the third coil unit 230-3 may be connected to a further one (for example, Q3) of the pads of the coil board 231, and the other end of the fourth coil unit 230-4 may be connected to a further one (for example, Q4) of the pads of the coil board 231.

The conductive connection between the first to fourth coil units 230-1 to 230-4 and the pads of the coil board 231 is not limited to the above-mentioned manner, and the first to fourth coil units 230-1 to 230-4 and the pads of the coil board 231 may be connected to each other in various manners.

Referring to FIG. 21, the second coil 230 may include first insulation layers 71, the first layers Layer11 of the first to fourth coil units 230-1 to 230-4 disposed on the first insulation layers 71, second insulation layers 73 disposed on the first layers Layer11, the second layers Layer12 of the first to fourth coil units 230-1 to 230-4 disposed on the second insulation layers 73, and third insulation layers 75 disposed on the second layers.

Each of the first and third insulation layers 71 and 75 may include a resin layer made of resin (for example, epoxy) and a polyimide layer (or polyimide tape) including polyimide. For example, each of the first and third insulation layers 71 and 75 may include a solder resist.

The second insulation layer 73 may include macromolecular organic compound or resin. For example, the second insulation layer 73 may include polyimide and epoxy bond.

For example, the first layer Layer11 of each of the first to fourth coil units 230-1 to 230-4 may be disposed between the first insulation layer 71 and the second insulation layer 73, and the second layer Layer12 of each of the first to fourth coil units 230-1 to 230-4 may be disposed between the second insulation layer 73 and the third insulation layer 75.

The second coil 230 may further include a fourth insulation layer 72, disposed between the first lines R1 to Rn of each of the first to fourth coil units 230-1 to 230-4, and a fifth insulation layer 74, disposed between the second lines P1 to Pn of each of the first to fourth coil units 230-1 to 2304.

In other words, the fourth insulation layer 72 may be disposed between the first insulation layer 71 and the second insulation layer 73, and the fifth insulation layer 74 may be disposed between the second insulation layer 73 and the third insulation layer 75.

For example, each of the first insulation layer 71 and the third insulation layer 75 may be alternatively referred to as a cover layer.

For example, the coil board 231 may include the first to fifth insulation layers 71 to 75, the first layer Layer11 of each of the first to fourth coil units 230-1 to 230-4 may be formed between the first insulation layer 71 and the second insulation layer 73, and the second layer Layer12 may be formed between the second insulation layer 73 and the third insulation layer 75. The terminals Q1 to Q8 of the coil board 231 may be formed under the second insulation layer 73.

Figure 22:
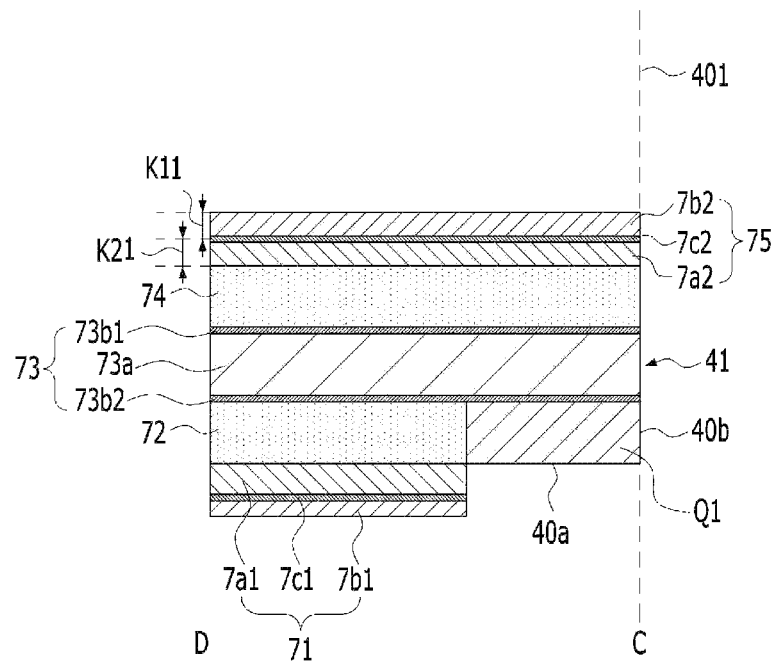
FIG. 22 is a partial cross-sectional view of the coil board taken along line C-D in FIG. 9.

FIG. 22 is a partial cross-sectional view of the coil board 231 taken along line C-D in FIG. 9.

Referring to FIGS. 21 and 22, the second insulation layer 73 may include a polyimide layer 73a. The second insulation layer 73 may further include an adhesive 73b1 disposed on the upper surface of the polyimide layer 73a. The second insulation layer 73 may further include an adhesive 73b2 disposed on the lower surface of the polyimide layer 73a.

For example, the adhesive 73b1 and 73b2 may include epoxy bond.

For example, the first insulation layer 71 may include a first resin layer 7a1, which is disposed under the fourth insulation layer 72 and the first layer Layer11. The first insulation layer 71 may further include a first polyimide layer 7b1 disposed under the first resin layer 7a1.

The first insulation layer 71 may further include a first adhesive 7c1 disposed between the first resin layer 7a1 and the first polyimide layer 7b1.

For example, the third insulation layer 75 may include a second resin layer 7a2 disposed on the fifth insulation layer 74 and the second layer Layer12. The third insulation layer 75 may further include a second polyimide layer 7b2 disposed on the second resin layer 7a2.

The third insulation layer 75 may further include a second adhesive 7c2 disposed between the second resin layer 7a2 and the second polyimide layer 7b2.

For example, the thickness K11 of the second polyimide layer 7b2 may range from 25 μm to 75 μm, and the thickness K21 of the second resin layer 7a2 may range from 12.5 μm to 50 μm.

For example, although the thickness of the first polyimide layer 7b1 may be equal to the thickness K11 of the second polyimide layer 7b2, the disclosure is not limited thereto. The two thickness may be different from each other.

Although the thickness of the first resin layer 7a1 may be equal to the thickness K21 of the second resin layer 7a2, the disclosure is not limited thereto. The two thickness may be different from each other.

For example, although the thicknesses of the polyimide layers 7b2 and 7b1 may be respectively equal to or greater than the thicknesses of the resin layer 7a1 and 7a2, the disclosure is not limited thereto. In another embodiment, the thicknesses of the polyimide layers 7b2 and 7b1 may be respectively less than the thicknesses of the resin layers 7a and 7a2.

For example, although the thickness T1 of each of the first layer Layer11 and the second layer Layer12 may range from 45 μm to 50 μm, the disclosure is not limited thereto.

The lower surface 40a of each of the terminals Q1 to A8 of the coil board 231 is exposed from the first insulation layer 71, and the first lateral surface 40b of each of the terminals Q1 to Q8 of the coil board 231 may be open or exposed at the inner circumferential surface 41 of the coil board 231, which is formed by the bore 231a in the coil board 2341. Here, the first lateral surface 40b of each of the terminals Q1 to Q8 of the coil board 231 may be the lateral surface of each of the terminals Q1 to Q8 of the coil board 231 that faces the inner circumferential surface 40b of the coil board 231.

For example, the lower surface 40a of each of the terminals Q1 to Q8 of the coil board 231 may be exposed by removing a portion of the first insulation layer 71. For example, the lower surface 40a of each of the terminals Q1 to Q8 of the coil board 231 may be exposed downwards in the optical-axis direction.

The first lateral surface 40b of each of the terminals Q1 to Q8 of the coil board 231 may be positioned at a surface 401 that is the same surface as the inner circumferential surface 41 of the coil board 231.

For example, the first lateral surface 40b may constitute a single surface 401, which is the same surface as the inner circumferential surface 41 of the coil board 231.

The first lateral surface 40b of each of the terminals of the coil board 231 may be exposed in the direction of the center of the bore 231a or in the direction of the optical axis of the coil board 231.

For example, the first lateral surface 40b of each of the terminals of the coil board 231 may be a curved surface and may have the same curvature radius as that of the inner circumferential surface 41 of the coil board 231, without being limited thereto. In another embodiment, the two curvature radii may be different from each other.

The exposed lower surface 40a of each of the terminals Q1 to Q8 of the coil board 231 may be positioned higher than the lower surface of the first insulation layer 71 (for example, the lower surface of the first polyimide layer 7a1).

The thickness of each of the terminals Q1 to Q8 of the coil board 231 and the thickness of the first layer Layer11 may be equal to each other. The reason for this is because the first layer Layer11 of each of the first to fourth coil units 230-1 to 230-4 and the conductive layer (for example, a copper layer) for the terminals Q1 to Q8 of the coil board 231 may be positioned between the first insulation layer 71 and the second insulation layer 73, and may be patterned simultaneously.

In another embodiment, the thickness of each of the terminals Q1 to Q8 of the coil board 231 and the thickness of the first layer Layer11 of each of the first to fourth coil units 230-1 to 230-4 may be different from each other. For example, the thickness of each of the terminals Q1 to Q8 of the coil board 231 may be greater or less than the thickness of the first layer Layer11.

Figure 23A:
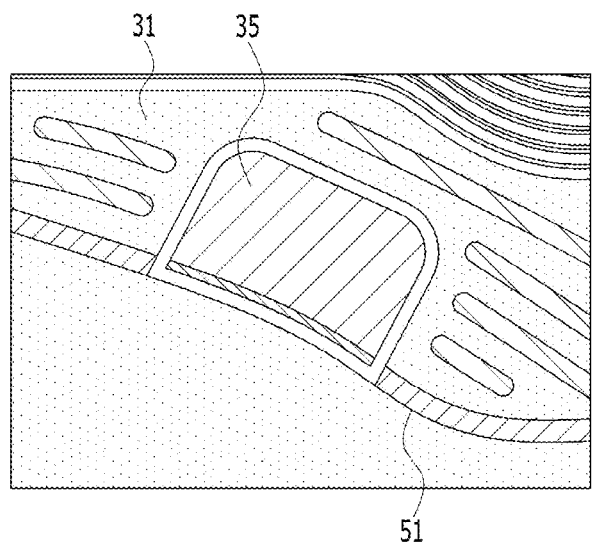
FIG. 23A is a view illustrating a cutting line for formation of a terminal and a bore of a conventional coil board.
Figure 23B:
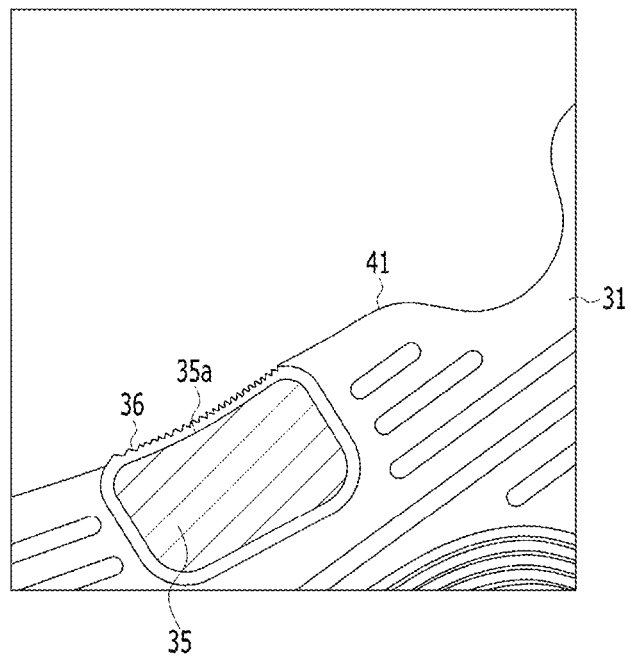
FIG. 23B is a view illustrating burrs generated in an operation of forming the bore in the coil board.

FIG. 23A illustrates a cutting line for formation of a terminal and a bore of a conventional coil board 31. FIG. 23B illustrates burrs 36, which are formed in an operation of forming the bore in the coil board 31.

Referring to FIGS. 23A and 23B, the coil board 31 is cut along the cutting line 51 using a laser, thereby forming the bore in the coil board 31. In the case in which a terminal 35 is positioned so as to be spaced apart from the cutting line 51, the terminal 35 may not be exposed at the inner circumferential surface of the coil board 31, and burrs 36 may be generated at the inner circumferential surface of the coil board 31 due to the laser cutting. Hence, the burrs 36 may deteriorate the solderability between the terminal 35 of the coil board 31 and the pad (or the pad) of the circuit board (for example, 250), thereby deteriorating conductive contact between the two terminals.

Figure 24:
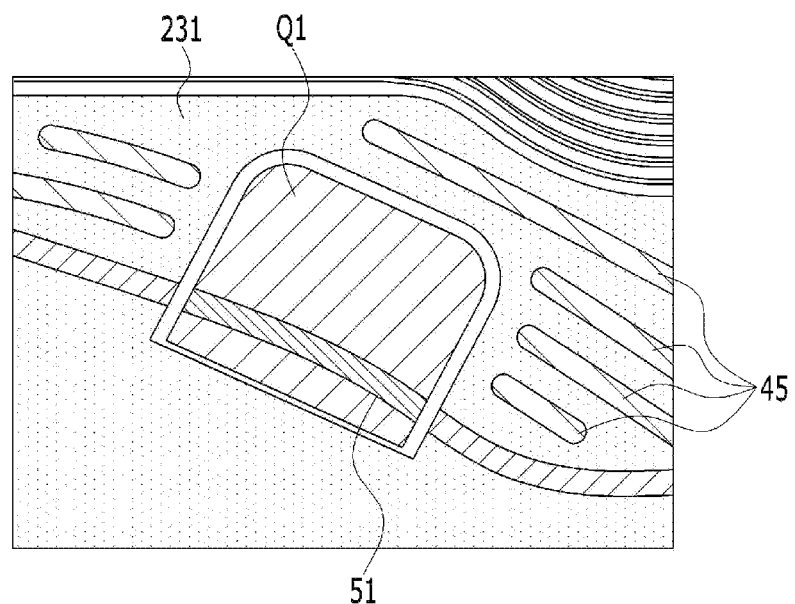
FIG. 24 is a view illustrating the terminal of the coil board and the cutting line for formation of the bore in the coil board according to the embodiment.
Figure 25A:
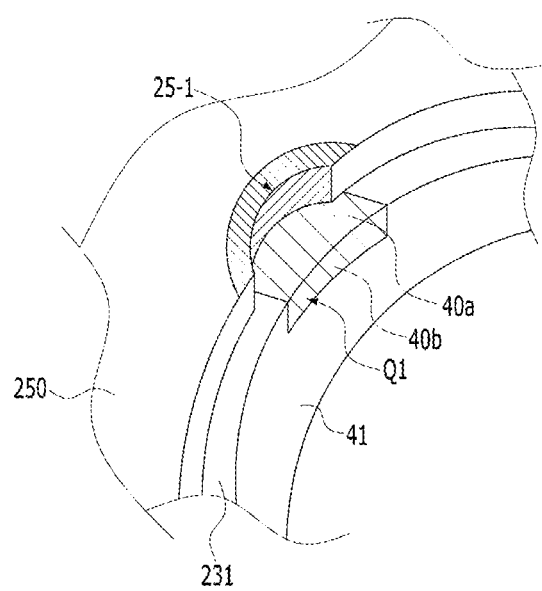
FIG. 25A is a view illustrating the terminal of the coil board and the pad of the coil board.
Figure 25B:
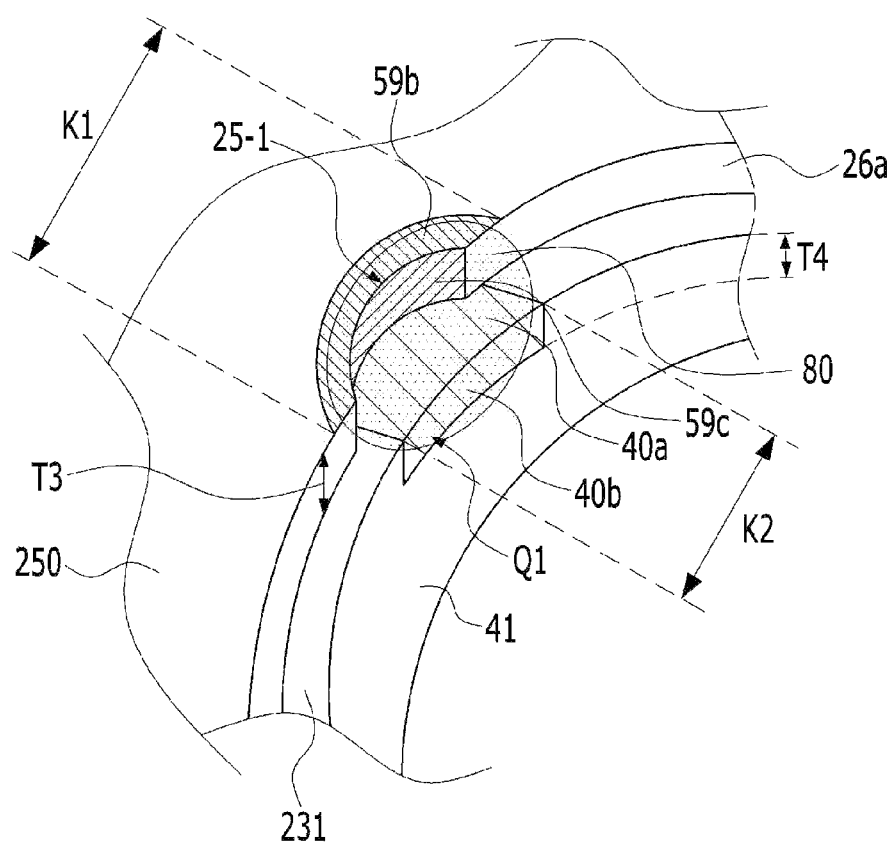
FIG. 25B is a view illustrating a conductive adhesive member connecting the terminal of the coil board to the pad of the circuit board shown in FIG. 25A.

FIG. 24 illustrates the terminal Q1 of the coil board 231 and the cutting line 51 for formation of the bore in the coil board 231 according to the embodiment. FIG. 25A illustrates the terminal Q1 of the coil board 231 and the pad 25-1 of the coil board 250. FIG. 25B illustrates a conductive adhesive member 80 connecting the terminal Q1 of the coil board 231 to the pad 25-1 of the circuit board 250 shown in FIG. 25A.

In FIGS. 24 to 25B, the description of the terminal Q1 of the coil board 231 and the pad (for example, 25-1) of the circuit board 250 may also be applied to the remaining terminals Q2 to Q8 of the coil board 231 and the remaining pads 25-2 to 25-4 of the circuit board 250.

Referring to FIGS. 24 to 25B, the terminal (for example, Q1) of the coil board 231 may be formed so as to overlap the cutting line 51. When the coil board 231 is cut along the cutting line 51 so as to form the bore, the lateral surface 40b of the terminal (for example, Q1) may be exposed at the inner circumferential surface 41 of the coil board 231, and the exposed lateral surface 40b of the terminal (for example, Q1) may become the same surface as the inner circumferential surface 41 of the coil board 231, with the result that burrs are not formed by laser cutting and it is thus possible to prevent poor conductive contact between the terminal (for example, Q1) of the coil board 231 and the pad (for example, 25-1) of the circuit board 250.

Furthermore, since the lateral surface 40b of the terminal Q1 of the coil board 231 is exposed at the inner circumferential surface 41 of the coil board 231, a conductive adhesive member or solder 80 may be disposed at the exposed lateral surface 40b of the terminal Q1, and the contact area between the conductive adhesive member or solder 80 and the terminal Q1 of the coil board 231 may be increased, thereby improving solderability.

The circuit board 250 may include the bore 25a in the circuit board 250 250 and the pad (for example, 25-1), which abuts on the inner circumferential surface 26a of the circuit board 250 and is formed at a position corresponding to the terminal (for example, Q1) of the coil board 231.

The size or diameter of the bore 231a in the coil board 231 may be smaller than the size or diameter of the bore 25a in the circuit board 250.

For example, the inner circumferential surface 26a of the circuit board 250 may be positioned outside the inner circumferential surface 41 of the coil board 231.

For example, although the distance between the inner circumferential surface 26a of the circuit board 250 and the inner circumferential surface 41 of the coil board 231 may be less than the thickness of the circuit board 250, the disclosure is not limited thereto. In another embodiment, the distance between the inner circumferential surface 26a of the circuit board 250 and the inner circumferential surface 41 of the coil board 231 may be equal to or greater than the thickness of the circuit board 250.

For example, although the distance between the inner circumferential surface 26a of the circuit board 250 and the inner circumferential surface 41 of the coil board 231 may be greater than the thickness of the coil board 231, the disclosure is not limited thereto. In another embodiment, the distance between the inner circumferential surface 26a of the circuit board 250 and the inner circumferential surface 41 of the coil board 231 may be equal to or less than the thickness of the coil board 231.

For example, the pad 25-1 of the circuit board 250 may have a lateral surface 59c that is exposed at the inner circumferential surface 26a of the circuit board 250. For example, the pad 25-1 of the circuit board 250 may have a lateral surface 59c that is exposed toward the center of the bore 25a in the circuit board 250.

For example, the pad (for example, 25-1) of the circuit board 250 may be exposed at at least one of the upper surface, the lateral surface and the lower surface of the circuit board 250.

For example, the pad (for example, 25-1) of the circuit board 250 may include a first portion 59a (see FIG. 18), which is exposed at the upper surface of the circuit board 250, a second portion 59b (see FIG. 25A), which is exposed at the lower surface of the circuit board 260, and a third portion 59c, connecting the first portion 59a to the second portion 59b. Although the pad of the circuit board 250 may be a conductive layer, for example, an Au layer or an Au-plated layer, the disclosure is not limited thereto.

The third portion 59c of the pad 25-1 of the circuit board 250 may be provided at the inner circumferential surface of the circuit board 250. In order to increase the contact area with solder, the third portion 59c of the circuit board 250 may have a recess shape or a groove shape depressed from the inner circumferential surface of the circuit board 250.

Although the third portion 59c of the pad 25-1 of the circuit board 250 may have a curved surface, for example, a semicircular via shape, the disclosure is not limited thereto.

For example, a groove may be formed in the inner circumferential surface 26a of the circuit board 250, and the pad 25-1 of the circuit board 250 may include the third portion 59c, which is formed in the groove in the circuit board 250.

Although the curvature radius of the curved surface (or the groove in the circuit board 250) of the third portion 59c of the pad 25-1 of the circuit board 250 may be less than the curvature radius of the inner circumferential surface 41 of the bore 231a in the coil board 231, the disclosure is not limited thereto. In another embodiment, the curvature radius of the curved surface of the third portion 59c may be equal to or greater than the curvature radius of the inner circumferential surface 41 of the bore 231a.

Although the length K1 of the second portion 59b of the pad 25-1 of the circuit board 250 may be equal to the length K2 of the terminal Q1 of the coil board 231 (K1=K2), the disclosure is not limited thereto. In another embodiment, the length K1 may be greater than the length K2 (K1>K2). In a further embodiment, the length K1 may be less than the length K2 (K1<K2).

Here, the length K1 may be the shortest distance between the two ends of the second portion 59b abutting on the inner circumferential surface 41 of the circuit board 250 or the diameter of the second portion 59b of the circuit board 250. The length K2 may be the distance between the two ends of the terminal Q1 abutting on the inner circumferential surface 41 of the coil board 231.

For example, the length K1 may be 0.4 mm-1.6 mm, and the length K2 may be 0.4 mm-2 mm. For example, the diameter of the third portion 59c of the pad 25-1 of the circuit board 250 may be 0.3 mm-0.6 mm.

Although the thickness T3 of the pad 25-1 of the circuit board 250 may be 100 µm-140 µm, the disclosure is not limited thereto. Although the thickness of the terminal Q1 of the coil board 231 may be 40 µm-60 µm, the disclosure is not limited thereto.

The thickness T3 of the pad 25-1 of the circuit board 250 may be less than the length K1 of the pad 25-1 of the circuit board 250 (T3<K1).

For example, the ratio of the thickness T3 of the pad 25-1 to the length K1 of the pad 25-1 of the circuit board 250 (T3:K1) may be 1:2.5-1:6.

Although the length of the first portion 59a of the pad 25-1 of the circuit board 250 may be equal to the length K2 of the terminal Q1 of the coil board 231, the disclosure is not limited thereto. In another embodiment, the length of the first portion 59a may be greater or less than the length K2 of the terminal Q1 of the coil board 231.

Although the length of the first portion 59a of the pad 25-1 of the circuit board 250 may be equal to the length K1, the disclosure is not limited thereto.

For example, the pad (for example, 25-1) of the circuit board 250 may overlap at least a portion of the terminal (for example, Q1) of the coil board 231 in the optical-axis direction.

The conductive adhesive member 80 may be in contact with or coupled or attached to the exposed lateral surface 59c of the pad 25-1 of the circuit board 250. Furthermore, the conductive adhesive member 80 may be in contact with or coupled or attached to the exposed lateral surface 40b of the terminal 25-1 of the coil board 231.

The conductive adhesive member or solder 80 may be disposed on, in contact with, coupled to, or attached to at least one of the first to third portions 59a to 59c of the pad (for example, 25-1) of the circuit board 250 and to the terminal (for example, Q1) of the coil board 231.

The coil board 231 may include a dummy layer, a dummy pattern or a dummy line 45 in order to increase durability.

Generally, in the case in which the cover layer of the coil board 231 is formed of a resin such as epoxy, burrs may be generated at the cut surface in a cutting operation for formation of the bore or the unit coil board, and foreign substances caused by the burrs may thus be generated.

Furthermore, because the resin layer such as the epoxy layer is easily scratched, foreign substances may be generated due to an impact or scratching during handling of the coil board 231, and the foreign substances may cause malfunction of the lens moving apparatus or deterioration in the image quality of the image sensor of the camera module.

As illustrated in FIG. 22, since each of the first insulation layer 71 and the third insulation layer 75 of the second coil 230 includes the polyimide layer 7b1 or 7b2 on the surface of the resin layer 7a1 or 7a2 thereof, the embodiment is able to suppress the generation of contaminants at the coil board 231 caused by cutting, impact or scratch.

The lens moving apparatuses 100 according to the above-described embodiments may be embodied as or used in, for example, a camera module or an optical device in various fields.

For example, the lens moving apparatus 100 according to the embodiment may be included in an optical instrument, which is designed to form an image of an object in a space using reflection, refraction, absorption, interference, diffraction or the like, which are characteristics of light, to extend eyesight, to record an image obtained through a lens or reproduce the image, to perform optical measurement, or to propagate or transmit an image. For example, the optical instrument according to the embodiment may be a smart phone or a portable terminal equipped with a camera.

Figure 26:
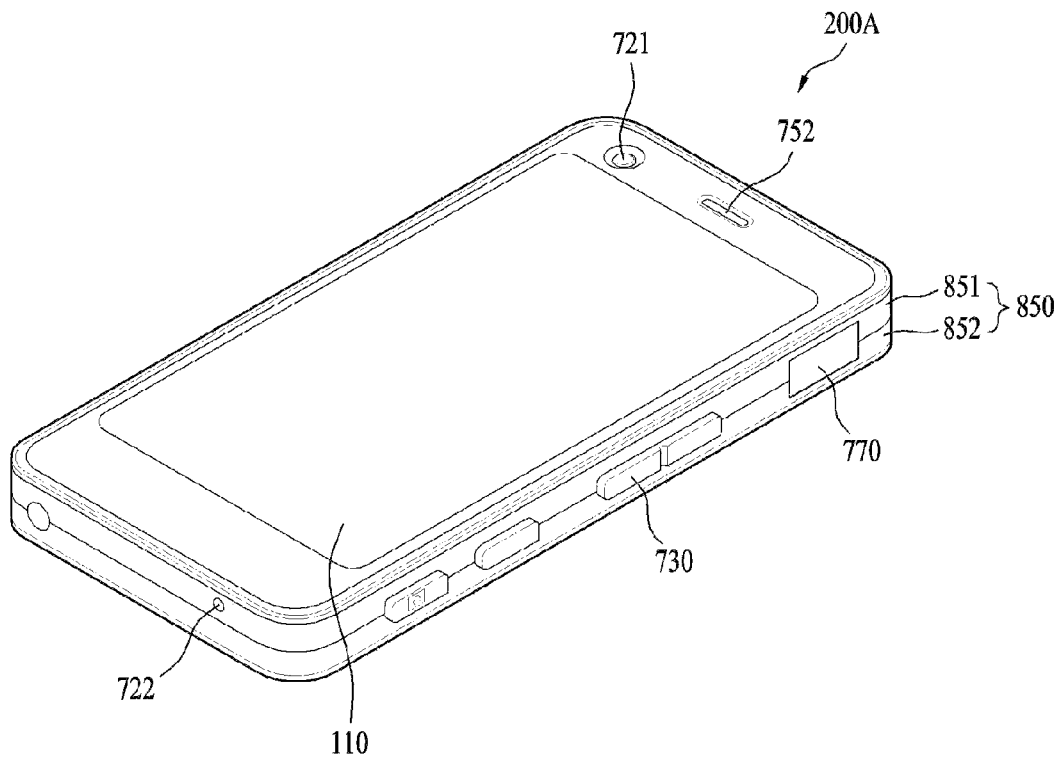
FIG. 26 is a perspective view of a portable terminal according to an embodiment.
Figure 27:
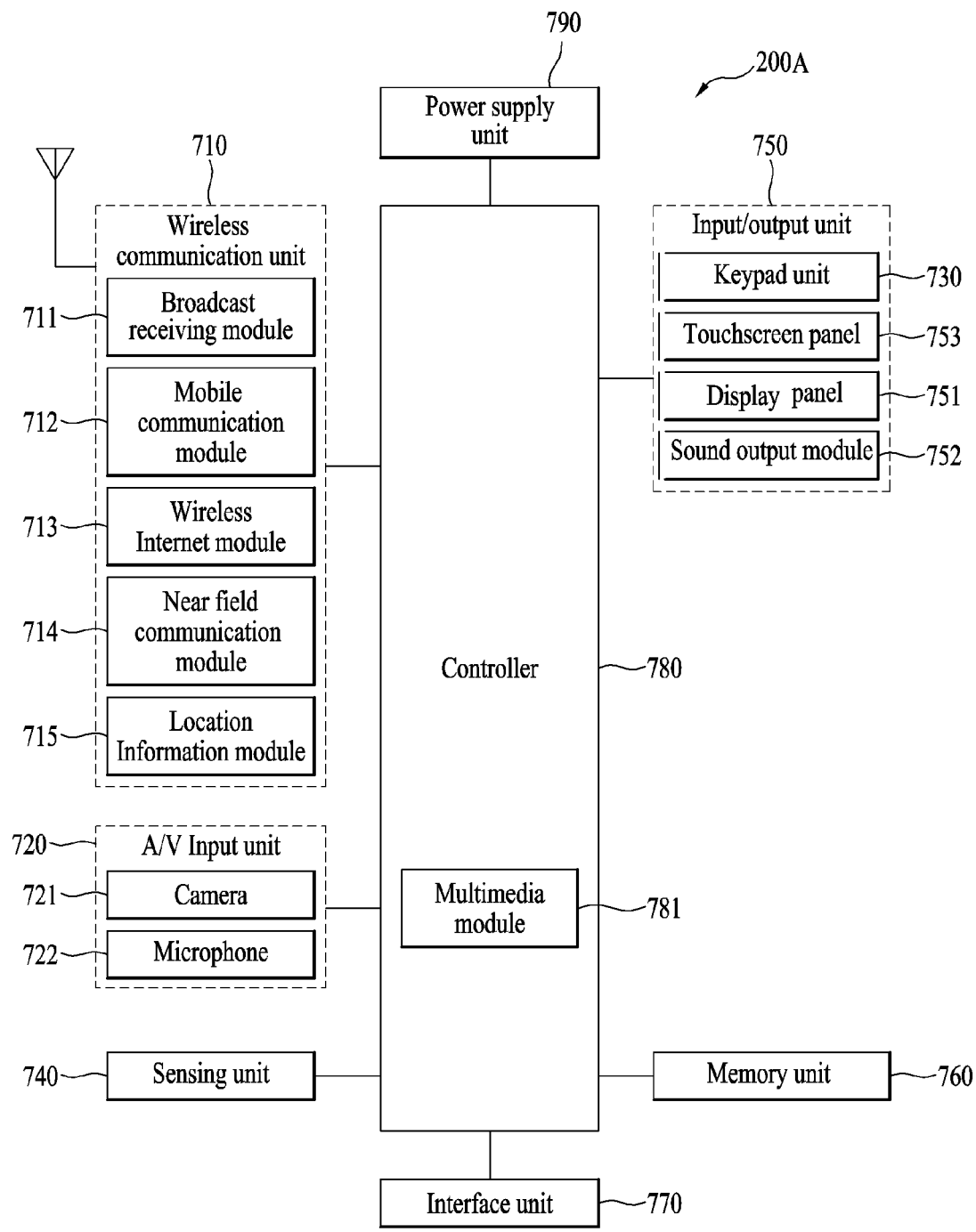
FIG. 27 is a view illustrating the configuration of the portable terminal illustrated in FIG. 26.

FIG. 26 is a perspective view illustrating a portable terminal 200A according to an embodiment. FIG. 27 is a view illustrating the configuration of the portable terminal 200A illustrated in FIG. 26.

Referring to FIGS. 26 and 27, the portable terminal 200A (hereinafter referred to as a "terminal") may include a body 850, a wireless communication unit 710, an audio/video (A/V) input unit 720, a sensing unit 740, an input/output unit 750, a memory unit 760, an interface unit 770, a controller 780, and a power supply unit 790.

The body 850 illustrated in FIG. 26 has a bar shape, without being limited thereto, and may be any of various types such as, for example, a slide type, a folder type, a swing type, or a swivel type, in which two or more sub-bodies are coupled so as to be movable relative to each other.

The body 850 may include a case (e.g. casing, housing, or cover) defining the external appearance of the terminal. For example, the body 850 may be divided into a front case 851 and a rear case 852. Various electronic components of the terminal may be accommodated in the space defined between the front case 851 and the rear case 852.

The wireless communication unit 710 may include one or more modules, which enable wireless communication between the terminal 200A and a wireless communication system or between the terminal 200A and a network in which the terminal 200A is located. For example, the wireless communication unit 710 may include a broadcast-receiving module 711, a mobile communication module 712, a wireless Internet module 713, a nearfield communication module 714, and a location information module 715.

The A/V input unit 720 serves to input audio signals or video signals, and may include, for example, a camera 721 and a microphone 722.

The camera 721 may be the camera 200 including the camera device 200, 200-1 according to the embodiment shown in FIG. 1 or 6.

The sensing unit 740 may sense the current state of the terminal 200A, such as, for example, opening or closing of the terminal 200A, the location of the terminal 200A, the presence of a user's touch, the orientation of the terminal 200A, or the acceleration/deceleration of the terminal 200A, and may generate a sensing signal to control the operation of the terminal 200A. When the terminal 200A is, for example, a slide-type cellular phone, the sensing unit 740 may sense whether the slide-type cellular phone is opened or closed. Furthermore, the sensing unit 740 may sense the supply of power from the power supply unit 790, coupling of the interface unit 770 to an external device, and the like.

The input/output unit 750 serves to generate, for example, visual, audible, or tactile input or output. The input/output unit 750 may generate input data to control the operation of the terminal 200A, and may display information processed in the terminal 200A.

The input/output unit 750 may include a keypad unit 730, a display module 751, a sound output module 752, and a touchscreen panel 753. The keypad unit 730 may generate input data in response to input on a keypad.

The display module 751 may include a plurality of pixels, the color of which varies in response to electrical signals applied thereto. For example, the display module 751 may include at least one among a liquid crystal display, a thin-film-transistor-liquid crystal display, an organic light-emitting diode, a flexible display and a 3D display.

The sound output module 752 may output audio data received from the wireless communication unit 710 in, for example, a call signal reception mode, a call mode, a recording mode, a voice recognition mode, or a broadcast reception mode, or may output audio data stored in the memory unit 760.

The touchscreen panel 753 may convert variation in capacitance, caused by a user's touch on a specific region of a touchscreen, into electrical input signals.

The memory unit 760 may temporarily store programs for the processing and control of the controller 780 and input/output data (for example, telephone numbers, messages, audio data, stationary images, moving images and the like). For example, the memory unit 760 may store images captured by the camera 721, for example, pictures or moving images.

The interface unit 770 serves as a path through which the lens moving apparatus is connected to an external device connected to the terminal 200A. The interface unit 770 may receive power or data from the external component, and may transmit the same to respective constituent elements inside the terminal 200A, or may transmit data inside the terminal 200A to the external component. For example, the interface unit 770 may include a wired/wireless headset port, an external charger port, a wired/wireless data port, a memory card port, a port for connection to a device equipped with an identification module, an audio input/output (I/O) port, a video input/output (I/O) port, an earphone port and the like.

The controller 780 may control the overall operation of the terminal 200A. For example, the controller 780 may perform control and processing related to, for example, voice calls, data communication, and video calls.

The controller 780 may include a multimedia module 781 for multimedia playback. The multimedia module 781 may be embodied in the controller 180, or may be embodied separately from the controller 780.

The controller 780 may perform a pattern recognition process capable of recognizing writing input or drawing input carried out on a touch screen as a character and an image, respectively.

The power supply unit 790 may supply power required to operate the respective constituent elements upon receiving external power or internal power under the control of the controller 780.

The features, configurations, effects and the like described above in the embodiments are included in at least one embodiment, but the invention is not limited only to the embodiments. In addition, the features, configuration, effects and the like exemplified in the respective embodiments may be combined with other embodiments or modified by those skilled in the art. Accordingly, content related to these combinations and modifications should be construed as falling within the scope of the embodiments.

INDUSTRIAL APPLICABILITY

Embodiments may be applied to a lens moving apparatus, a camera module and an optical device including the same, which are capable of increasing reliability of wire bonding and allowing a foreign-substance-blocking member to be easily applied.

What is claimed is:

1. A lens moving apparatus comprising:
a base;
a circuit board disposed on the base;
a coil board disposed on the circuit board and comprising
 a first bore and a second coil;

a housing disposed on the coil board;
a bobbin disposed in the housing;
a first magnet disposed at the housing so as to be opposite to the second coil in an optical axis direction; and
a conductive adhesive member connecting the coil board and the circuit board,
wherein the coil board comprises a terminal disposed to contact an inner circumferential surface thereof, and the circuit board comprises a pad disposed to contact an inner circumferential surface thereof, and
wherein the conductive adhesive member connects the terminal of the coil board and the pad of the circuit board.

2. The lens moving apparatus according to claim 1, wherein the terminal of the coil board comprise a side surface exposed to the inner circumferential surface of the coil board.

3. The lens moving apparatus according to claim 1, wherein the circuit board comprises a second bore corresponding to the first bore, and the pad of the circuit board comprises a side surface exposed to the inner circumferential surface of the circuit board.

4. The lens moving apparatus according to claim 2, wherein the conductive adhesive member contacts the exposed side surface of the terminal of the coil board and the pad of the circuit board.

5. The lens moving apparatus according to claim 3, wherein a diameter of the first bore is smaller than a diameter of the second bore.

6. The lens moving apparatus according to claim 1, wherein a groove is formed in the inner circumferential surface of the circuit board, and the pad of the circuit board comprises a portion formed in the groove.

7. The lens moving apparatus according to claim 1, wherein the exposed side surface of the terminal of the coil board forms the same surface as the inner circumferential surface of the coil board.

8. The lens moving apparatus according to claim 1, wherein the terminal of the coil board is exposed from a lower surface of the coil board.

9. The lens moving apparatus according to claim 1, wherein at least a portion of the terminal of the coil board overlaps the pad of the circuit board in the optical axis direction.

10. The lens moving apparatus according to claim 1, wherein the pad of the circuit board comprises a first portion exposed to an upper surface of the circuit board.

11. The lens moving apparatus according to claim 10, wherein the pad of the circuit board comprises a second portion exposed to a lower surface of the circuit board and a third portion connecting the first portion and the second portion.

12. The lens moving apparatus according to claim 1, wherein the terminal of the coil board comprises a plurality of terminals spaced apart from each other, and the pad of the circuit board comprises a plurality of pads corresponding to the plurality of terminals, and
wherein the conductive adhesive member comprises a plurality of conductive adhesive members connecting the plurality of terminals and the plurality of pads.

13. The lens moving apparatus according to claim 1, further comprising a first coil disposed on the bobbin,
wherein the bobbin is configured to move in the optical axis direction by an interaction between the first coil and the first magnet, and
wherein the housing is configured to move in a direction perpendicular to the optical axis direction by an interaction between the second coil and the first magnet.

14. The lens moving apparatus according to claim 1, further comprising:
an upper elastic member coupled to an upper portion of the bobbin and an upper portion of the housing; and
a support member coupled to the upper elastic member and electrically connected to the circuit board.

15. The lens moving apparatus according to claim 1, wherein the second coil is disposed between the first bore of the coil board and an outer circumferential surface of the coil board.

16. The lens moving apparatus according to claim 1, further comprising first and second sensors electrically connected to the circuit board and configured to detect a displacement of the housing.

17. A lens moving apparatus comprising:
a base;
a circuit board disposed on the base and comprising a first bore;
a coil board disposed on the circuit board and comprising a second bore corresponding to the first bore and a second coil;
a housing disposed on the coil board;
a bobbin disposed in the housing;
a first magnet disposed at the housing so as to be opposite to the second coil in an optical axis direction; and
a conductive adhesive member connecting the coil board and the circuit board,
wherein the coil board comprises a terminal having a side surface exposed to an inner circumferential surface thereof, and the circuit board comprises a pad including a first portion exposed from an upper surface thereof, and
wherein the conductive adhesive member connects the terminal of the coil board and the pad of the circuit board.

18. The lens moving apparatus according to claim 17, further comprising:
a first coil disposed on the bobbin;
an upper elastic member coupled to an upper portion of the bobbin and an upper portion of the housing; and
a support member coupled to the upper elastic member and electrically connected to the circuit board,
wherein the bobbin is configured to move in the optical axis direction by an interaction between the first coil and the first magnet, and
wherein the housing is configured to move in a direction perpendicular to the optical axis direction by an interaction between the second coil and the first magnet.

19. A camera module comprising:
a lens;
the lens moving apparatus according to claim 1; and
an image sensor.

20. A portable terminal comprising:
a wireless communicator;
a display;
an input and output unit for generating data to control the terminal; and
a lens moving apparatus including:
a base;
a circuit board disposed on the base;
a coil board disposed on the circuit board and comprising a first bore and a second coil;
a housing disposed on the coil board;
a bobbin disposed in the housing;

a first magnet disposed at the housing so as to be opposite to the second coil in an optical axis direction; and a conductive adhesive member connecting the coil board and the circuit board, wherein the coil board comprises a terminal disposed to contact an inner circumferential surface thereof, and the circuit board comprises a pad disposed to contact an inner circumferential surface thereof, and wherein the conductive adhesive member connects the terminal of the coil board and the pad of the circuit board.

* * * * *